United States Patent
Lee et al.

(10) Patent No.: US 12,119,436 B2
(45) Date of Patent: Oct. 15, 2024

(54) DISPLAY DEVICE AND MANUFACTURING METHOD THEREFOR

(71) Applicant: SAMSUNG DISPLAY CO., LTD., Yongin-Si (KR)

(72) Inventors: Won Ho Lee, Yongin-Si (KR); Sung-Chan Jo, Yongin-Si (KR); Jong Hyuk Kang, Yongin-Si (KR); Hyun Deok Im, Yongin-Si (KR); Hyun Min Cho, Yongin-Si (KR); Won Kyu Kim, Yongin-Si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 518 days.

(21) Appl. No.: 17/432,610

(22) PCT Filed: Aug. 23, 2019

(86) PCT No.: PCT/KR2019/010816
§ 371 (c)(1),
(2) Date: Aug. 20, 2021

(87) PCT Pub. No.: WO2020/171323
PCT Pub. Date: Aug. 27, 2020

(65) Prior Publication Data
US 2022/0158052 A1    May 19, 2022

(30) Foreign Application Priority Data
Feb. 21, 2019    (KR) .................. 10-2019-0020605

(51) Int. Cl.
*H01L 33/62*    (2010.01)
*G09G 3/32*    (2016.01)
(Continued)

(52) U.S. Cl.
CPC .............. *H01L 33/62* (2013.01); *G09G 3/32* (2013.01); *H01L 33/005* (2013.01);
(Continued)

(58) Field of Classification Search
None
See application file for complete search history.

(56) References Cited

U.S. PATENT DOCUMENTS 7,639,226 B2    12/2009    Kim et al.
9,329,433 B2    5/2016    Negishi et al.
(Continued)

FOREIGN PATENT DOCUMENTS

JP    2012-4535    1/2012
KR    10-1119531    2/2012
(Continued)

OTHER PUBLICATIONS

International Search Report, with English translation, corresponding to International Application No. PCT/KR2019/010816 dated Dec. 9, 2019.
(Continued)

*Primary Examiner* — Fred Tzeng
(74) *Attorney, Agent, or Firm* — KILE PARK REED & HOUTTEMAN PLLC

(57) ABSTRACT

A display device may include a substrate, pixels disposed on the substrate, each of the pixels including a first electrode, a second electrode, and a plurality of light emitting elements electrically connected between the first and the second electrodes, and a first oscillator disposed on the substrate and electrically connected to a first electrode of a first pixel of the pixels, the first oscillator including at least one transistor and at least one capacitor.

20 Claims, 32 Drawing Sheets

(51) Int. Cl.
*H01L 33/00* (2010.01)
*H01L 33/38* (2010.01)

(52) U.S. Cl.
CPC ... *H01L 33/382* (2013.01); *G09G 2300/0426* (2013.01); *G09G 2300/0819* (2013.01); *G09G 2300/0861* (2013.01); *G09G 2320/0233* (2013.01); *H01L 2933/0016* (2013.01); *H01L 2933/0066* (2013.01)

(56) References Cited

U.S. PATENT DOCUMENTS

| | | | |
|---|---|---|---|
| 9,778,770 B2* | 10/2017 | Xu | G09G 3/3225 |
| 10,026,777 B2 | 7/2018 | Kang et al. | |
| 10,186,215 B2* | 1/2019 | Seo | H01L 27/1255 |
| 10,453,409 B2* | 10/2019 | Jen | H01L 27/124 |
| 10,461,123 B2 | 10/2019 | Kim et al. | |
| 10,879,223 B2 | 12/2020 | Do et al. | |
| 11,177,324 B2* | 11/2021 | Shi | H10K 59/35 |
| 2006/0001638 A1 | 1/2006 | Jeon et al. | |
| 2009/0251493 A1* | 10/2009 | Uchino | G09G 3/3233 345/77 |
| 2012/0169229 A1* | 7/2012 | You | H10K 50/846 445/25 |
| 2013/0050157 A1 | 2/2013 | Baek et al. | |
| 2014/0078130 A1* | 3/2014 | Uchino | G09G 3/3233 345/212 |
| 2015/0028762 A1* | 1/2015 | Qi | H01L 27/1255 315/210 |
| 2015/0287741 A1* | 10/2015 | Wang | H01L 27/124 257/71 |
| 2016/0079333 A1* | 3/2016 | Shishido | H10K 59/352 257/72 |
| 2017/0250168 A1 | 8/2017 | Do et al. | |
| 2018/0031894 A1* | 2/2018 | Kim | G02F 1/13454 |
| 2019/0013374 A1* | 1/2019 | Park | H10K 59/1216 |
| 2019/0325839 A1* | 10/2019 | Chen | G02F 1/1368 |
| 2020/0258938 A1* | 8/2020 | Chai | H01L 33/62 |
| 2022/0149079 A1* | 5/2022 | Kang | H01L 25/0753 |

FOREIGN PATENT DOCUMENTS

| | | |
|---|---|---|
| KR | 10-2017-0057818 | 5/2017 |
| KR | 10-2017-0101334 | 9/2017 |
| KR | 10-2018-0071465 | 6/2018 |
| KR | 10-2018-0072909 | 7/2018 |

OTHER PUBLICATIONS

Written Opinion, with English translation, corresponding to International Application No. PCT/KR2019/010816, dated Dec. 9, 2019.

* cited by examiner

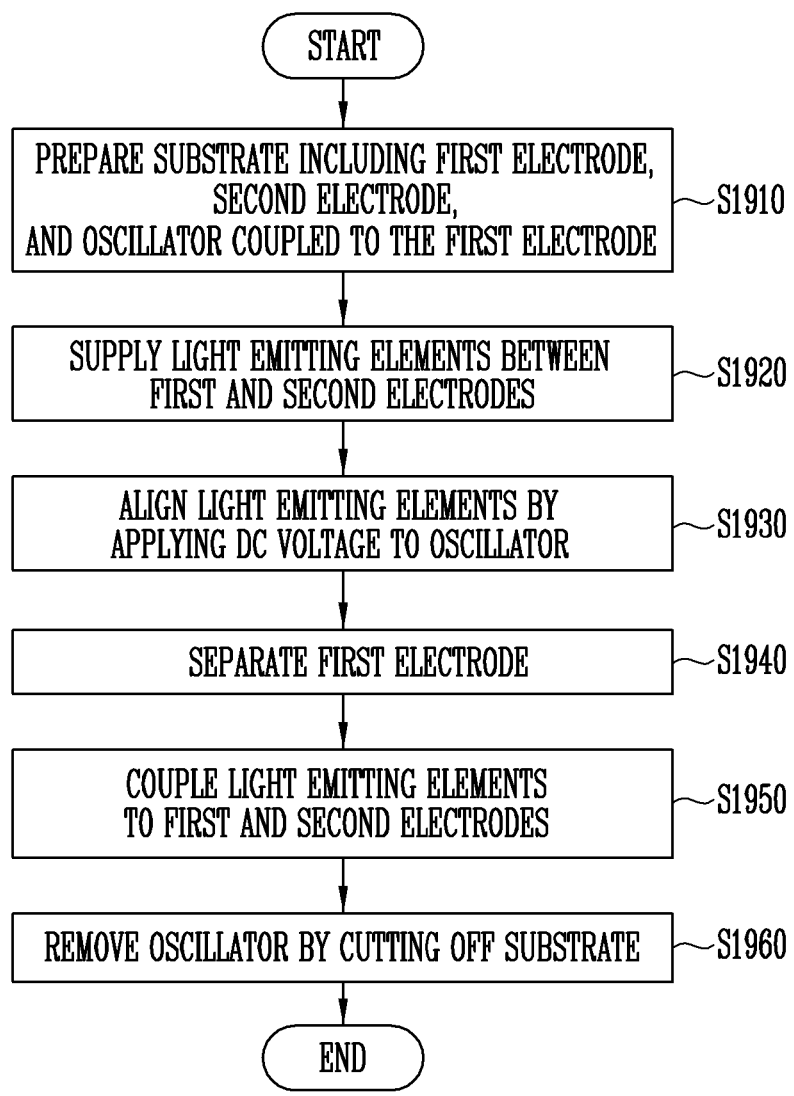

FIG. 20B
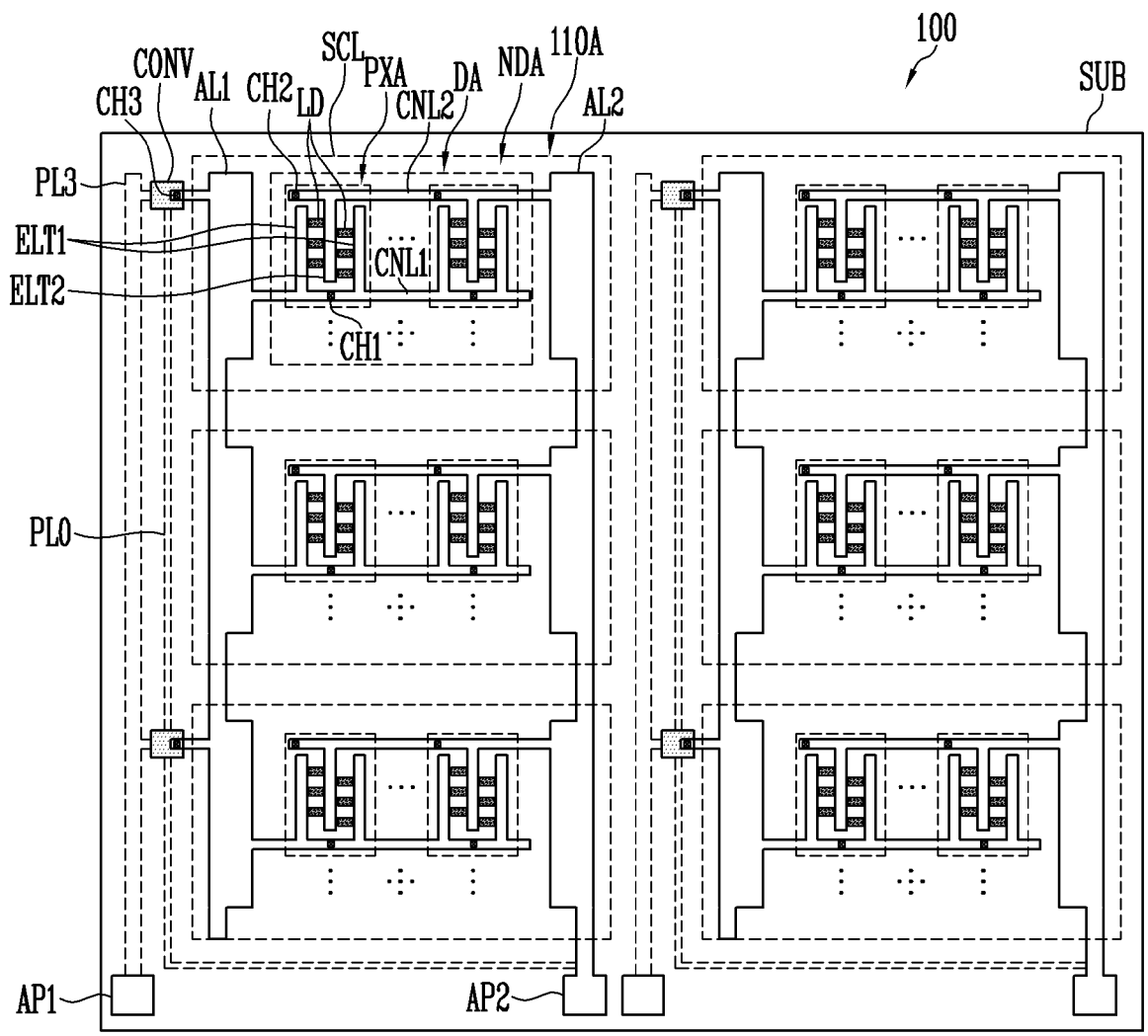
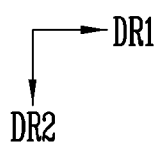

DISPLAY DEVICE AND MANUFACTURING METHOD THEREFOR

CROSS-REFERENCE TO RELATED APPLICATION(S)

This application is a national entry of International Application No. PCT/KR2019/010816, filed on Aug. 23, 2019, which claims under 35 U.S.C. §§ 119(a) and 365(b) priority to and benefits of Korean Patent Application No. 10-2019-0020605, filed on Feb. 21, 2019, in the Korean Intellectual Property Office (KIPO), the entire contents of which are incorporated herein by reference.

BACKGROUND

1. Technical Field

Various embodiments of the disclosure relate to a display device and a method of fabricating the display device.

2. Description of Related Art

Recently, a technique of manufacturing a subminiature light emitting element using a material having a reliable inorganic crystal structure and manufacturing a light emitting device using the light emitting element has been developed. For example, a technique of configuring a light source of a light emitting device using subminiature light emitting elements having a small size corresponding to a range from a nanoscale size to a microscale size has been developed. Such a light emitting device may be used in various electronic devices such as a display device and a lighting device.

SUMMARY

If predetermined voltages are supplied to electrodes after light emitting elements are supplied to a substrate, an electric field is formed between the electrodes, so that the light emitting elements are self-aligned.

However, the voltages applied to the electrodes may drop, so that the light emitting elements may not be uniformly aligned on the entirety of the substrate.

Various embodiments of the disclosure are directed to a display device including light emitting elements which are uniformly aligned.

Various embodiments of the disclosure are directed to a method of manufacturing a display device in which light emitting elements may be uniformly aligned.

In an aspect, a display device in accordance with an embodiment of the disclosure may include a substrate; pixels disposed on the substrate, each of the pixels comprising a first electrode, a second electrode, and a plurality of light emitting elements electrically connected between the first and the second electrodes; and a first oscillator disposed on the substrate and electrically connected to a first electrode of a first pixel of the pixels, and the first oscillator comprising at least one transistor and at least one capacitor.

In an embodiment, the first electrode of the first pixel may be separated from a first electrode of a second pixel of the pixels. The first oscillator may be electrically disconnected from the second pixel.

In an embodiment, the substrate may include a display area in which an image is displayed, and a non-display area disposed adjacent to the display area. The pixel may be disposed in the display area. The first oscillator may be disposed in the non-display area.

In an embodiment, the display device may further include a second oscillator and a third oscillator disposed on the non-display area. The first oscillator, the second oscillator, and the third oscillator may be disposed at regular intervals along a perimeter of the display area.

In an embodiment, the display device may further include a first power line, a second power line, a third power line, and a fourth power line disposed on the substrate and separated from each other. Each of the pixels may be electrically connected between the first power line and the second power line. The first oscillator may be electrically connected to the third power line and the fourth power line. Each of the third power line and the fourth power line may float.

In an embodiment, the first power line, the second power line, the third power line, the fourth power line, and the first oscillator may be included in a pixel circuit layer. The first electrode and the second electrode may be disposed on the pixel circuit layer at positions spaced apart from each other. The plurality of light emitting elements may be disposed between the first electrode and the second electrode.

In an embodiment, the display device may further include an electrode pattern disposed on the pixel circuit layer, overlapping at least one capacitor of the first oscillator, and electrically connected to the at least one capacitor. The electrode pattern may be separated from the first electrode of the first pixel.

In an embodiment, the display device may further include a second oscillator disposed in the display area.

In an embodiment, the first oscillator may be disposed between the pixels.

In an embodiment, each of the plurality of light emitting elements may include a light emitting diode having a size in a range of a nanometer scale to a micrometer scale.

In an embodiment, the display device may further include a first power line and a second power line disposed on the substrate. The first oscillator may include at least one stage. The at least one stage each may include a first transistor comprising a first electrode electrically connected to the first power line, a second electrode electrically connected to a first node, and a gate electrode electrically connected to an input terminal; a second transistor comprising a first electrode electrically connected to the first node, a second electrode electrically connected to the second power line, and a gate electrode electrically connected to the input terminal; and a first resistor and a first capacitor electrically connected in series between the first node and the second power line. A second node to which the first resistor and the first capacitor are electrically connected may be electrically connected, as an output terminal, to the input terminal.

In an embodiment, the first oscillator may include first, second, and third stages. An output terminal of the first stage may be electrically connected to an input terminal of the second stage. An output terminal of the second stage may be electrically connected to an input terminal of the third stage. An output terminal of the third stage may be electrically connected to an input terminal of the first stage.

In an aspect, a display device in accordance with an embodiment of the disclosure may include a substrate; pixels disposed on the substrate, each of the pixels comprising a first electrode, a second electrode, and a plurality of light emitting elements electrically connected between the first and the second electrodes; and an oscillator disposed on the substrate between the pixels and electrically disconnected from the pixels, the oscillator comprising at least one transistor and at least one capacitor.

In an aspect, a method of manufacturing a display device in accordance with an embodiment of the disclosure may include preparing a substrate comprising a pixel circuit layer including an oscillator, a first electrode electrically connected to the oscillator and formed on the pixel circuit layer, and a second electrode formed on the pixel circuit layer; supplying light emitting elements between the first electrode and the second electrode; and aligning the light emitting elements between the first electrode and the second electrode by applying a direct current voltage to the oscillator.

In an embodiment, the oscillator may convert the direct current voltage to an alternating current voltage and supply the alternating current voltage to the first electrode.

In an embodiment, the aligning of the light emitting elements may include applying a ground voltage to the second electrode while applying the direct current voltage to the oscillator.

In an embodiment, the method may further include dividing the first electrode by pixel areas, and separating the first electrode from an output terminal of the oscillator.

In an embodiment, the method may further include forming a first contact electrode electrically connecting a first end of each of the light emitting elements to the first electrode, and a second contact electrode electrically connecting a second end of each of the light emitting elements to the second electrode.

In an embodiment, the method may further include removing the oscillator by cutting off the substrate between the first electrode and the oscillator.

In an embodiment, the aligning of the light emitting elements may further include applying an alternating current voltage from an external alternating current power supply to the first electrode.

In a display device and a method of manufacturing the display device in accordance with an embodiment of the disclosure, a DC voltage applied to a display panel may be converted to an AC voltage by an oscillator, and the AC voltage may be supplied to a power line. Thus, an AC voltage having a uniform size may be supplied to each pixel, and light emitting elements may be uniformly aligned in the entirety of the display panel.

BRIEF DESCRIPTION OF THE DRAWINGS

An additional appreciation according to the embodiments of the disclosure will become more apparent by describing in detail the embodiments thereof with reference to the accompanying drawings, wherein:

FIG. 19 is a flowchart schematically illustrating a method of manufacturing the display device in accordance with an embodiment of the disclosure.

FIGS. 20A to 20D are diagrams schematically illustrating the method of manufacturing the display device of FIG. 19.

DETAILED DESCRIPTION OF THE EMBODIMENTS

Figure 1A:
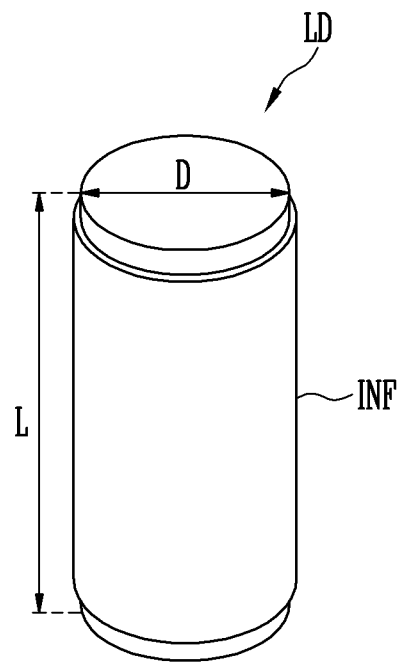
FIGS. 1A and 1B are respectively a perspective view and a cross-sectional view schematically illustrating a light emitting element in accordance with an embodiment of the disclosure.

Reference will now be made in detail to various embodiments of the disclosure, specific examples of which are illustrated in the accompanying drawings and described below, since the embodiments of the disclosure can be variously modified in many different forms. However, the disclosure is not limited to the following embodiments and may be modified into various forms.

Some elements which are not directly related to the features of the disclosure in the drawings may be omitted to clearly explain the disclosure. Furthermore, the sizes, ratios, etc. of some elements in the drawings may be exaggerated. It should be noted that the same reference numerals are used to designate the same or similar elements throughout the drawings, and repetitive descriptions will be omitted.

The phrase "at least one of" is intended to include the meaning of "at least one selected from the group of" for the purpose of its meaning and interpretation. For example, "at least one of A and B" may be understood to mean "A, B, or A and B."

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

Figure 1B:
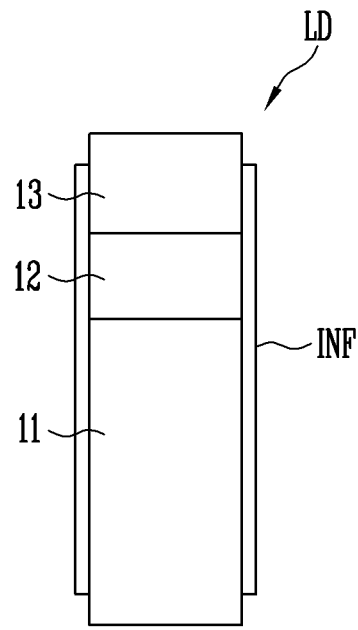

FIGS. 1A and 1B are respectively a perspective view and a cross-sectional view schematically illustrating a light emitting element in accordance with an embodiment. Although FIGS. 1A and 1B illustrate a rod-type light emitting element LD having a cylindrical shape, the type and/or shape of the light emitting element LD according to the disclosure is not limited thereto.

Referring to FIGS. 1A and 1B, the light emitting element LD may include a first semiconductor layer 11, a second semiconductor layer 13, and an active layer 12 interposed between the first and second semiconductor layers 11 and 13. For example, the light emitting element LD may be configured of a stacked body formed by successively stacking the first semiconductor layer 11, the active layer 12, and the second semiconductor layer 13 in a direction.

In an embodiment, the light emitting element LD may be provided in the form of a rod extending in a direction. The light emitting element LD may have a first end and a second end in a direction.

In an embodiment, one of the first and second semiconductor layers 11 and 13 may be disposed on the first end of the light emitting element LD, and the other of the first and second semiconductor layers 11 and 13 may be disposed on the second end of the light emitting element LD.

In an embodiment, the light emitting element LD may be a rod-type light emitting diode manufactured in the form of a rod. Here, the term "rod-like shape" embraces a rod-like shape and a bar-like shape such as a cylindrical shape and a prismatic shape that is longer in a longitudinal direction than in a width direction (for example, having an aspect ratio greater than 1), and the cross-sectional shape thereof is not limited to a particular shape. For example, a length L of the light emitting element LD may be greater than a diameter D thereof (or a width of the cross-section thereof).

In an embodiment, the light emitting element LD may have a small size corresponding to the nanometer scale or the micrometer scale, e.g., a diameter D and/or a length L corresponding to the nanometer scale or the micrometer scale. However, the size of the light emitting element LD is not limited thereto. For example, the size of the light emitting element LD may be changed in various ways depending on design conditions of various devices, e.g., a display device, which employs, as a light source, a light emitting device using a light emitting element LD.

The first semiconductor layer 11 may include at least one n-type semiconductor layer. For instance, the first semiconductor layer 11 may include an n-type semiconductor layer which includes a semiconductor material of InAlGaN, GaN, AlGaN, InGaN, AlN, and InN and is doped with a first conductive dopant such as Si, Ge, or Sn. However, a material for forming the first semiconductor layer 11 is not limited thereto, and the first semiconductor layer 11 may be formed of various other materials.

The active layer 12 may be disposed on the first semiconductor layer 11 and have a single or multiple quantum well structure. In an embodiment, a cladding layer (not shown) doped with a conductive dopant may be formed over and/or under the active layer 12. For example, the cladding layer may be formed of an AlGaN layer or an InAlGaN layer. In an embodiment, a material such as AlGaN or AlInGaN may be used to form the active layer 12, and various other materials may be used to form the active layer 12.

If a voltage equal to or greater than a predetermined voltage is applied between the opposite ends of the light emitting element LD, the light emitting element LD may emit light by coupling of electron-hole pairs in the active layer 12. Since light emission of the light emitting element LD can be controlled based on the foregoing principle, the light emitting element LD may be used as a light source of various light emitting devices as well as a pixel of the display device.

The second semiconductor layer 13 may be disposed on the active layer 12 and include a semiconductor layer having a type different from that of the first semiconductor layer 11. For example, the second semiconductor layer 13 may include at least one p-type semiconductor layer. For instance, the second semiconductor layer 13 may include a p-type semiconductor layer which includes at least one semiconductor material of InAlGaN, GaN, AlGaN, InGaN, AlN, and InN and is doped with a second conductive dopant such as Mg. However, a material for forming the second semiconductor layer 13 is not limited thereto, and the second semiconductor layer 13 may be formed of various other materials.

In an embodiment, the light emitting element LD may further include an insulating film INF provided on the surface of the light emitting element LD. The insulating film INF may be formed on the surface of the light emitting element LD to enclose an outer circumferential surface of at least the active layer 12 and may further enclose predetermined areas of the first and second semiconductor layers 11 and 13. The insulating film INF may expose the opposite ends of the light emitting element LD that have different polarities to the outside. For example, the insulating film INF may expose an end of each of the first and second semiconductor layers 11 and 13 that are disposed on the respective opposite ends of the light emitting element LD in the longitudinal direction and, for example, may expose two surfaces (for example, top and bottom surfaces) of the cylindrical shape rather than covering (or overlapping) them.

In an embodiment, the insulating film INF may include at least one insulating material of silicon dioxide ($SiO_2$), silicon nitride ($Si_3N_4$), aluminum oxide ($Al_2O_3$), and titanium dioxide ($TiO_2$), but the disclosure is not limited thereto. In other words, a material forming the insulating film INF is not limited to a particular material, and the insulating film INF may be formed of various insulating materials.

In an embodiment, the light emitting element LD may further include additional components as well as the first semiconductor layer 11, the active layer 12, the second semiconductor layer 13, and/or the insulating film INF. For example, the light emitting element LD may further include one or more fluorescent layers, one or more active layers, one or more semiconductor layers, and/or one or more electrode layers disposed on an end of the first semiconductor layer 11, the active layer 12, and/or the second semiconductor layer 13.

Figure 2A:
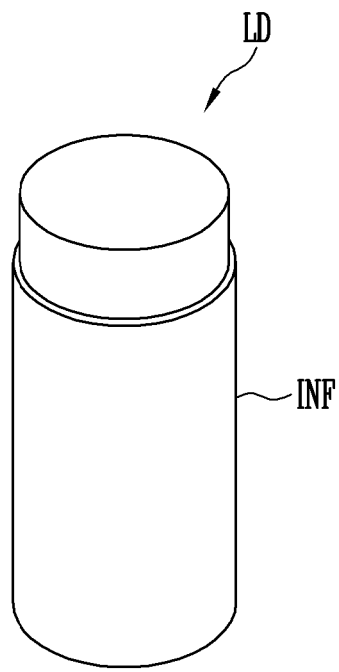
FIGS. 2A and 2B are respectively a perspective view and a cross-sectional view schematically illustrating a light emitting element in accordance with an embodiment of the disclosure.
Figure 2B:
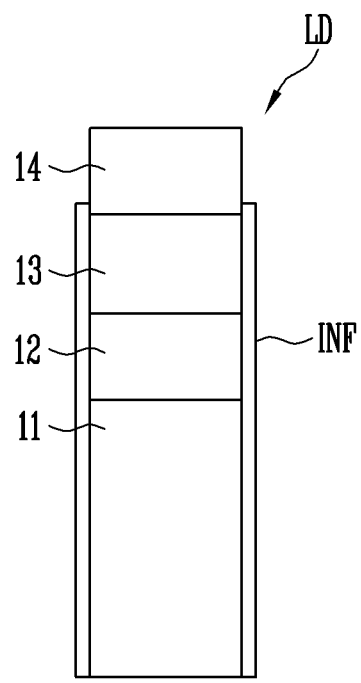
Figure 3A:
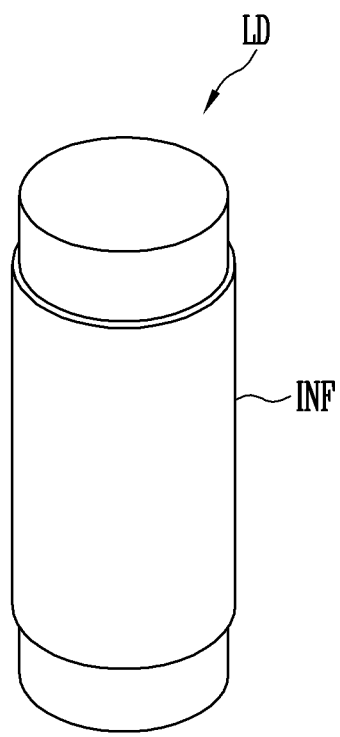
FIGS. 3A and 3B are respectively a perspective view and a cross-sectional view schematically illustrating a light emitting element in accordance with an embodiment of the disclosure.
Figure 3B:
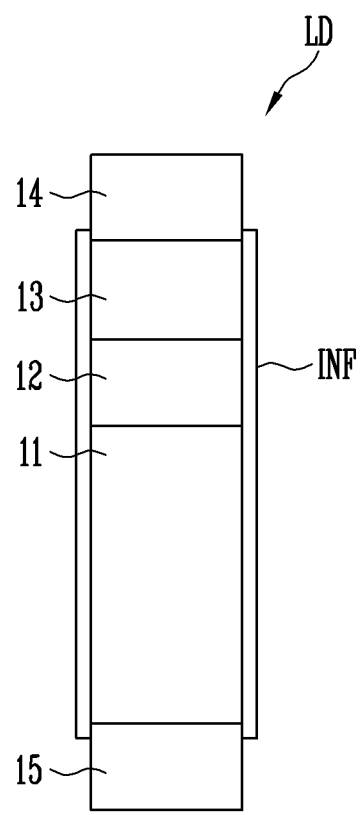

FIGS. 2A and 2B are respectively a perspective view and a cross-sectional view schematically illustrating a light emitting element in accordance with an embodiment. FIGS. 3A and 3B are respectively a perspective view and a cross-sectional view schematically illustrating a light emitting element in accordance with an embodiment.

Referring to FIGS. 2A and 2B, the light emitting element LD may further include at least one electrode layer 14 disposed on an end of the second semiconductor layer 13.

Referring to FIGS. 3A and 3B, the light emitting element LD may further include at least one electrode layer 15 disposed on an end of the first semiconductor layer 11.

Each of the electrode layers 14 and 15 may be an ohmic contact electrode, but the disclosure is not limited thereto. Furthermore, each of the electrode layers 14 and 15 may include metal or conductive metal oxide. For example, each of the electrode layers 14 and 15 may be formed of transparent electrode materials such as chromium (Cr), titanium (Ti), aluminum (Al), gold (Au), nickel (Ni), oxides or alloys thereof, indium tin oxide (ITO), indium zinc oxide (IZO), zinc oxide (ZnO), and indium tin zinc oxide (ITZO) alone or in combination. The electrode layers 14 and 15 may be substantially transparent or semitransparent. Therefore, light generated from the light emitting element LD may be emitted to the outside after passing through the electrode layers 14 and 15.

In an embodiment, the insulating film INF may at least partially enclose outer circumferential surfaces of the electrode layers 14 and 15 or may not enclose the outer circumferential surfaces. In other words, the insulating film INF may be selectively formed on the surfaces of the electrode layers 14 and 15. Furthermore, the insulating film INF may be formed to expose the opposite ends of the light emitting element LD that have different polarities and, for example, may expose at least an area of each of the electrode layers 14 and 15. However, the disclosure is not limited thereto, and the insulating film INF may be omitted.

If the insulating film INF is provided on the surface of the light emitting element LD, for example, on the surface of the active layer 12, the active layer 12 may be prevented from short-circuiting with at least one electrode, e.g., at least one contact electrode of contact electrodes electrically connected to the opposite ends of the light emitting element LD. Consequently, the electrical stability of the light emitting element LD may be secured.

Furthermore, the insulating film INF may be formed on the surface of the light emitting element LD, thereby minimizing surface defects in the light emitting element LD and improving the lifespan and efficiency of the light emitting element LD. Moreover, the insulating film INF is formed on the surface of the light emitting element LD, thereby preventing an undesired short circuit between the light emitting elements LD from occurring even if multiple light emitting elements LD are arranged in close proximity to each other.

In an embodiment, the light emitting element LD may be manufactured by a surface treatment process (e.g., coating). For example, in case that the light emitting elements LD are mixed with fluid solution (or solvent) and are supplied to each light emitting area (e.g., a light emitting area of each pixel), the light emitting elements LD may be uniformly dispersed in the fluid solution without being non-uniformly aggregated in the solution. Here, the light emitting area is an area in which light is emitted by the light emitting elements LD. The light emitting area may be distinguished from a non-light-emitting area in which light is not emitted.

In some embodiments, the insulating film INF itself may be formed of a hydrophobic film using a hydrophobic material, or an additional hydrophobic film formed of the hydrophobic material may be formed on the insulating film INF. In an embodiment, the hydrophobic material may be a material containing fluorine to exhibit hydrophobicity. In an embodiment, the hydrophobic material may be applied to the light emitting elements LD in the form of a self-assembled monolayer (SAM). In this case, the hydrophobic material may include octadecyl trichlorosilane, fluoroalkyl trichlorosilane, perfluoroalkyl triethoxysilane, or the like. Furthermore, the hydrophobic material may be a commercially available fluorine containing material such as Teflon™ or Cytop™, or a corresponding material.

A light emitting device including the light emitting element LD described above may be used in various devices including a display device which requires a light source. For instance, at least one subminiature light emitting element LD, e.g., subminiature light emitting elements LD each having a size ranging from the nanometer scale to the micrometer scale, may be disposed in each pixel area of a display panel to form a light source (or a light source unit) of the corresponding pixel using the subminiature light emitting elements LD. Furthermore, the field of application of the light emitting element LD according to the disclosure is not limited to a display device. For example, the light emitting element LD may also be used in other types of devices such as a lighting device which requires a light source.

Figure 4:
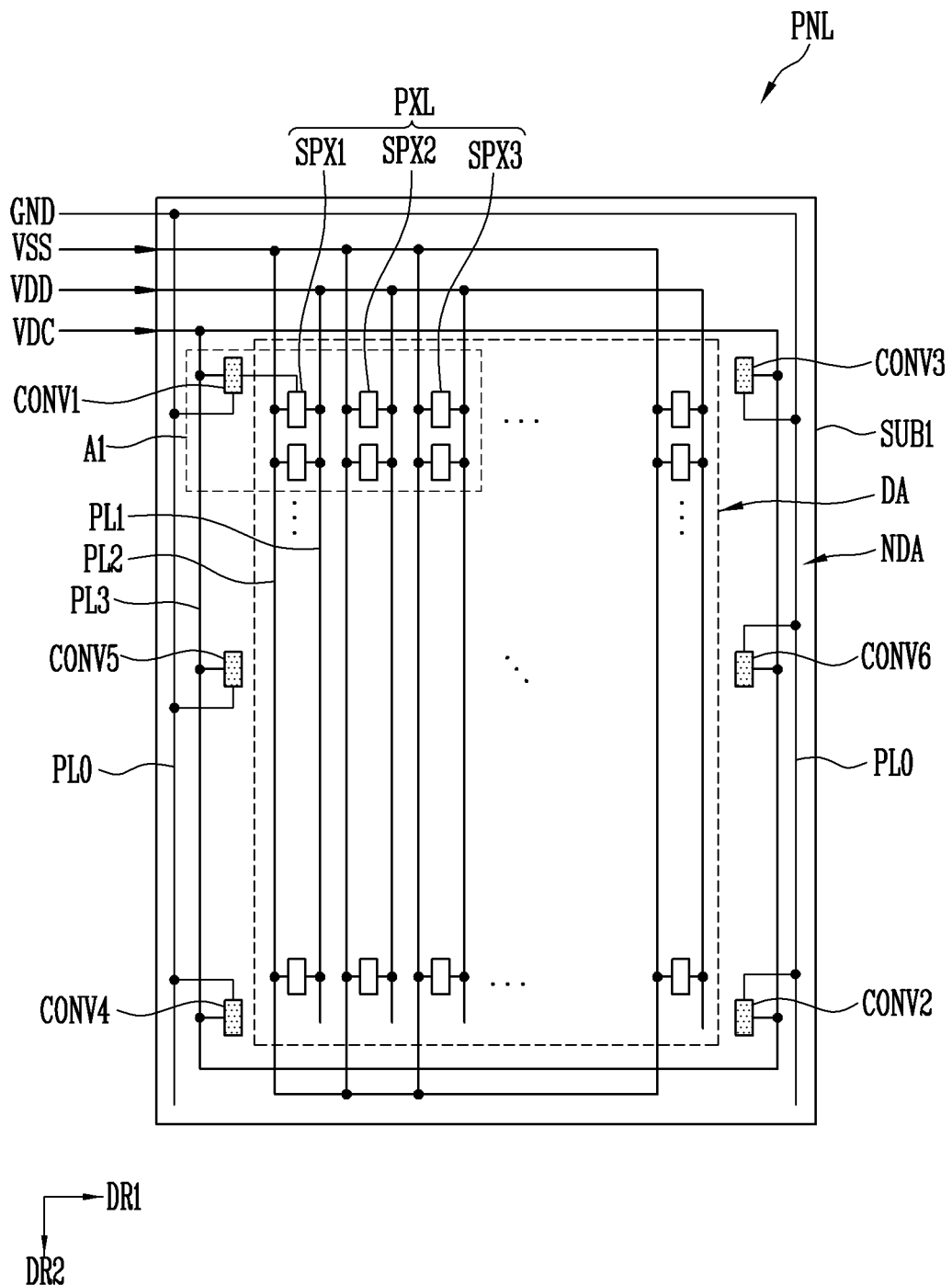
FIG. 4 is a plan view schematically illustrating a display device in accordance with an embodiment of the disclosure.

FIG. 4 is a plan view schematically illustrating a display device in accordance with an embodiment. In an embodiment, FIG. 4 illustrates a display device, particularly, a display panel PNL provided in the display device, as an example of a device which may use, as a light source, the light emitting elements LD described with reference to FIGS. 1A to 3B. In accordance with the embodiment, FIG. 4 simply illustrates the structure of the display panel PNL, focusing on a display area DA. In some embodiments, although not illustrated, at least one driving circuit component (e.g., at least one of a scan driver and a data driver) and/or lines may be further provided in the display panel PNL.

Referring to FIG. 4, the display panel PNL may include a base layer SUB1 (or a substrate), power lines PL0, PL1, PL2, and PL3, a pixel PXL, and oscillators CONV1 to CONV6 (or oscillating circuits or converting circuits) which are disposed on the base layer SUB1.

The display panel PNL and the base layer SUB1 may include the display area DA configured to display an image, and a non-display area NDA formed in a predetermined area other than the display area DA.

In an embodiment, the display area DA may be disposed in a central area of the display panel PNL, and the non-display area NDA may be disposed along a border of the display panel PNL in such a way as to enclose the display area DA. The locations of the display area DA and the non-display area NDA are not limited thereto, and the locations thereof may be changed.

The base layer SUB1 may form a base of the display panel PNL. For example, the base layer SUB1 may form a base of a lower panel (e.g., a lower plate of the display panel PNL).

In an embodiment, the base layer SUB1 may be a rigid or flexible substrate, and the material or properties thereof are not particularly limited. For example, the base layer SUB1 may be a rigid substrate made of glass or reinforced glass, or a flexible substrate formed of a thin film made of plastic or metal. Furthermore, the base layer SUB1 may be a transparent substrate, but the disclosure is not limited thereto. For instance, the base layer SUB1 may be a translucent substrate, an opaque substrate, or a reflective substrate.

An area of the base layer SUB1 is defined as the display area DA in which the pixels PXL are disposed, and the other area thereof is defined as the non-display area NDA. For example, the base layer SUB1 may include the display area DA including pixel areas in which the pixels PXL are formed, and the non-display area NDA disposed around the display area DA. The oscillators CONV1 to CONV6 and various lines and/or internal circuits electrically connected to the pixels PXL of the display area DA may be disposed in the non-display area NDA.

A first power line PL1 may extend across the display area DA in a second direction DR2 and be repetitively arranged in the first direction DR1. The first power line PL1 may be a common line electrically connected to all of the pixels PXL, and a first power supply VDD (or a first power voltage) may be applied to the first power line PL1.

Likewise, a second power line PL2 may extend across the display area DA in the second direction DR2 and be repetitively arranged in the first direction DR1. The second power line PL2 may be a common line, and a second power supply VSS (or a second power voltage) may be applied to the second power line PL2. Here, the first and second power supplies VDD and VSS may have different voltage levels. For example, the first power supply VDD may have a voltage level higher than that of the second power supply VSS.

A third power line PL3 may be disposed in the non-display area NDA. The third power line PL3 may form a closed loop enclosing the display area DA, but the disclosure is not limited thereto. During a process of manufacturing the display panel PNL (e.g., during a process of supplying and aligning the light emitting element LD in the pixel PXL), a DC voltage VDC (or a DC alignment voltage, or a DC power voltage) may be applied to the third power line PL3.

A reference power line PL0 (or a fourth power line) may be disposed in the non-display area NDA. A reference voltage GND (or a ground voltage) may be applied to the reference power line PL0, or the reference power line PL0 may be grounded. However, the reference power line PL0 is not limited thereto. For example, the reference power line PL0 may be electrically connected the second power line PL2, and during the process of manufacturing the display panel PNL, the reference voltage GND may be applied to the reference power line PL0 through the second power line PL2.

The pixel PXL may be electrically connected between the first power line PL1 and the second power line PL2 and include at least one light emitting element LD (e.g., at least one rod-type light emitting diode according to any one of embodiments shown in FIGS. 1A to 3B), which is driven by a corresponding scan signal and a corresponding data signal. For example, the pixel PXL may include rod-type light emitting diodes, each of which has a small size ranging from the nanometer scale to the micrometer scale, and which are electrically connected in parallel to each other between the first power line PL1 and the second power line PL2. The rod-type light emitting diodes may form a light source of each pixel PXL.

Furthermore, the pixel PXL may include sub-pixels SPX1, SPX2, and SPX3. For example, the pixel PXL may include a first sub-pixel SPX1, a second sub-pixel SPX2, and a third sub-pixel SPX3.

In an embodiment, the first to third sub-pixels SPX1, SPX2, and SPX3 may emit different colors of light. For instance, the first sub-pixel SPX1 may be a red sub-pixel for emitting red light, the second sub-pixel SPX2 may be a green sub-pixel for emitting green light, and the third sub-pixel SPX3 may be a blue sub-pixel for emitting blue light. However, the colors, types, and/or numbers of sub-pixels forming each pixel PXL are not particularly limited. For example, the color of light which is emitted from each sub-pixel may be changed in various ways. Although FIG. 4 illustrates an embodiment where the pixels PXL are arranged in the display area DA in a stripe shape, the disclosure is not limited thereto. For example, the pixels PXL may be arranged in various pixel array forms.

In an embodiment, the pixel PXL (or each of the sub-pixels) may be formed of an active pixel. However, the type, structure, and/or driving method of the pixel PXL that may be applied to the display device according to the disclosure is not particularly limited. For example, the pixel PXL may be formed of a pixel of a light emitting display device which has various active or passive structures.

Each of the oscillators CONV1 to CONV6 may be electrically connected between the reference power line PL0 and a third power line PL3 and convert a DC voltage VDC provided from the third power line PL3 (or a DC voltage applied between the third power line PL3 and the reference power line PL0) to an AC voltage. For example, each of the oscillators CONV1 to CONV6 may convert the DC voltage VDC provided from the third power line PL3 to an AC voltage and supply the AC voltage to the pixel PXL during a process of aligning the light emitting element LD in the process of manufacturing the display panel PNL. In case that the display device (or the display panel PNL) is turned on to display an image, the third power line PL3 may float, or no voltage may be applied to the third power line PL3. Likewise, no voltage may also be applied to the reference power line PL0.

The oscillators CONV1 to CONV6 may be disposed in the non-display area NDA of the base layer SUB1.

In embodiments, the oscillators CONV1 to CONV6 may be disposed on the base layer SUB1 to be symmetrical with each other or at regular intervals. For example, a first oscillator CONV1 may be disposed adjacent to a point of the display panel PNL to which a DC voltage VDC is applied from an external device. The second oscillator CONV2 may be disposed to correspond to the first oscillator CONV1 based on a center area of the display panel PNL. Third and fourth oscillators CONV3 and CONV4 may be respectively disposed to be bilaterally (or top-and-bottom) symmetrical with the first and second oscillators CONV1 and CONV2. A fifth oscillator CONV5 may be disposed between the first oscillator CONV1 and the fourth oscillator CONV4. A sixth oscillator CONV6 may be disposed between the second oscillator CONV2 and the third oscillator CONV3. As another example, the oscillators CONV1 to CONV6 may be disposed at regular intervals (e.g., intervals of about 2.5 inch) in the non-display area NDA disposed along a border of the display area DA.

The oscillators CONV1 to CONV6 may be disposed to be symmetrical with each other in the non-display area NDA or disposed at regular intervals along the border of the display area DA, so that a uniform AC voltage may be supplied to the entirety of the display panel PNL through the oscillators CONV1 to CONV6.

Although FIG. 4 illustrates that the display panel PNL includes six oscillators CONV1 to CONV6 disposed in the non-display area NDA, this is to illustrate that the oscillators CONV1 to CONV6 are disposed at various positions, and the display panel PNL is not limited the foregoing structure. For example, the display panel PNL may include two to five, or seven or more oscillators, and at least one of the oscillators may be disposed in the display area DA.

Figure 5A:
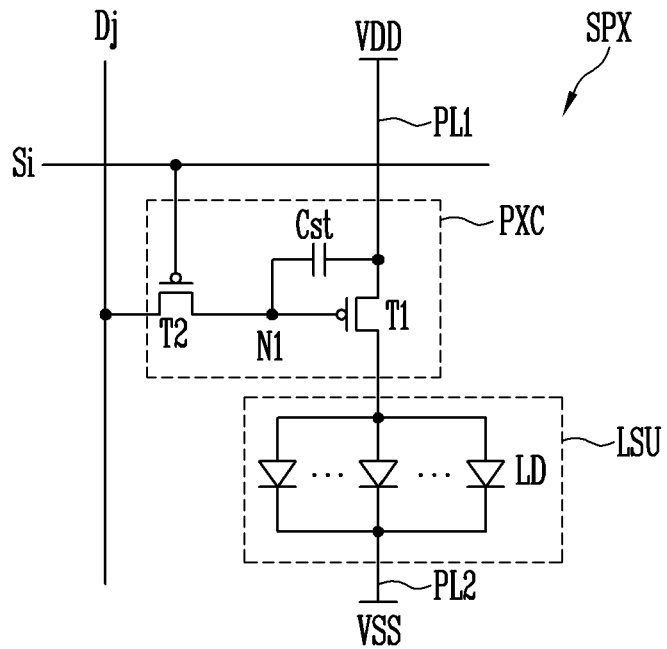
FIGS. 5A to 5C are circuit diagrams schematically illustrating examples of a sub-pixel included in the display device of FIG. 4.
Figure 5B:
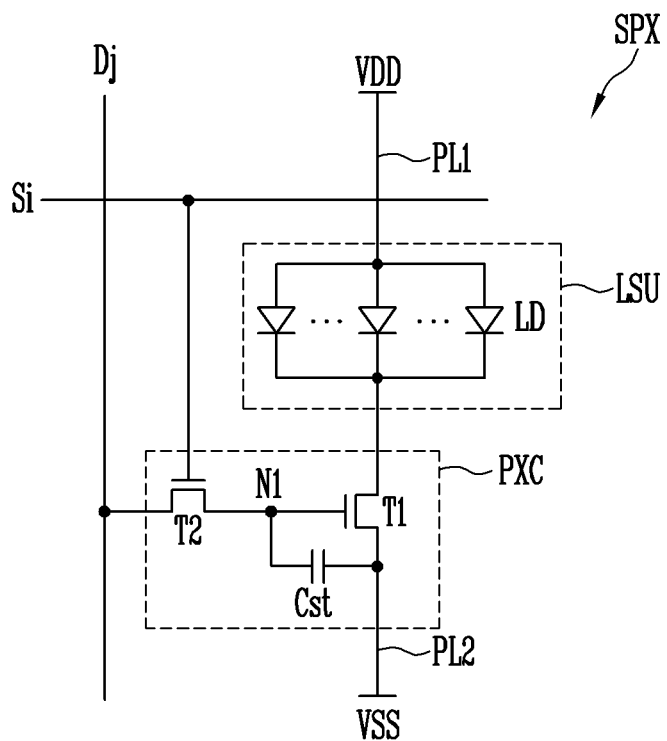
Figure 5C:
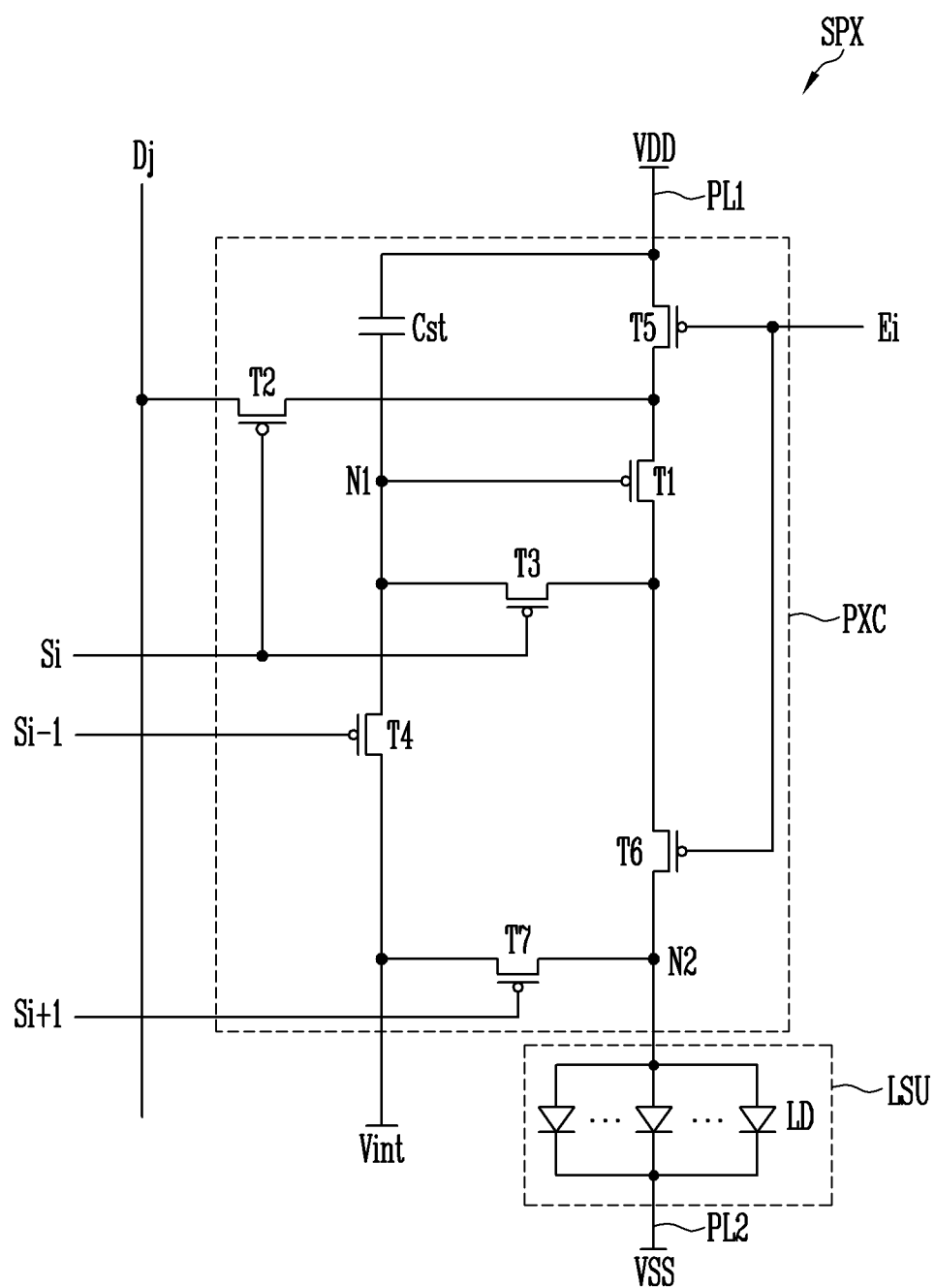

FIGS. 5A to 5C are circuit diagrams schematically illustrating examples of a sub-pixel included in the display device of FIG. 4. The sub-pixel SPX shown in each of FIGS. 5A to 5C may be one of the first, second, and third sub-pixels SPX1, SPX2, and SPX3 provided in the display panel PNL of FIG. 4. The structures of the first, second, and third sub-pixels SPX1, SPX2, and SPX3 may be substantially identical or similar to each other. Therefore, as illustrated in FIGS. 5A to 5C, the first, second, and third sub-pixels SPX1, SPX2, and SPX3 will be collectively referred to as a sub-pixel SPX.

First, referring to FIG. 5A, the sub-pixel SPX may include a light source unit LSU that emits light having a luminance corresponding to a data signal. The sub-pixel SPX may selectively further include a pixel circuit PXC configured to drive the light source unit LSU.

In an embodiment, the light source unit LSU may include light emitting elements LD that are electrically connected to each other between the first power supply VDD and the second power supply VSS. In an embodiment, the light emitting elements LD may be electrically connected in parallel to each other, but the disclosure is not limited thereto. For example, light emitting elements LD may be electrically connected to each other in a serial/parallel combination structure between the first power supply VDD and the second power supply VSS.

The first and second power supplies VDD and VSS may have different potentials to allow the light emitting elements LD to emit light. For example, the first power supply VDD may be set as a high-potential power supply, and the second power supply VSS may be set as a low-potential power supply. A difference in potential between the first and second power supplies VDD and VSS may be set to a voltage equal to or greater than a threshold voltage of the light emitting elements LD during at least an emission period of the sub-pixel SPX.

Although FIG. 5A illustrates an embodiment in which the light emitting elements LD are electrically connected to each other in parallel in a same direction (e.g., a forward direction) between the first power supply VDD and the second power supply VSS, the disclosure is not limited thereto. For example, some of the light emitting elements LD may be electrically connected to each other in a first direction (e.g., the forward direction) between the first and second power supplies VDD and VSS to form each valid light source, and other light emitting elements LD may be electrically connected to each other in a second direction (e.g., a reverse direction). As another example, at least one sub-pixel SPX may include only a single light emitting element LD (e.g., a single effective light source electrically connected in the forward direction between the first and second power supplies VDD and VSS).

In accordance with an embodiment, the first end of each of the light emitting elements LD may be electrically connected in common to a corresponding pixel circuit PXC through a first electrode and may be electrically connected to the first power supply VDD through the pixel circuit PXC and the first power supply line PL1 (refer to FIG. 4). The second end of each of the light emitting elements LD may be electrically connected in common to the second power supply VSS through a second electrode and the second power line PL2.

The light source unit LSU may emit light having a luminance corresponding to driving current supplied thereto through the corresponding pixel circuit PXC. Therefore, a predetermined image may be displayed in the display area DA.

The pixel circuit PXC may be electrically connected to a scan line Si and a data line Dj of the corresponding sub-pixel SPX. For example, in case that the sub-pixel SPX is disposed in an i-th row and a j-th column of the display area DA, the pixel circuit PXC of the sub-pixel SPX may be electrically connected to an i-th scan line Si and a j-th data line Dj of the display area DA (where i and j are natural numbers). The pixel circuit PXC may include a first transistor T1, a second transistor T2, and a storage capacitor Cst.

The first transistor T1 (or a driving transistor) may be electrically connected between the first power supply VDD and the light source unit LSU. A gate electrode of the first transistor T1 may be electrically connected to a first node N1. The first transistor T1 may control driving current to be supplied to the light source unit LSU in response to a voltage of the first node N1.

The second transistor T2 (or a switching transistor) may be electrically connected between the data line Dj and the first node N1. A gate electrode of the second transistor T2 may be electrically connected to the scan line Si.

In response to a scan signal of a gate-on voltage (e.g., a low voltage) supplied from the scan line Si, the second transistor T2 may be turned on to electrically connect the first node N1 to the data line Dj.

During each frame period, a data signal of a corresponding frame may be supplied to the data line Dj. The data signal may be transmitted to the first node N1 via the second transistor T2. Therefore, a voltage corresponding to the data signal may be stored in the storage capacitor Cst.

An electrode of the storage capacitor Cst may be electrically connected to the first power supply VDD, and another electrode thereof may be electrically connected to the first node N1. The storage capacitor Cst may store voltage corresponding to a data signal supplied to the first node N1 during each frame period and maintain the stored voltage until a data signal of a subsequent frame is supplied.

Although FIG. 5A illustrates that all of the transistors, e.g., the first and second transistors T1 and T2, included in the pixel circuit PXC are P-type transistors, the disclosure is not limited thereto. For example, at least one of the first and second transistors T1 and T2 may be changed to an N-type transistor.

For instance, as shown in FIG. 5B, both the first and second transistors T1 and T2 may be N-type transistors. In this case, the gate-on voltage of the scan signal for writing the data signal supplied to the data line Dj in each frame period in the sub-pixel SPX may be a high-level voltage. Likewise, the voltage of the data signal for turning on the first transistor T1 may be a voltage having a waveform opposite to that of the embodiment of FIG. 5A. For example, in the embodiment of FIG. 5B, as a gray scale value that is to be expressed increases, a data signal having a higher voltage level may be supplied.

The sub-pixel SPX shown in FIG. 5B is substantially similar in configuration and operation to the sub-pixel SPX of FIG. 5A, except that the connection positions of some circuit elements and the voltage levels of control signals (e.g., a scan signal and a data signal) are changed depending on a change in type of the transistor. Therefore, detailed descriptions of the sub-pixel SPX of FIG. 5B will be omitted.

The structure of the pixel circuit PXC is not limited to the embodiments shown in FIGS. 5A and 5B. In other words, the pixel circuit PXC may be formed of a pixel circuit which may have various structures and/or be operated by various driving methods. For example, the pixel circuit PXC may be configured in the same manner as that of an embodiment illustrated in FIG. 5C.

Referring to FIG. 5C, the pixel circuit PXC may be electrically connected not only to a corresponding scan line Si but also to at least another scan line (or control line). For example, the pixel circuit PXC of the sub-pixel SPX disposed in the i-th row of the display area DA may be further electrically connected to an i−1-th scan line Si−1 and/or an i+1-th scan line Si+1. In an embodiment, the pixel circuit PXC may be electrically connected not only to the first and second power supplies VDD and VSS but also to other power supplies. For example, the pixel circuit PXC may also be electrically connected to an initialization power supply Vint. In an embodiment, the pixel circuit PXC may include first to seventh transistors T1 to T7 and a storage capacitor Cst.

The first transistor T1 may be electrically connected between the first power supply VDD and the light source unit LSU. A first electrode (e.g., a source electrode) of the first transistor T1 may be electrically connected to the first power supply VDD through the fifth transistor T5 and the first power line PL1, and a second electrode (e.g., a drain electrode) of the first transistor T1 may be electrically connected via the sixth transistor T6 to a first electrode (e.g., a first electrode of the corresponding sub-pixel SPX) of the light source unit LSU. A gate electrode of the first transistor T1 may be electrically connected to a first node N1. The first transistor T1 may control driving current to be supplied to the light source unit LSU in response to a voltage of the first node N1.

The second transistor T2 may be electrically connected between the data line Dj and the first electrode of the first transistor T1. A gate electrode of the second transistor T2 may be electrically connected to the corresponding scan line Si. In case that a scan signal having a gate-on voltage is supplied from the scan line Si to the second transistor T2, the second transistor T2 may be turned on to electrically connect the data line Dj to the first electrode of the first transistor T1. Hence, if the second transistor T2 is turned on, a data signal supplied from the data line Dj may be transmitted to the first transistor T1.

The third transistor T3 may be electrically connected between the second electrode (e.g., the drain electrode) of the first transistor T1 and the first node N1. A gate electrode of the third transistor T3 may be electrically connected to the corresponding scan line Si. In case that a scan signal of a gate-on voltage is supplied from the scan line Si, the third transistor T3 may be turned on to electrically connect the first transistor T1 in the form of a diode.

The fourth transistor T4 may be electrically connected between the first node N1 and the initialization power supply Vint. A gate electrode of the fourth transistor T4 may be electrically connected to a preceding scan line, e.g., an i−1-th scan line Si−1. In case that a scan signal of a gate-on voltage is supplied to the i−1-th scan line Si−1, the fourth transistor T4 may be turned on so that the voltage of the initialization power supply Vint may be transmitted to the first node N1. The voltage of the initialization power supply Vint may be a minimum voltage of a data signal or less.

The fifth transistor T5 may be electrically connected between the first power supply VDD and the first transistor T1. A gate electrode of the fifth transistor T5 may be electrically connected to a corresponding emission control line, e.g., an i-th emission control line Ei. The fifth transistor T5 may be turned off in case that an emission control signal having a gate-off voltage (e.g., a high voltage) is supplied to the emission control line Ei, and may be turned on in other cases.

The sixth transistor T6 may be electrically connected between the first transistor T1 and the first electrode of the light source unit LSU. A gate electrode of the sixth transistor T6 may be electrically connected to a corresponding emission control line, e.g., an i-th emission control line Ei. The sixth transistor T6 may be turned off in case that an emission control signal of a gate-off voltage is supplied to the emission control line Ei, and may be turned on in other cases.

The seventh transistor T7 may be electrically connected between a second node N2 electrically connected to the first electrode of the light source unit LSU and the initialization power supply Vint. A gate electrode of the seventh transistor T7 may be electrically connected to one of scan lines of a subsequent stage, e.g., to the i+1-th scan line Si+1. In case that a scan signal of a gate-on voltage is supplied to the i+1-th scan line Si+1, the seventh transistor T7 may be turned on so that the voltage of the initialization power supply Vint may be supplied to the first electrode of the light source unit LSU. In this case, during an initialization period in which the voltage of the initialization power supply Vint is transmitted to the power source unit LSU, the voltage of the first electrode of the light source unit LSU may be initialized.

A control signal for controlling the operation of the seventh transistor T7 may be variously changed. For example, the gate electrode of the seventh transistor T7 may be electrically connected to a scan line of a corresponding horizontal line, for example, an i-th scan line Si. In this case, in case that a scan signal having a gate-on voltage is supplied to the i-th scan line Si, the seventh transistor T7 may be turned on so that the voltage of the initialization power supply Vint may be supplied to the first electrode of the light source unit LSU.

The storage capacitor Cst may be electrically connected between the first power supply VDD and the first node N1. The storage capacitor Cst may store a voltage corresponding to the data signal applied to the first node N1 and/or to the threshold voltage of the first transistor T1 during each frame period.

Although FIG. 5C illustrates that the transistors included in the pixel circuit PXC, e.g., the first to seventh transistors T1 to T7, are formed of P-type transistors, the disclosure is not limited thereto. For example, at least one of the first to seventh transistors T1 to T7 may be changed to an N-type transistor.

Furthermore, the structure of the sub-pixel SPX which may be applied to the disclosure is not limited to the embodiments shown in FIGS. 5A to 5C, and the sub-pixel SPX may have various structures. For example, the pixel circuit PXC included in the sub-pixel SPX may be formed of a pixel circuit which may have various structures and/or be operated by various driving methods. The sub-pixel SPX may be formed in a passive light emitting display panel or the like. In this case, the pixel circuit PXC may be omitted, and each of the first and second electrodes of the light source unit LSU may be directly and electrically connected to the scan line Si, the data line Dj, a power line, and/or a control line.

FIGS. 6A to 6D are circuit diagrams schematically illustrating examples of an oscillator included in the display device of FIG. 4. An oscillator CONV shown in FIGS. 6A to 6D may be one of the first to sixth oscillators CONV1 to CONV6 provided in the display panel PNL of FIG. 4. The first to sixth oscillators CONV1 to CONV6 may have a substantially identical or similar structure. Therefore, as illustrated in FIGS. 6A to 6D, the first to sixth oscillators CONV1 to CONV6 will be collectively referred to as "oscillator CONV".

Figure 6A:
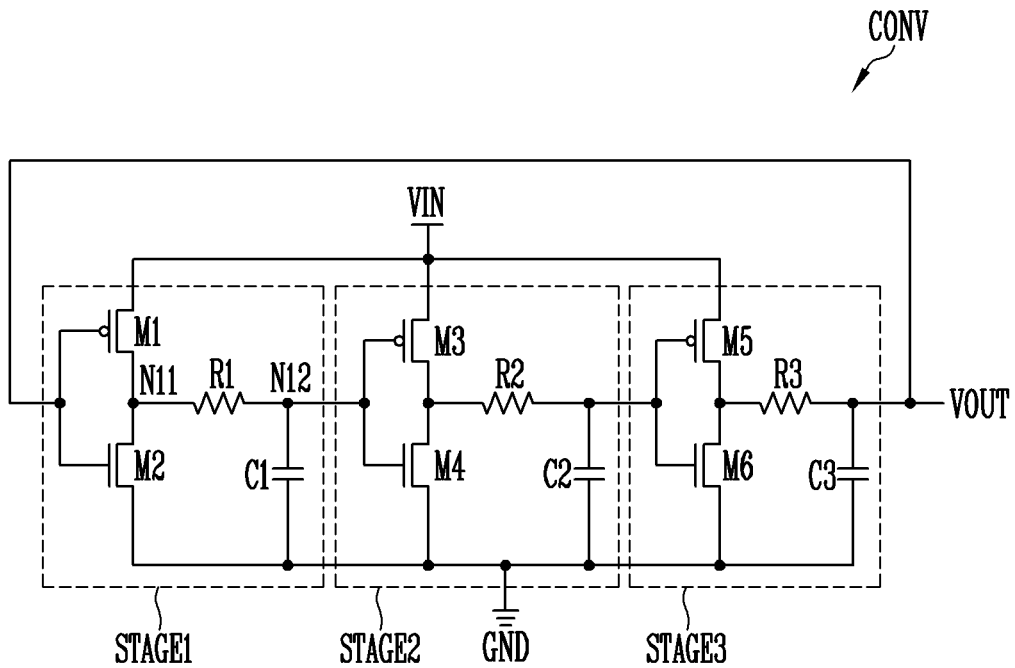
FIGS. 6A to 6D are circuit diagrams schematically illustrating examples of an oscillator included in the display device of FIG. 4.

Referring to FIG. 6A, the oscillator CONV may be electrically connected between a power line to which a DC input voltage VIN is applied and a reference line to which a reference voltage GND is applied, and may output an AC output voltage VOUT in response to the DC input voltage VIN. The input voltage VIN may be the same as the DC voltage VDC provided from the third power line PL3 of FIG. 4. The reference voltage GND may be the same as the reference voltage GND provided from the reference power line PL0 of FIG. 4. The output voltage VOUT may be provided to a second electrode ELT2 to be described below with reference to FIG. 7.

The oscillator CONV may include first to third stages STAGE1 to STAGE3. The first to third stages STAGE1 to STAGE3 may be electrically connected in series to each other.

The first stage STAGE1 may output an AC voltage corresponding to the input voltage VIN. The first stage STAGE1 may include a first switching element M1, a second switching element M2, a first resistor R1, and a first capacitor C1.

The first switching element M1 may include a first electrode configured to receive the input voltage VIN, a second electrode electrically connected to an eleventh node N11, and a gate electrode electrically connected to an input terminal of the oscillator CONV. The input terminal of the oscillator CONV may be electrically connected with an output terminal. The first switching element M1 may be implemented as a P-type transistor.

The second switching element M2 may include a first electrode electrically connected with the eleventh node N11, a second electrode configured to receive the reference voltage GND, and a gate electrode electrically connected to the input terminal of the oscillator CONV. The second switching element M2 may be implemented as an N-type transistor.

The first resistor R1 may be electrically connected to the eleventh node N11 and a twelfth node N12 (or an output terminal of the first stage STAGE1). The first capacitor C1 may be electrically connected between the twelfth node N12 and the reference line (for example, the reference line to which the reference voltage GND is applied, e.g., the reference power line PL0 shown in FIG. 4).

In case that the input voltage VIN is applied to the first stage STAGE1 (or the oscillator CONV), the first capacitor C1 may be charged with charges through the first switching element M1 and the first resistor R1. As the first capacitor C1 is charged, a voltage level of the output terminal of the first stage STAGE1 (and an output voltage VOUT output from the output terminal of the oscillator CONV) may increase.

In case that a voltage level of the output terminal of the first stage STAGE1 increases to a predetermined voltage or greater, the first switching element M1 may be turned off, and the second switching element M2 may be turned on. In this case, the first capacitor C1 may be discharged, and the voltage level of the output terminal of the first stage STAGE1 (and the output voltage VOUT output from the output terminal of the oscillator CONV) may decrease.

The first stage STAGE1 (and the oscillator CONV) may generate or output an AC voltage by alternately turning on the first switching element M1 and the second switching element M2. A frequency of the AC voltage may be determined by a resistance value of the first resistor R1 and a capacitance of the first capacitor C1.

An input terminal of the second stage STAGE2 may be electrically connected to the output terminal of the first stage STAGE1. An output terminal of the second stage STAGE2 may be electrically connected to an input terminal of the third stage STAGE3. The second stage STAGE2 may include a third switching element M3, a fourth switching element M4, a second resistor R2, and a second capacitor C2. The third switching element M3, the fourth switching element M4, the second resistor R2, and the second capacitor C2 of the second stage STAGE2 are substantially the same as the first switching element M1, the second switching element M2, the first resistor R1, and the first capacitor C1 of the first stage STAGE1, respectively, so that repetitive descriptions thereof will be omitted.

Likewise, the input terminal of the third stage STAGE3 may be electrically connected to the output terminal of the second stage STAGE2. An output terminal of the third stage STAGE3 may be electrically connected to an input terminal of the first stage STAGE1. The third stage STAGE3 may include a fifth switching element M5, a sixth switching element M6, a third resistor R3, and a third capacitor C3. The fifth switching element M5, the sixth switching element M6, the third resistor R3, and the third capacitor C3 of the third stage STAGE3 are substantially the same as the third switching element M3, the fourth switching element M4, the second resistor R2, and the second capacitor C2 of the second stage STAGE2, respectively, so that repetitive descriptions thereof will be omitted.

Although FIG. 6A illustrates that the oscillator CONV includes the first to third stages STAGE1 to STAGE3, the oscillator CONV is not limited thereto. For example, the oscillator CONV may include one, two, or four or more stages, taking into account an amplitude of the output voltage VOUT. To amplify the output voltage VOUT of the oscillator CONV, the oscillator CONV may further include an amplifying circuit on the output terminal thereof.

In embodiments, the oscillator CONV may generate a pulse-type output voltage VOUT (or a pulse wave, a square wave, a rectangular wave).

Figure 6B:
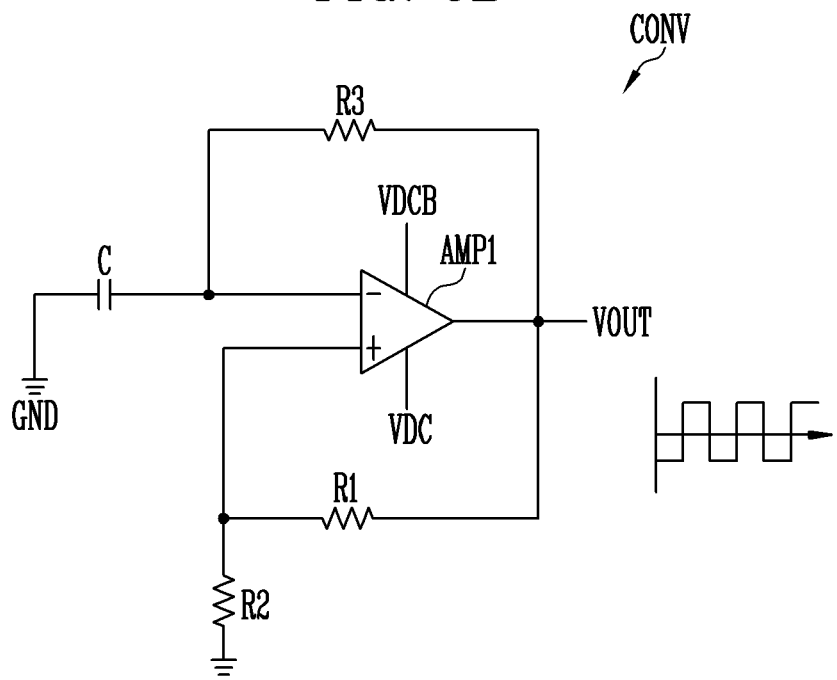

Referring to FIG. 6B, the oscillator CONV may include a first amplifier AMP1, first to third resistors R1 to R3, and a capacitor C.

A DC voltage VDC and a reverse voltage VDCB may be applied to the first amplifier AMP1. The DC voltage VDC may be the same as the DC voltage VDC described with reference to FIG. 4. The reverse voltage VDCB and the DC voltage VDC may have the same level and have different polarities.

The first resistor R1 may be electrically connected between a non-inverting terminal of the first amplifier AMP1 and an output terminal of the first amplifier AMP1. The second resistor R2 may be electrically connected between the non-inverting terminal of the first amplifier AMP1 and the reference line (for example, the reference line to which the reference voltage GND is applied). The third resistor R3 may be electrically connected between an inverting terminal of the first amplifier AMP1 and the output terminal of the first amplifier AMP1. The capacitor C may be electrically connected between the inverting terminal of the first amplifier AMP1 and the reference line.

The oscillator CONV may generate a pulsed output voltage VOUT by using charge and discharge of the capacitor C and a hysteresis phenomenon.

In embodiments, the oscillator CONV may generate a square wave output voltage VOUT.

Figure 6C:
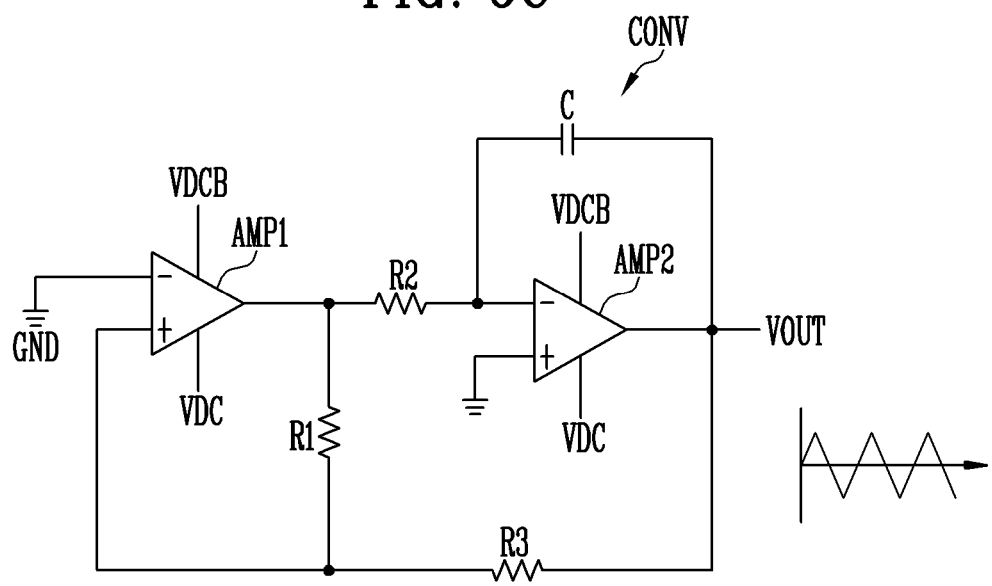

Referring to FIG. 6C, the oscillator CONV may include a first amplifier AMP1, a second amplifier AMP2, first to third resistors R1 to R3, and a capacitor C.

A DC voltage VDC and a reverse voltage VDCB may be applied to each of the first amplifier AMP1 and the second amplifier AMP2. The inverting terminal of the first amplifier AMP1 may be electrically connected to the reference line (for example, the reference line to which the reference voltage GND is applied). A non-inverting terminal of the second amplifier AMP2 may be electrically connected to the reference line (for example, the reference line to which the reference voltage GND is applied).

The first resistor R1 may be electrically connected between the output terminal of the first amplifier AMP1 and the non-inverting terminal of the first amplifier AMP1. The second resistor R2 may be electrically connected between the output terminal of the first amplifier AMP1 and an inverting terminal of the second amplifier AMP2. The third resistor R3 may be electrically connected between the non-inverting terminal of the first amplifier AMP1 and an output terminal of the second amplifier AMP2. The capacitor C may be electrically connected between the non-inverting terminal of the second amplifier AMP2 and the output terminal of the second amplifier AMP2.

The second amplifier AMP2, the second resistor R2, and the capacitor C may form an integrator and integrate current introduced into the inverting terminal of the second amplifier AMP2 so that a voltage level of the output voltage VOUT may linearly increase. Thereafter, in case that the output voltage VOUT reaches a first reference voltage level (e.g., 5V), a direction of the current that flows through the integrator may be changed depending on connection relationship between the first and third resistors R1 and R3, and the voltage level of the output voltage VOUT may linearly decrease. Subsequently, in case that the output voltage VOUT reaches a second reference voltage level (e.g., −5V), the direction of the current that flows through the integrator may be changed again, so that the voltage level of the output voltage VOUT may linearly increase again. As the foregoing processes iterate, the oscillator CONV may generate a triangular wave output voltage VOUT.

In embodiments, the oscillator CONV may generate a sawtooth wave output voltage VOUT.

Figure 6D:
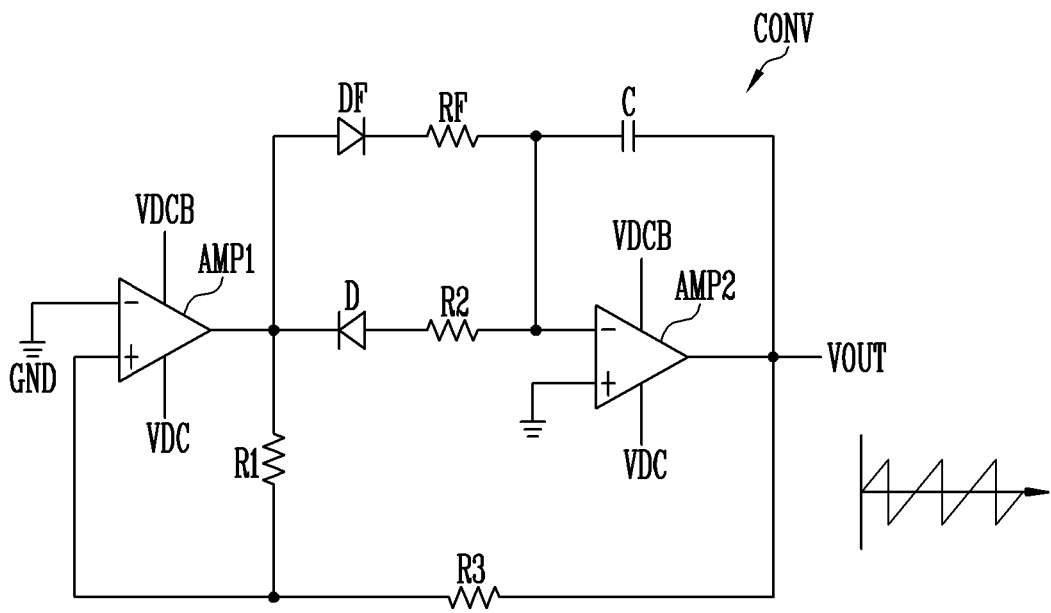

Referring to FIG. 6D, the oscillator CONV may further include a feedback resistor RF, a diode D, and a feedback diode DF, compared to the oscillator CONV of FIG. 6C.

The second resistor R2 and the diode D may be electrically connected in series between the output terminal of the first amplifier AMP1 and the inverting terminal of the second amplifier AMP2. The feedback resistor RF and the feedback diode DF may be electrically connected in series between the output terminal of the first amplifier AMP1 and the inverting terminal of the second amplifier AMP2. The feedback diode DF may be electrically connected in a direction opposite to that of the diode D between the output terminal of the first amplifier AMP1 and the inverting terminal of the second amplifier AMP2. A resistance value of the feedback resistor RF may be less than a resistance value of the second resistor R2.

As described with reference to FIG. 6C, in case that a current direction of the integrator formed of the second amplifier AMP2 is changed, a current flow path may be changed by the diode D and the feedback diode DF. As the resistance value of the feedback resistor RF is set to a value less than that of the second resistor R2, the voltage level of the output voltage VOUT may more rapidly vary when decreasing than when increasing. In other words, in the triangular wave output voltage VOUT, an increase period and a decrease period of the output voltage VOUT may be adjusted by the second resistor R2 and the feedback resistor RF, so that the oscillator CONV may generate a sawtooth wave output voltage VOUT.

As described with reference to FIGS. 6A to 6D, the oscillator CONV may be implemented in various forms and generate output voltages VOUT of various types such as a sine wave, a pulse wave (or a square wave), a triangular wave, and a sawtooth wave.

Figure 7:
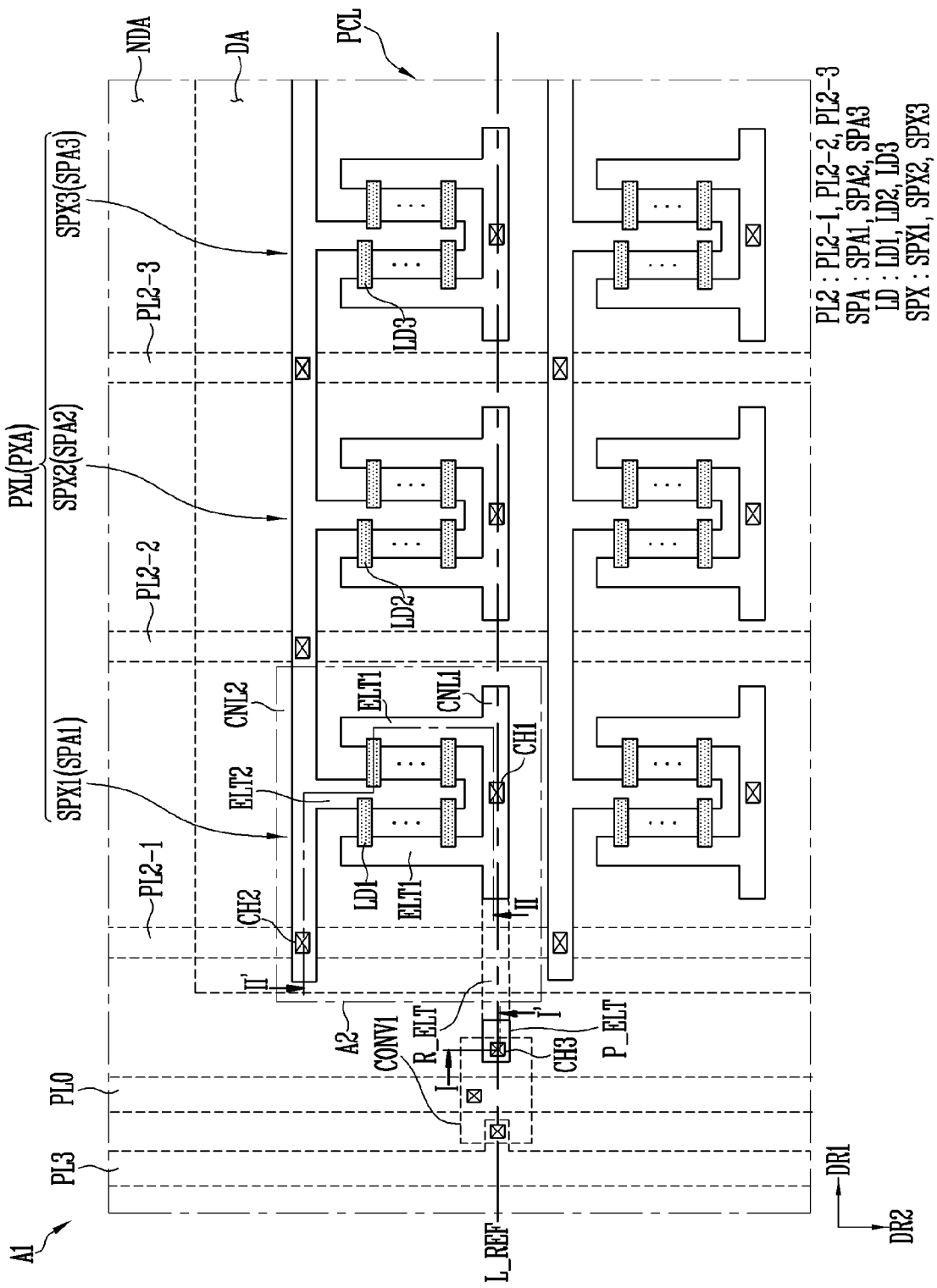
FIG. 7 is a plan view schematically illustrating an example of the display device, showing an enlargement of a first area of FIG. 4.

FIG. 7 is a plan view schematically illustrating an example of the display device, illustrating an enlargement of first area A1 of FIG. 4. FIG. 7 illustrates the structure of the pixel PXL, focusing on a display element layer (and a portion of a pixel circuit layer PCL) on which the light emitting elements LD of the pixel PXL are disposed.

The pixel circuit layer PCL may be formed on the base layer SUB1 described with reference to FIG. 4 and include a reference power line PL0, first to third power lines PL1 to PL3, first to sixth oscillators CONV1 to CONV6, and a pixel circuit PXC described with reference to FIGS. 5A to 5C. As illustrated in FIG. 7, the pixel circuit layer PCL may include a reference power line PL0, a second power line PL2, a third power line PL3, and a first oscillator CONV1. A detailed configuration of the pixel circuit layer PCL will be described below with reference to FIG. 9A.

Referring to FIG. 7, the pixel PXL may be formed in a pixel area PXA. The pixel area PXA may include sub-pixel areas SPA1, SPA2, and SPA3 corresponding to sub-pixels SPX1, SPX2, and SPX3 that constitute the pixel PXL.

The pixel area PXA may include a first sub-pixel area SPA1 in which a first sub-pixel SPX1 is formed, a second sub-pixel area SPA2 in which a second sub-pixel SPX2 is formed, and a third sub-pixel area SPA3 in which a third sub-pixel SPX3 is formed. Each of the first to third sub-pixel areas SPA1, SPA2, and SPA3 may include at least one pair of first electrode ELT1 and second electrode ELT2, and at least one light emitting element LD electrically connected between the first and second electrodes ELT1 and ELT2.

The first sub-pixel SPX1 may include a first electrode ELT1 and a second electrode ELT2 disposed at positions spaced apart from each other in the first sub-pixel area SPA1 and at least one first light emitting element LD1 electrically connected between the first and second electrodes ELT1 and ELT2. Likewise, the second sub-pixel SPX2 may include a first electrode ELT1 and a second electrode ELT2 disposed at positions spaced apart from each other in the second sub-pixel area SPA2 and at least one second light emitting element LD2 electrically connected between the first and second electrodes ELT1 and ELT2. The third sub-pixel SPX3 may include a first electrode ELT1 and a second electrode ELT2 disposed at positions spaced apart from each other in the third sub-pixel area SPA3 and at least one third light emitting element LD3 electrically connected between the first and second electrodes ELT1 and ELT2.

In an embodiment, the first, second, and third light emitting elements LD1, LD2, and LD3 may emit light having the same color or different colors. For example, each first light emitting element LD1 may be a red light emitting diode configured to emit red light. Each second light emitting element LD2 may be a green light emitting diode configured to emit green light. Each third light emitting element LD3 may be a blue light emitting diode configured to emit blue light.

As another example, all of the first, second, and third light emitting elements LD1, LD2, and LD3 may be blue light emitting diodes configured to emit blue light. In this case, in order to form a full-color pixel PXL, a light conversion layer and/or a color filter for converting the color of light emitted from a corresponding sub-pixel SPX may be disposed on at least some of the first to third sub-pixels SPX1, SPX2, and SPX3.

The structures of the first, second, and third sub-pixels SPX1, SPX2, and SPX3 may be substantially identical or similar to each other. For the convenience sake, hereinafter, any one of the first, second, and third sub-pixels SPX1, SPX2, and SPX3 will be collectively referred to as a sub-pixel SPX, an area in which the sub-pixel SPX is formed will be collectively referred to as a sub-pixel area SPA, at least one first, second, or third light emitting element LD1, LD2, or LD3 disposed in the sub-pixel area SPA will be collectively referred to as a light emitting element LD, and the structure of the sub-pixel SPX will be described in detail.

In an embodiment, the first electrode ELT1 and the second electrode ELT2 may be disposed at positions spaced apart from each other in each sub-pixel area SPA such that at least portions thereof face each other. For example, the first and second electrodes ELT1 and ELT2 may be spaced apart from each other by a predetermined distance in the first direction DR1 and each may extend in the second direction DR2 intersecting the first direction DR1. However, the disclosure is not limited thereto. For example, the shapes and/or mutual arrangement relationship of the first and second electrodes ELT1 and ELT2 may be changed in various ways.

The first electrode ELT1 may be electrically connected to a first connection electrode CNL1 (or a first connection line) extending in the first direction DR1. The first connection electrode CNL1 may be electrically connected, through a first contact hole CH1, to the pixel circuit PXC (or the first transistor T1) described with reference to FIGS. 5A to 5C.

The second electrode ELT2 may be electrically connected to a second connection electrode CNL2 (or a second connection line) extending in the first direction DR1. The second connection electrode CNL2 may extend to an adjacent sub-pixel (e.g., the second and third sub-pixels SPX2 and SPX3 or the second and third sub-pixel areas SPA2 and SPA3). The second connection electrode CNL2 may be electrically connected through a second contact hole CH2 to the second power line PL2 (or first to third sub-power lines PL2-1, PL2-2, and PL2-3 included in the second power line PL2).

As described with reference to FIG. 4, the reference power line PL0, the third power line PL3, and the first oscillator CONV1 may be disposed in the non-display area NDA. The first oscillator CONV1 may be electrically connected to the reference power line PL0 and the third power line PL3. The first oscillator CONV1 may be electrically connected to the first electrode ELT1 of the first sub-pixel SPX1 and may be electrically disconnected or separated from the other sub-pixels (e.g., the second and third sub-pixels SPX2 and SPX3).

In an embodiment, the display panel PNL may further include an electrode pattern P_ELT.

The electrode pattern P_ELT may be disposed to overlap the first oscillator CONV1 in the non-display area NDA and may be electrically connected with the first oscillator CONV1 (e.g., the third capacitor C3) through a third contact hole CH3 passing through a passivation layer PSV of the pixel circuit layer PCL. The electrode pattern P_ELT may be disposed on a line (e.g., on a reference line L_REF) identical to that of the first connection electrode CNL1 (or the first electrode ELT1) and may be electrically connected with the first connection electrode CNL1 (or the first electrode ELT1) through a connection pattern R_ELT.

The electrode pattern P_ELT and the connection pattern R_ELT may be formed by a process identical to that of the first connection electrode CNL1 (or the first electrode ELT1) and have a cross-sectional structure (or a stacked structure) identical to that of the first electrode ELT1.

Although FIG. 7 illustrates that in the display device (or the display panel PNL), the first oscillator CONV1 is electrically connected to the first electrode ELT1 of the first sub-pixel SPX1 through the electrode pattern P_ELT and the connection pattern R_ELT, the disclosure is not limited thereto. For example, the electrode pattern P_ELT and the connection pattern R_ELT may be removed, and the first oscillator CONV1 may be electrically disconnected or separated from the first sub-pixel SPX1. This will be described below with reference to FIGS. 11 and 13.

Figure 8:
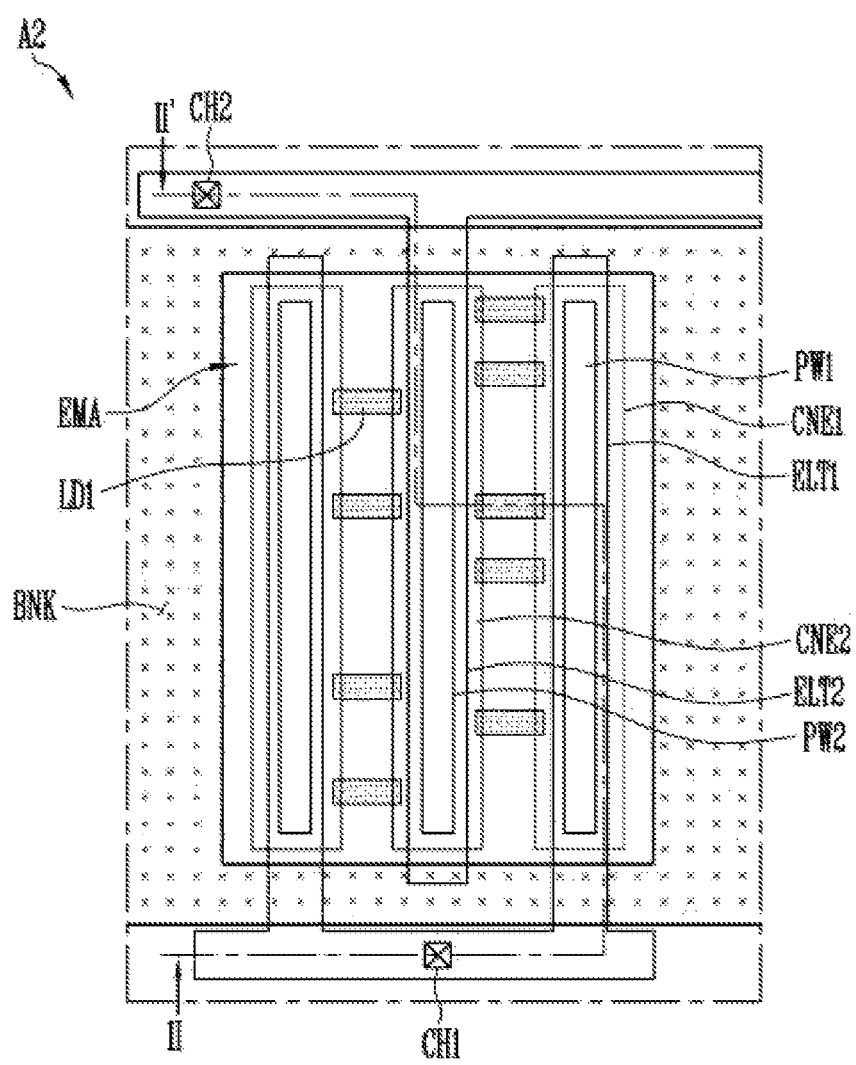
FIG. 8 is a plan view schematically illustrating an example of the sub-pixel, showing an enlargement of a second area of FIG. 7.

FIG. 8 is a plan view schematically illustrating an example of a sub-pixel, showing an enlargement of the second area A2 of FIG. 7.

Referring to FIG. 8, the sub-pixel area SPA may include at least one pair of first electrode ELT1 and second electrode ELT2, and an emission area EMA in which at least one light emitting element LD electrically connected between the first and second electrodes ELT1 and ELT2 is disposed. In an embodiment, the emission area EMA may be defined by a bank BNK that encloses the emission area EMA.

In an embodiment, each of the first and second electrodes ELT1 and ELT2 may have a single-layer or multi-layer structure. For example, the first electrode ELT1 may have a multi-layer structure including a first reflective electrode and a first conductive capping layer. The second electrode may have a multi-layer structure including a second reflective electrode and a second conductive capping layer.

In an embodiment, the first electrode ELT1 may be electrically connected to a first connection electrode CNL1. The first electrode ELT1 may be integrally connected to (or integral with) the first connection electrode CNL1. For example, the first electrode ELT1 may be formed of at least one branch diverging from the first connection electrode CNL1. In case that the first electrode ELT1 and the first connection electrode CNL1 are integral with each other, the first connection electrode CNL1 may be regarded as an area of the first electrode ELT1. However, the disclosure is not limited thereto. For example, in an embodiment, the first electrode ELT1 and the first connection electrode CNL1 may be individually formed and electrically connected to each other through at least one contact hole, at least one via hole, or the like, which is not illustrated.

In an embodiment, the first connection electrode CNL1 may have a single-layer or multi-layer structure. For example, the first connection electrode CNL1 may include a first sub-connection electrode integrally and electrically connected with the first reflective electrode, and a second sub-connection electrode integrally and electrically connected with the first conductive capping layer. In an embodiment, the first connection electrode CNL1 and the first electrode ELT1 may have the same cross-sectional structure (or stacked structure), but the disclosure is not limited thereto.

The first electrode ELT1 and the first connection electrode CNL1 may be electrically connected, through the first contact hole CH1, to the pixel circuit PXC of the sub-pixel SPX, e.g., the pixel circuit PXC illustrated in one of FIGS. 5A to 5C.

In an embodiment, the first contact hole CH1 may be disposed outside the emission area EMA of the sub-pixel SPX. For example, the first contact hole CH1 may be disposed around the corresponding emission area EMA such that the first contact hole CH1 overlaps the bank BNK. In this case, the first contact hole CH1 is covered by (or overlapped by) the bank BNK, so that a pattern may be prevented from being reflected in the emission area EMA. However, the disclosure is not limited thereto. For example, in an embodiment, at least one first contact hole CH1 may be disposed in the emission area EMA.

In an embodiment, the pixel circuit PXC may be disposed under the light emitting elements LD disposed in the corresponding sub-pixel area SPA. For example, each pixel circuit PXC may be formed in a pixel circuit layer (or a circuit element layer including a circuit element such as a transistor) under the light emitting elements LD and be electrically connected to the first electrode ELT1 through the first contact hole CH1.

In an embodiment, the second electrode ELT2 may be electrically connected to a second connection electrode CNL2. For instance, the second electrode ELT2 may be integrally and electrically connected to the second connection electrode CNL2. For example, the second electrode ELT2 may be formed of at least one branch diverging from the second connection electrode CNL2. In case that the second electrode ELT2 and the second connection electrode CNL2 are integral with each other, the second connection electrode CNL2 may be regarded as an area of the second electrode ELT2. However, the disclosure is not limited thereto. For example, in an embodiment, the second electrode ELT2 and the second connection electrode CNL2 may be individually formed and electrically connected to each other through at least one contact hole, at least one via hole, or the like, which is not illustrated.

In an embodiment, the first connection electrode CNL1 may have a single-layer or multi-layer structure in a manner similar to that of the first connection electrode CNL1.

In an embodiment, the second electrode ELT2 and the second connection electrode CNL2 may be electrically connected to the second power supply VSS (refer to FIG. 4). For example, the second electrode ELT2 and the second connection electrode CNL2 may be electrically connected to the second power supply VSS through the second contact hole CH2 and the second power line PL2 (refer to FIG. 7) electrically connected thereto.

In an embodiment, the second contact hole CH2 may be disposed outside the emission area EMA of the sub-pixel SPX. For example, the second contact hole CH2 may be disposed around the corresponding emission area EMA such that the second contact hole CH2 overlaps the bank BNK. In this case, the second contact hole CH2 may be covered with the bank BNK, so that a pattern may be prevented from being reflected in the emission area EMA. However, the disclosure is not limited thereto. For example, in an embodiment, at least one second contact hole CH2 may be disposed in the emission area EMA.

In an embodiment, an area of the second power line PL2 for supplying the second power supply VSS may be disposed in the pixel circuit layer PCL under the light emitting elements LD. For example, the second power line PL2 is disposed in the pixel circuit layer PCL under the light emitting elements LD and electrically connected to the second electrode ELT2 through the second contact hole CH2. However, the disclosure is not limited thereto, and the position of the second power line PL2 may be changed in various ways.

A first partition wall (or first bank) PW1 may be disposed under the first electrode ELT1 and overlap an area of the first electrode ELT1. A second partition wall (or second bank) PW2 may be disposed under the second electrode ELT2 and overlap an area of the second electrode ELT2. The first and second partition walls PW1 and PW2 may be disposed in the emission area EMA at positions spaced apart from each other and make areas of the first and second electrode ELT1 and ELT2 protrude upward. For example, the first electrode ELT1 may be disposed on the first partition wall PW1 and protrude in a height direction (or a thickness direction) of the base layer SUB1 by the first partition wall PW1. The second electrode ELT2 may be disposed on the second partition wall PW2 and protrude in the height direction of the base layer SUB1 by the second partition wall PW2.

In an embodiment, at least one light emitting element LD, e.g., light emitting elements LD, may be arranged between the first and second electrodes ELT1 and ELT2 of the sub-pixel SPX. For example, light emitting elements LD may be electrically connected in parallel to each other in the emission area EMA in which the first electrode ELT1 and the second electrode ELT2 are disposed to face each other.

Although FIG. 8 illustrates that the light emitting elements LD are arranged between the first and second electrodes ELT1 and ELT2 in the first direction DR1, e.g., in a horizontal direction, the arrangement direction of the light emitting elements LD is not limited thereto. For example, at least one of the light emitting elements LD may be oriented in a diagonal direction.

Each of the light emitting elements LD are electrically connected between the first and second electrodes ELT1 and ELT2 of the sub-pixel SPX. For example, respective first ends EP1 of the light emitting elements LD may be electrically connected to the first electrode ELT1. Respective second ends EP2 of the light emitting elements LD may be electrically connected to the second electrode ELT2.

In an embodiment, the first end EP1 of each of the light emitting elements LD may be electrically connected to the corresponding first electrode ELT1 through at least one contact electrode, e.g., a first contact electrode CNE1, rather than being directly disposed on the first electrode ELT1. However, the disclosure is not limited thereto. For example, in an embodiment, the first ends EP1 of the light emitting elements LD may directly contact the first electrode ELT1 to be electrically connected to the first electrode ELT1.

Likewise, the second end EP2 of each of the light emitting elements LD may be electrically connected to the corresponding second electrode ELT2 through at least one contact electrode, e.g., a second contact electrode CNE2, rather than being directly disposed on the second electrode ELT2. However, the disclosure is not limited thereto. For example, in an embodiment, the second end EP2 of each of the light emitting elements LD may directly contact the second electrode ELT2 to be electrically connected to the second electrode ELT2.

In an embodiment, each of the light emitting elements LD may be a light emitting diode which is made of a material having an inorganic crystal structure and has a subminiature size, e.g., a small size to a degree of the nanometer scale to micrometer scale. For example, each of the light emitting elements LD may be a subminiature rod-like light emitting diode having a size ranging from the nanometer scale to micrometer scale, as illustrated in one of FIGS. 1A to 3B. However, the type of light emitting elements LD which may be applied to the disclosure is not limited thereto. For example, the light emitting element LD may be formed by a growth method and be a light emitting diode having a core-shell structure having a size corresponding to, e.g., the nanometer scale to micrometer scale.

In an embodiment, the light emitting elements LD may be prepared in a diffused form in a solution and then be supplied to the emission area EMA of each sub-pixel SPX by an inkjet printing method or a slit coating method. For example, the light emitting elements LD may be mixed with a volatile solvent and be supplied to the emission area EMA. If predetermined voltages are supplied to the first and second electrodes ELT1 and ELT2 of the sub-pixel SPX, an electric field is formed between the first and second electrodes ELT1 and ELT2, whereby the light emitting elements LD are self-aligned between the first and second electrodes ELT1 and ELT2. After the light emitting elements LD have been aligned, the solvent may be removed by a volatilization method or other methods. In this way, the light emitting elements LD may be reliably arranged between the first and second electrodes ELT1 and ELT2. Furthermore, since the first contact electrode CNE1 and the second contact electrode CNE2 are formed on the first ends EP1 and the second ends EP2 of the light emitting elements LD, the light emitting elements LD may be reliably and electrically connected between the first and second electrodes ELT1 and ELT2.

In an embodiment, the first contact electrode CNE1 may be formed on the first ends EP1 of the light emitting elements LD and at least one area of the first electrode ELT1 corresponding to the first end EP1, whereby the first ends EP1 of the light emitting elements LD may be physically and/or electrically connected to the first electrode ELT1. Likewise, the second contact electrode CNE2 may be formed on the second ends EP2 of the light emitting elements LD and at least one area of the second electrode ELT2 corresponding to the second end EP2, whereby the second ends EP2 of the light emitting elements LD may be physically and/or electrically connected to the second electrode ELT2.

The light emitting elements LD disposed in the sub-pixel area SPA may gather, thus forming a light source of the corresponding sub-pixel SPX. For example, if driving current flows through at least one sub-pixel SPX during each frame period, the light emitting elements LD that are electrically connected in the forward direction between the first and second electrodes ELT1 and ELT2 of the sub-pixel SPX may emit light having a luminance corresponding to the driving current.

In an embodiment, the emission area EMA may be enclosed by the bank BNK. For example, the bank BNK may be disposed between the corresponding sub-pixel SPX and other sub-pixels to enclose the emission area EMA of the sub-pixel SPX.

FIGS. 9A to 9D are cross-sectional views schematically illustrating examples of the sub-pixel, taken along line I-I' of FIG. 7 and line II-II' of FIG. 8. FIGS. 9A to 9D each illustrate a sub-pixel area SPA (e.g., the first sub-pixel area SPA1) included in the display panel PNL. In an embodiment, the cross-sectional structures of the first, second, and third sub-pixels SPX1, SPX2, and SPX3 described above may be substantially identical or similar to each other. Therefore, for the convenience sake, the structure of each sub-pixel SPX will be collectively described with reference to FIGS. 9A to 9D illustrating the cross-section of the first sub-pixel area SPA1 corresponding to line of FIG. 8.

Figure 9A:
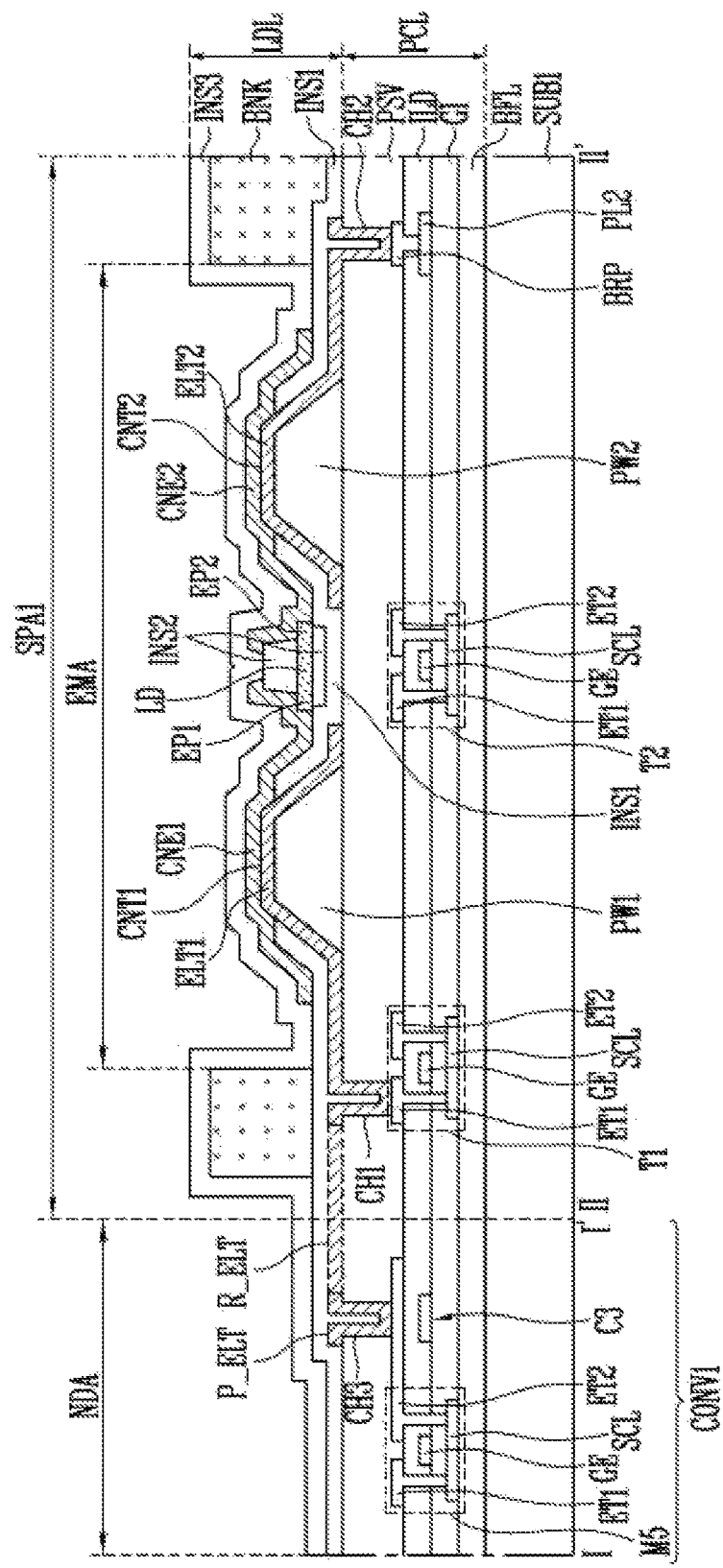
FIGS. 9A to 9D are cross-sectional views schematically illustrating examples of the sub-pixel, taken along line I-I' of FIG. 7 and line II-IF of FIG. 8.

Referring to FIG. 9A, the pixel circuit layer PCL and a display element layer LDL may be successively disposed in each sub-pixel area SPA on the base layer SUB1. In an embodiment, the pixel circuit layer PCL and the display element layer LDL may be formed in the entirety of the display area DA of the display panel PNL. For example, the pixel circuit layer PCL may be formed on a surface of the base layer SUB1, and the display element layer LDL may be formed over the surface of the base layer SUB1 on which the pixel circuit layer PCL is formed.

In an embodiment, the pixel circuit layer PCL may include the first oscillator CONV1 and circuit elements which constitute the pixel circuit PXC of the sub-pixel SPX. The display element layer LDL may include light emitting elements LD of the sub-pixel SPX.

In an embodiment, the pixel circuit layer PCL may include circuit elements disposed in the non-display area NDA. For example, the pixel circuit layer PCL may include circuit elements which are formed in the non-display area NDA and form the first oscillator CONV1. For example, the pixel circuit layer PCL may include a switching element and a capacitor which are disposed in the non-display area NDA, e.g., the fifth switching element M5 and the third capacitor C3 which are described with reference to FIG. 6A. Although not illustrated in FIG. 9A, the pixel circuit layer PCL may include the third power line PL3 (refer to FIG. 7) that is electrically connected to the first oscillator CONV1 and configured to transmit a DC voltage VDC, and the reference power line PL0 (refer to FIG. 7) configured to transmit the reference voltage GND.

In an embodiment, the pixel circuit layer PCL may include circuit elements disposed in the display area DA. For example, the pixel circuit layer PCL may include circuit elements which are formed in the sub-pixel area SPA to form the pixel circuit PXC of the corresponding sub-pixel SPX. For example, the pixel circuit layer PCL may include transistors disposed in the sub-pixel area SPA, e.g., the first and second transistors T1 and T2 described with reference to FIGS. 5A and 5B. Although not illustrated in FIG. 9A, the pixel circuit layer PCL may include a storage capacitor Cst disposed in the sub-pixel area SPA, various signal lines (e.g., the scan line Si and the data line Dj described with reference to FIGS. 5A and 5B) electrically connected to the pixel circuit PXC, and various power lines (e.g., the first power line PL1 (not illustrated) and the second power line PL2 configured to respectively transmit the first power voltage VDD and the second power voltage VSS) electrically connected to the pixel circuit PXC and/or the light emitting elements LD.

In an embodiment, transistors, e.g., first and second transistors T1 and T2, provided in the pixel circuit PXC may have substantially an identical or similar cross-sectional structure. However, the disclosure is not limited thereto. In an embodiment, at least some of the transistors may have different types and/or structures.

The pixel circuit layer PCL may include insulating layers. For example, the pixel circuit layer PCL may include a buffer layer BFL, a gate insulating layer GI, an interlayer insulating layer ILD, and a passivation layer PSV which are successively stacked on a surface of the base layer SUB1.

In an embodiment, the buffer layer BFL may prevent impurities from diffusing into the circuit elements. The buffer layer BFL may be formed of a single layer, or may be formed of multiple layers having two or more layers. In case that the buffer layer BFL has a multi-layer structure, the respective layers may be formed of the same material or different materials. In an embodiment, the buffer layer BFL may be omitted.

In an embodiment, the fifth switching element M5 and the first and second transistors T1 and T2 each may include a semiconductor layer SCL, a gate electrode GE, a first transistor electrode ET1, and a second transistor electrode ET2. In an embodiment, although FIG. 9A illustrates that the fifth switching element M5 and the first and second transistors T1 and T2 each include the first transistor electrode ET1 and the second transistor electrode ET2 that are formed separately from the semiconductor layer SCL, the disclosure is not limited thereto. For example, in an embodiment, the first and/or second transistor electrode ET1 and ET2 provided in at least one transistor disposed in each sub-pixel area SPA may be integral with the corresponding semiconductor layer SCL.

The semiconductor layer SCL may be disposed on the buffer layer BFL. For example, the semiconductor layer SCL may be disposed between the gate insulating layer GI and the base layer SUB1 on which the buffer layer BFL is formed. The semiconductor layer SCL may include a first area contacting a first transistor electrode ET1, a second area contacting a second transistor electrode ET2, and a channel area disposed between the first and second areas. In an embodiment, one of the first and second areas may be a source area, and the other may be a drain area.

In an embodiment, the semiconductor layer SCL may be a semiconductor pattern formed of polysilicon, amorphous silicon, an oxide semiconductor, etc. The channel area of the semiconductor layer SCL may be an intrinsic semiconductor, which is an undoped semiconductor pattern. Each of the first and second areas of the semiconductor layer SCL may be a semiconductor pattern doped with a predetermined impurity.

The gate electrode GE may be disposed on the semiconductor layer SCL with the gate insulating layer GI interposed therebetween. For example, the gate electrode GE may be disposed between the gate insulating layer GI and the interlayer insulating layer ILD and overlap at least one area of the semiconductor layer SCL.

The first and second transistor electrodes ET1 and ET2 may be disposed over the semiconductor layer SCL and the gate electrode GE with at least one interlayer insulating layer ILD interposed therebetween. For example, the first and second transistor electrodes ET1 and ET2 may be disposed between the interlayer insulating layer ILD and the passivation layer PSV. The first and second transistor electrodes ET1 and ET2 may be electrically connected to the semiconductor layer SCL. For example, the first and second transistor electrodes ET1 and ET2 may be respectively and electrically connected to the first area and the second area of the semiconductor layer SCL through contact holes which pass through the gate insulating layer GI and the interlayer insulating layer ILD.

In an embodiment, one of the first and second transistor electrodes ET1 and ET2 of at least one transistor (e.g., the first transistor T1 shown in FIGS. 5A and 5B) provided on the pixel circuit PXC may be electrically connected, through the first contact hole CH1 passing through the passivation layer PSV, to the first electrode ELT1 of the light source unit LSU disposed over the passivation layer PSV.

In an embodiment, at least one signal line and/or at least one power line that is electrically connected to the sub-pixel SPX may be disposed on a layer identical to that of an electrode of each of the circuit elements that form the pixel circuit PXC. For example, the second power line PL2 for supplying the second power supply VSS may be disposed on a layer identical to that of the gate electrode GE of each of the first and second transistors T1 and T2 and be electrically connected to the second electrode ELT2 of the light source unit LSU that is disposed over the passivation layer PSV, through a bridge pattern BRP disposed on a layer identical to that of the first and second transistor electrodes ET1 and ET2 and through at least one second contact hole CH2 passing through the passivation layer PSV. However, the structure and/or position of the second power line PL2 or the like may be changed in various ways. In an embodiment, one of the first and second transistor electrodes ET1 and ET2 of the transistor (e.g., the fifth switching element M5) provided in the non-display area NDA may form an electrode of the third capacitor C3 and be electrically connected to the electrode pattern P_ELT disposed over the passivation layer PSV through the third contact hole CH3 passing through the passivation layer PSV.

In an embodiment, the display element layer LDL may include first and second partition walls PW1 and PW2, first and second electrodes ELT1 and ELT2, a first insulating layer INS1, light emitting elements LD, a second insulating layer INS2, first and second contact electrodes CNE1 and CNE2, and a third insulating layer INS3, which are successively disposed and/or formed on the pixel circuit layer PCL. In an embodiment, the display element layer LDL may further include the electrode pattern P_ELT formed on the pixel circuit layer PCL in the non-display area NDA.

The first and second partition walls PW1 and PW2 may be disposed on the pixel circuit layer PCL. The first and second partition walls PW1 and PW2 may be disposed at positions spaced apart from each other in the emission area EMA. The first and second partition walls PW1 and PW2 may protrude in a height direction on the pixel circuit layer PCL. In an embodiment, the first and second partition walls PW1 and PW2 may have substantially the same height, but the disclosure is not limited thereto.

In an embodiment, the first partition wall PW1 may be disposed between the pixel circuit layer PCL and the first electrode ELT1. The first partition wall PW1 may be disposed adjacent to the first ends EP1 of the light emitting elements LD. For example, a sidewall of the first partition wall PW1 may be positioned adjacent to the first ends EP1 of the light emitting elements LD and be disposed to face the first ends EP1.

In an embodiment, the second partition wall PW2 may be disposed between the pixel circuit layer PCL and the second electrode ELT2. The second partition wall PW2 may be disposed adjacent to the second ends EP2 of the light emitting elements LD. For example, one sidewall of the second partition wall PW2 may be positioned adjacent to the second ends EP2 of the light emitting elements LD and be disposed to face the second ends EP2.

Figure 9B:
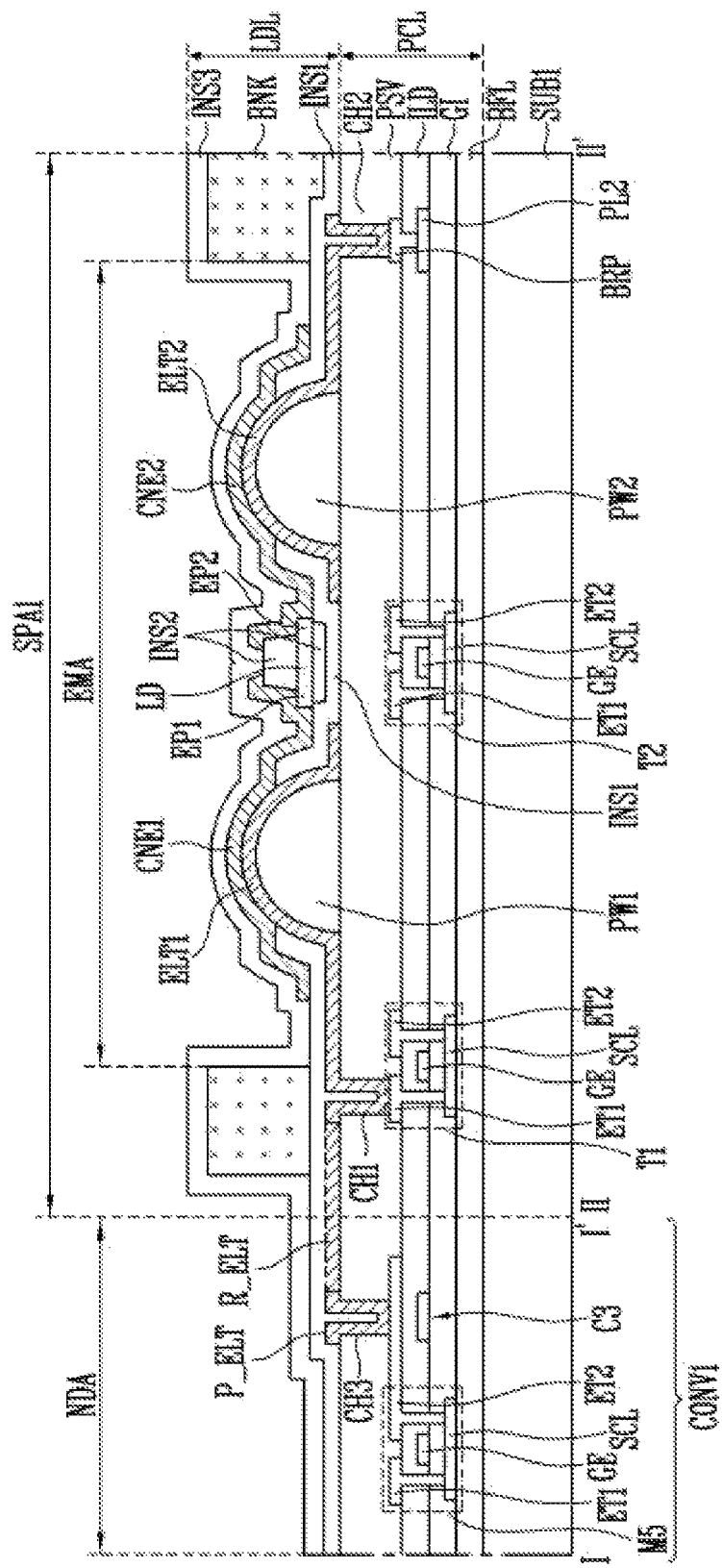
Figure 9D:
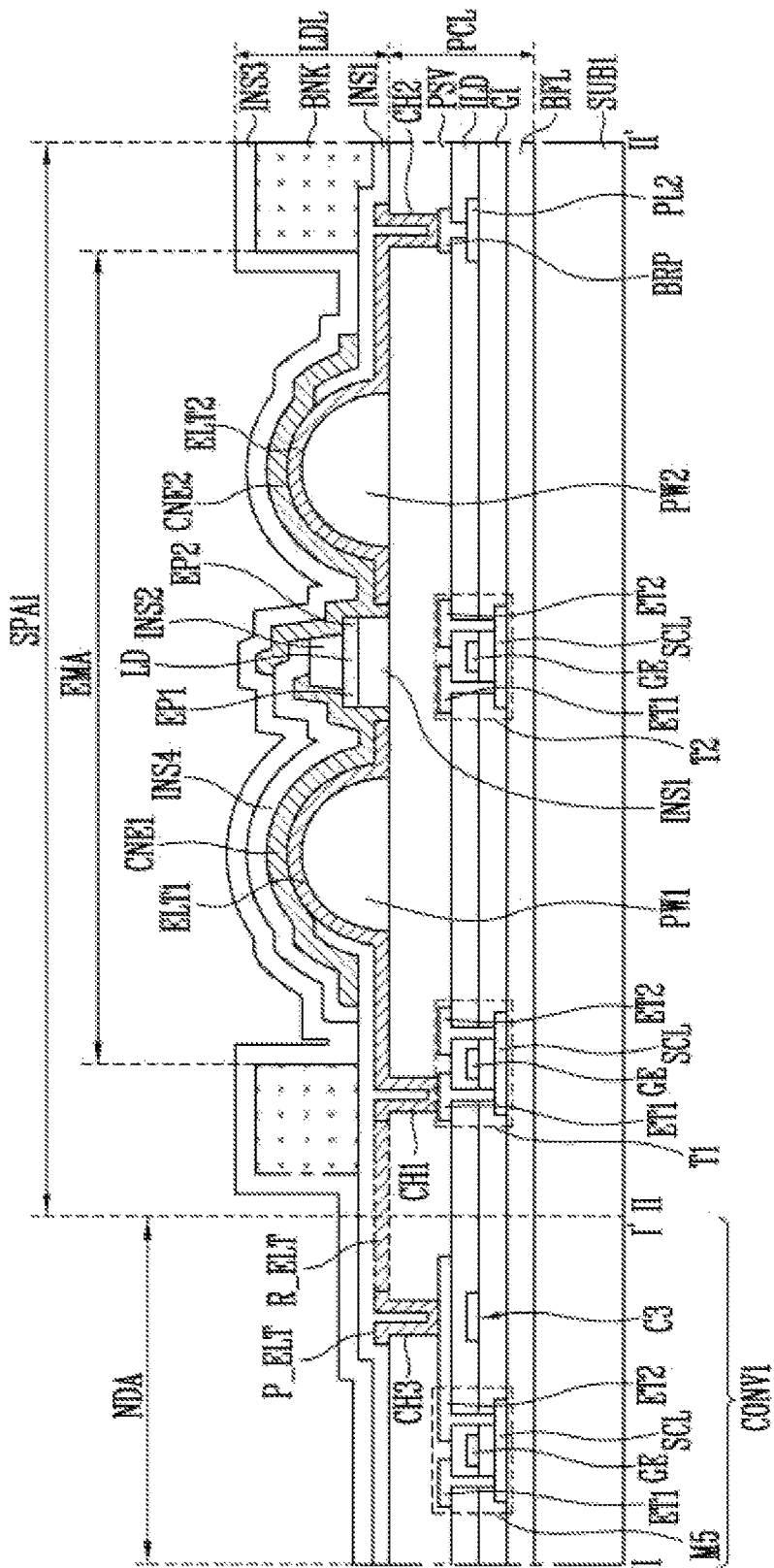
Figure 10:
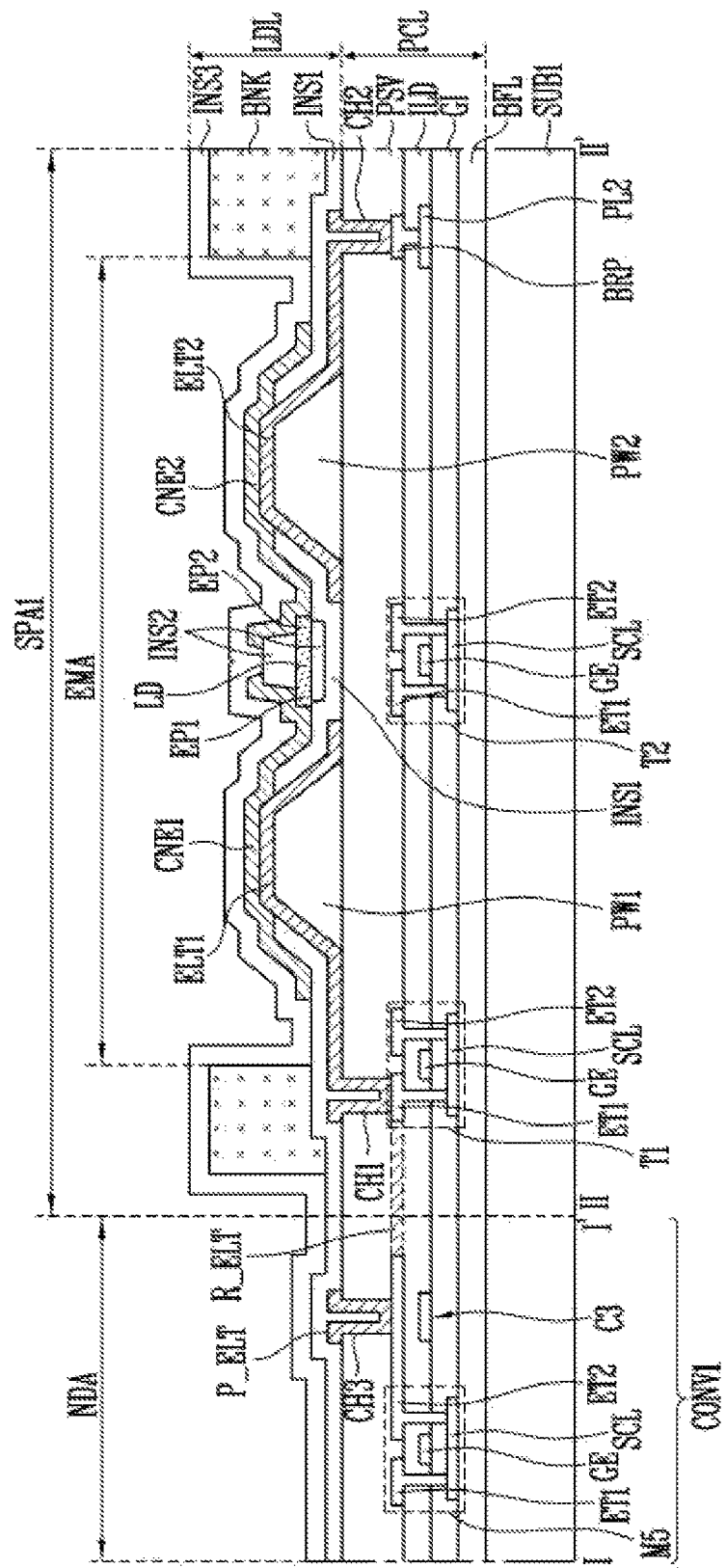
FIG. 10 is a cross-sectional view schematically illustrating another example of the sub-pixel, taken along line I-I' of FIG. 7 and line II-IF of FIG. 8.

In an embodiment, each of the first and second partition walls PW1 and PW2 may have various shapes. For example, as illustrated in FIG. 10, each of the first and second partition walls PW1 and PW2 may have a cross-sectional shape of a trapezoid, a width of which reduces from a bottom to a top thereof. In this case, each of the first and second partition walls PW1 and PW2 may have an inclined surface on at least one side thereof. As another example, as illustrated in FIGS. 9B and 9D, each of the first and second partition walls PW1 and PW2 may have a semicircular or a semielliptical cross-section, a width of which reduces from a bottom to a top thereof. In this case, each of the first and second partition walls PW1 and PW2 may have a curved surface on at least one side. In other words, the shape of each of the first and second partition walls PW1 and PW2 is not limited to a particular shape, and may be changed in various ways. In an embodiment, at least one of the first and second partition walls PW1 and PW2 may be omitted, or the position thereof may be changed.

Referring again to FIG. 9A, each of the first and second partition walls PW1 and PW2 may include an insulating material having an inorganic material and/or organic material. For example, the first and second partition walls PW1 and PW2 may include at least one inorganic layer including various inorganic insulating materials such as $SiN_x$ or $SiO_x$. As another example, the first and second partition walls PW1 and PW2 may include at least one organic layer and/or at least one photoresist layer including various organic insulating materials, or may be formed as a single or multi-layer insulator including organic/inorganic materials in combination. In other words, the materials of the first and second partition walls PW1 and PW2 may be variously changed.

In an embodiment, each of the first and second partition walls PW1 and PW21 may function as a reflective member. For example, the first and second partition walls PW1 and PW2, along with the first and second electrodes ELT1 and ELT2 provided on the first and second partition walls PW1 and PW2, may function as reflectors that guide light emitted from the light emitting elements LD in a desired direction, thereby enhancing the light efficiency of the pixel PXL.

The first and second electrodes ELT1 and ELT2 may be respectively disposed over the first and second partition walls PW1 and PW2. The first and second electrodes ELT1 and ELT2 may be disposed at positions spaced apart from each other in the emission area EMA.

In an embodiment, the first and second electrodes ELT1 and ELT2 that are respectively disposed over the first and second partition walls PW1 and PW2 may have shapes corresponding to the respective shapes of the first and second partition walls PW1 and PW2. For example, the first and second electrodes ELT1 and ELT2 may have inclined surfaces or curved surfaces corresponding to the first and second partition walls PW1 and PW2, respectively, and protrude in a height direction (or a thickness direction) of the pixel circuit layer PCL.

Each of the first and second electrodes ELT1 and ELT21 may include at least one conductive material. For example, each of the first and second electrodes ELT1 and ELT2 may include at least one of metal such as Ag, Mg, Al, Pt, Pd, Au, Ni, Nd, Ir, Cr, Ti or an alloy thereof, conductive oxide such as ITO, IZO, ZnO, or ITZO, and a conductive polymer such as poly(3,4-ethylenedioxythiophene) (PEDOT), but the disclosure is not limited thereto.

Each of the first and second electrodes ELT1 and ELT2 may have a single-layer or multi-layer structure. For example, each of the first and second electrodes ELT1 and ELT2 may include at least one reflective electrode layer. Each of the first and second electrodes ELT1 and ELT2 may selectively further include at least one of at least one transparent electrode layer disposed on an upper portion and/or a lower portion of the reflective electrode layer, and at least one conductive capping layer covering an upper portion of the reflective electrode layer and/or the transparent electrode layer.

In an embodiment, the reflective electrode layer of each of the first and second electrodes ELT1 and ELT2 may be formed of a conductive material having a uniform reflectivity. For example, the reflective electrode layer may include at least one of metals such as Ag, Mg, Al, Pt, Pd, Au, Ni, Nd, Ir, Cr, and an alloy thereof, but the disclosure is not limited thereto. In other words, reflective electrode layer may be formed of various reflective conductive materials. Each of the first and second electrodes ELT1 and ELT2 that includes the reflective electrode layer may enable light emitted from the opposite ends of each of the light emitting elements LD, for example, the first and second ends EP1 and EP2, to further travel in a direction (e.g., in a frontal direction) in which an image is displayed. If the first and second electrodes ELT1 and ELT2 respectively have inclined or curved surfaces corresponding to the shapes of the first and second partition walls PW1 and PW2 and are respectively disposed to face the first and second ends EP1 and EP2 of the light emitting elements LD, light emitted from the first and second ends EP1 and EP2 of each light emitting element LD may be reflected by the first and second electrodes ELT1 and ELT2 and thus more reliably travel in the frontal direction of the display panel PNL (e.g., in an upward direction of the base layer SUB1). Therefore, the efficiency of light emitted from the light emitting elements LD may be enhanced.

Furthermore, the transparent electrode layer of each of the first and second electrodes ELT1 and ELT2 may be formed of various transparent electrode materials. For example, the transparent electrode layer may include ITO, IZO or ITZO, but the disclosure is not limited thereto. In an embodiment, each of the first and second electrodes ELT1 and ELT2 may have a triple-layer structure having a stacked structure of ITO/Ag/ITO. As described above, if the first and second electrodes ELT1 and ELT2 each have a multi-layer structure including at least two or more layers, voltage drop due to signal delay (RC delay) may be minimized. Therefore, a desired voltage can be effectively transmitted to the light emitting elements LD.

If each of the first and second electrodes ELT1 and ELT2 includes the conductive capping layer covering the reflective electrode layer and/or the transparent electrode layer, it is possible to prevent the reflective electrode layer of the first and second electrodes ELT1 and ELT2 from being damaged because of defects occurring during a manufacturing process of the pixel PXL. However, the conductive capping layer may be selectively included in the first and second electrodes ELT1 and ELT2 and may be omitted according to an embodiment. Furthermore, the conductive capping layer may be considered as a component of each of the first and second electrodes ELT1 and ELT2, or considered as a separate component disposed on the first and second electrodes ELT1 and ELT2.

The first insulating layer INS1 may be disposed in an area of each of the first and second electrode ELT1 and ELT2. For example, the first insulating layer INS1 may be formed to cover (or overlap) predetermined areas of the first and second electrodes ELT1 and ELT2 and may include an opening to expose other predetermined areas of the first and second electrodes ELT1 and ELT2.

In an embodiment, the first insulating layer INS1 may be primarily formed to cover (or overlap) the overall surfaces of the first and second electrodes ELT1 and ELT2. After the light emitting elements LD are supplied and aligned on the first insulating layer INS1, the first insulating layer INS1 may be partially open to expose the first and second electrodes ELT1 and ELT2 in the first and second contactors CNT1 and CNT2, as illustrated in FIG. 9A. As another example, the first insulating layer INS1 may be patterned in the form of an individual pattern which is sectionally disposed under the light emitting elements LD after the supply and alignment of the light emitting elements LD have been completed.

In other words, the first insulating layer INS1 may be interposed between the first and second electrodes ELT1 and ELT2 and the light emitting elements LD and may expose at least one area of each of the first and second electrodes ELT1 and ELT2. After the first and second electrodes ELT1 and ELT2 are formed, the first insulating layer INS1 may be formed to cover the first and second electrodes ELT1 and ELT2, so that it is possible to prevent the first and second electrodes ELT1 and ELT2 from being damaged or to prevent metal from being precipitated in a subsequent process. Furthermore, the first insulating layer INS1 may stably support the light emitting elements LD. In an embodiment, the first insulating layer INS1 may be omitted.

The light emitting elements LD may be supplied onto and aligned in the emission area EMA in which the first insulating layer INS1 is formed. For example, light emitting elements LD may be supplied to the emission area EMA by an inkjet method or the like, and the light emitting elements LD may be aligned between the first and second electrodes ELT1 and ELT2 by predetermined alignment voltages (or alignment signals) applied to the first and second electrodes ELT1 and ELT2. As described below, for alignment of the light emitting elements LD, a reference voltage (e.g., the ground voltage) is applied to the second electrode ELT2, and a DC voltage VDC may be applied to the third power line PL3. In this case, the first oscillator CONV1 may convert the DC voltage VDC, provided from the third power line PL3, to an AC voltage (for example, an alignment voltage) and provide the AC voltage to the first electrode ELT1 (refer to FIG. 8). An electric field may be formed between the first and second electrodes ELT1 and ELT2, so that the light emitting elements LD may be self-aligned between the first and second electrodes ELT1 and ELT2 in the emission area EMA.

The bank BNK may be disposed on the first insulating layer INS1. For example, the bank BNK may be formed between other sub-pixels to enclose the emission area EMA of the sub-pixel SPX, so that a pixel defining layer for defining the emission area EMA of the sub-pixel SPX may be formed.

In an embodiment, the bank BNK may be formed to have a second height greater than a first height of the first and second partition walls PW1 and PW2. In this case, in an operation of supplying the light emitting elements LD to each emission area EMA, the bank BNK may function as a dam structure configured to prevent a solution mixed with the light emitting elements LD from being introduced into the emission area EMA of an adjacent sub-pixel SPX or control the amount of solution such that a constant amount of solution is supplied to each emission area EMA.

The bank BNK may be formed to prevent light emitted from each emission area EMA from entering an adjacent emission area EMA and causing optical interference. To this end, the bank BNK may be formed to prevent light emitted from the light emitting elements LD of each sub-pixel SPX from passing through the bank BNK.

The second insulating layer INS2 may be disposed over the light emitting elements LD aligned between the first and second electrodes ELT1 and ELT2 and may expose the first and second ends EP1 and EP2 of the light emitting elements LD. For example, the second insulating layer INS2 may be partially disposed only over predetermined areas of the light emitting elements LD without covering the first and second ends EP1 and EP2 of the light emitting elements LD. The second insulating layer INS2 may be formed in an independent pattern in each emission area EMA, but the disclosure is not limited thereto. Furthermore, as illustrated in FIG. 9A, if space is present between the first insulating layer INS1 and the light emitting elements LD before the second insulating layer INS2 is formed, the space may be filled with the second insulating layer INS2. Therefore, the light emitting elements LD may be more stably supported.

The first and second contact electrodes CNE1 and CNE2 may be disposed on the first and second electrodes ELT1 and ELT2 and the first and second ends EP1 and EP2 of the light emitting elements LD. In an embodiment, the first and second contact electrodes CNE1 and CNE2 may be disposed on a same layer, as illustrated in FIG. 9A. In this case, although the first and second contact electrodes CNE1 and CNE2 are formed by a same process using a same conductive material, the disclosure is not limited thereto.

The first and second contact electrodes CNE1 and CNE2 may respectively and electrically connect the first and second ends EP1 and EP2 of the light emitting elements LD to the first and second electrodes ELT1 and ELT2.

For example, the first contact electrode CNE1 may be disposed on the first electrode ELT1 to contact the first electrode ELT1. For instance, the first contact electrode CNE1 may be disposed in an area (e.g., the first contactor CNT1) of the first electrode ELT1 that is not covered (or overlapped) by the first insulating layer INS1, so that the first contact electrode CNE1 contacts the first electrode ELT1. Furthermore, the first contact electrode CNE1 may be disposed on the first end EP1 of at least one light emitting element adjacent to the first electrode ELT1, e.g., on the respective first ends EP1 of light emitting elements LD, so that the first contact electrode CNE1 can contact the first end EP1. In other words, the first contact electrode CNE1 may be disposed to cover the first ends EP1 of the light emitting elements LD and at least one area of the corresponding first electrode ELT1. Hence, the first ends EP1 of the light emitting elements LD may be electrically connected to the first electrode ELT1.

Likewise, the second contact electrode CNE2 may be disposed on the second electrode ELT2 to contact the second electrode ELT2. For instance, the second contact electrode CNE2 may be disposed in an area (e.g., the second contactor CNT2) of the second electrode ELT2 that is not covered by the first insulating layer INS1, so that the second contact electrode CNE2 contacts the second electrode ELT2. Furthermore, the second contact electrode CNE2 may be disposed on the second end EP2 of at least one light emitting element adjacent to the second electrode ELT2, e.g., on the second ends EP2 of light emitting elements LD, so that the second contact electrode CNE2 can contact the second end EP2. In other words, the second contact electrode CNE2 may be disposed to cover the second ends EP2 of the light emitting elements LD and at least one area of the corresponding second electrode ELT2. Hence, the second ends EP2 of the light emitting elements LD may be electrically connected to the second electrode ELT2.

The third insulating layer INS3 may be formed and/or disposed on a surface of the base layer SUB1 on which the first and second partition walls PW1 and PW2, the first and second electrodes ELT1 and ELT2, the light emitting elements LD, the first and second contact electrodes CNE1 and CNE2, and the bank BNK are formed, so that the third insulating layer INS3 may cover the first and second partition walls PW1 and PW2, the first and second electrodes ELT1 and ELT2, the light emitting elements LD, the first and second contact electrodes CNE1 and CNE2, and the bank BNK. The third insulating layer INS3 may include a thin-film encapsulation layer including at least one inorganic and/or organic layer, but the disclosure is not limited thereto. In some embodiments, at least one overcoat layer, which is not illustrated, may be further disposed over the third insulating layer INS3.

In an embodiment, each of the first to third insulating layers INS1, INS2, and INS3 may have a single-layer or multi-layer structure and include at least one inorganic insulating material and/or organic insulating material. For example, each of the first to third insulating layers INS1, INS2, and INS3 may include various kinds of organic/inorganic insulating materials including SiNX, and the material of each of the first to third insulating layers INS1, INS2, and INS3 is not particularly limited. The first to third insulating layers INS1, INS2, and INS3 may include different insulating materials, or at least some of the first to third insulating layers INS1, INS2, and INS3 may include the same insulating material.

In embodiments, the first and second contact electrodes CNE1 and CNE2 may be disposed on different layers.

Figure 9C:
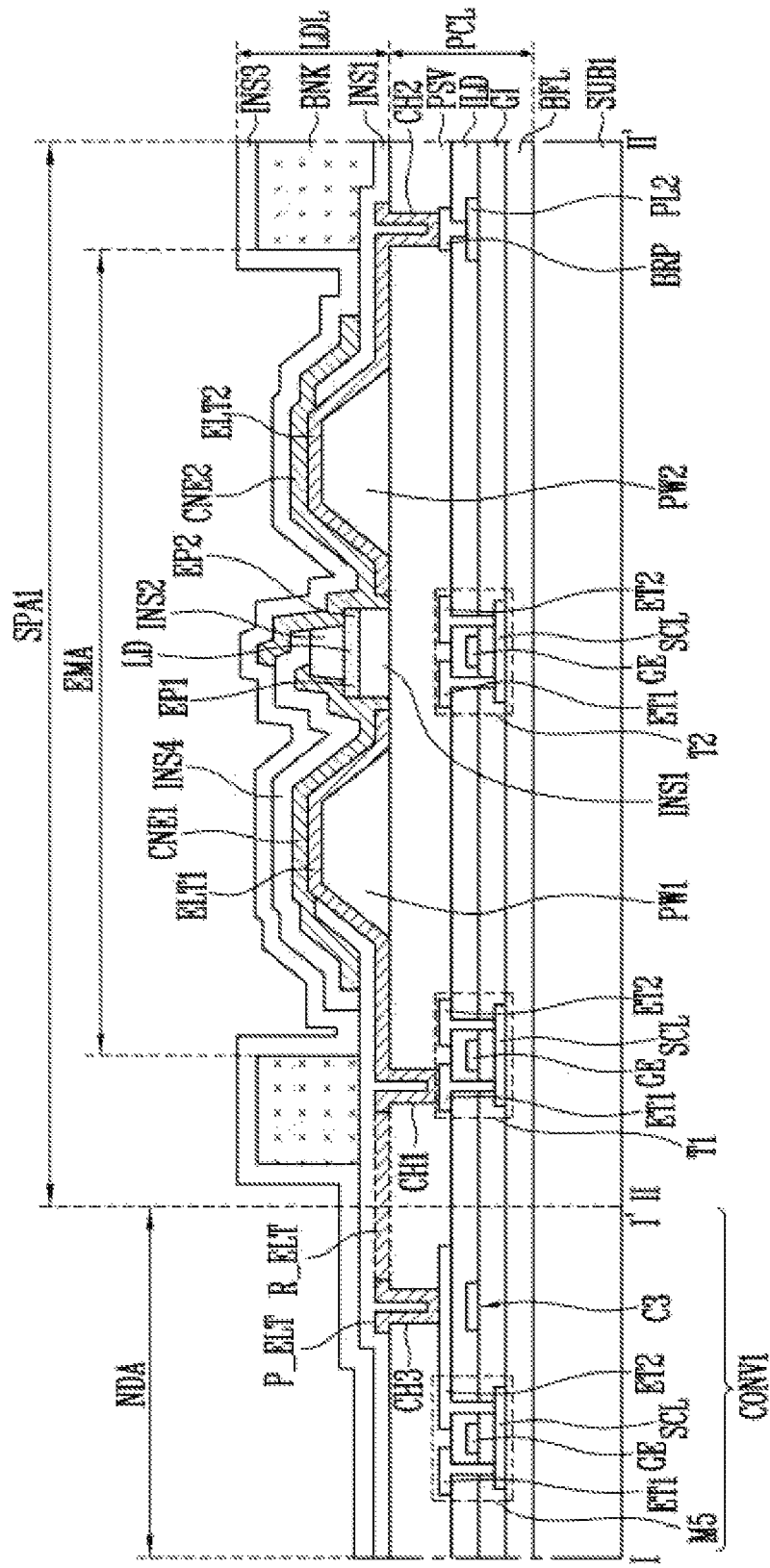

Referring to FIG. 9C, the first contact electrode CNE1 may be disposed in the sub-pixel area SPA in which the second insulating layer INS2 is disposed. In an embodiment, the first contact electrode CNE1 may be disposed on the first electrode ELT1 disposed in the corresponding sub-pixel area SPA such that the first contact electrode CNE1 contacts an area of the first electrode ELT1. Furthermore, the first contact electrode CNE1 may be disposed on the first end EP1 of at least one light emitting element LD disposed in the corresponding sub-pixel area SPA such that that the first contact electrode CNE1 contacts the first end EP1. By the first contact electrode CNE1, the first end EP1 of at least one light emitting element LD disposed in the sub-pixel area SPA may be electrically connected to the first electrode ELT1 disposed in the corresponding sub-pixel area SPA.

A fourth insulating layer INS4 may be disposed in the sub-pixel area SPA in which the first contact electrode CNE1 is disposed. In an embodiment, the fourth insulating layer INS4 may cover the second insulating layer INS2 and the first contact electrode CNE1 that are disposed in the corresponding sub-pixel area SPA.

In an embodiment, the fourth insulating layer INS4 may have a single-layer or multi-layer structure and include at least one inorganic insulating material and/or organic insulating material, in a manner similar to that of the first to third insulating layers INS1, INS2, and INS3. For example, the fourth insulating layer INS4 may include various kinds of organic/inorganic insulating materials as well as SiNX. Furthermore, the fourth insulating layer INS4 may include an insulating material different from that of the first to third insulating layers INS1, INS2, and INS3, or may include an insulating material identical to that of at least some of the first to third insulating layers INS1, INS2, and INS3.

The second contact electrode CNE2 may be disposed in each sub-pixel area SPA in which the fourth insulating layer INS4 is disposed. In an embodiment, the second contact electrode CNE2 may be disposed on the second electrode ELT2 disposed in the corresponding sub-pixel area SPA such that the second contact electrode CNE2 contacts an area of the second electrode ELT2. Furthermore, the second contact electrode CNE2 may be disposed on the second end EP2 of at least one light emitting element LD disposed in the corresponding sub-pixel area SPA such that that the second contact electrode CNE2 contacts the second end EP2. By the second contact electrode CNE2, the second end EP2 of at least one light emitting element LD disposed in each sub-pixel area SPA may be electrically connected to the second electrode ELT2 disposed in the corresponding sub-pixel area SPA.

In an embodiment, each of the first and second partition walls PW1 and PW2 may have various shapes. For example, as illustrated in FIGS. 9A and 9C, each of the first and second partition walls PW1 and PW2 may have a cross-sectional shape of a trapezoid, a width of which reduces from a bottom to a top thereof. As another example, as illustrated in FIGS. 9B and 9D, each of the first and second partition walls PW1 and PW2 may have a semicircular or a semielliptical cross-section, a width of which reduces from a bottom to a top thereof.

As described with reference to FIGS. 10 to 13, the display panel PNL (or the display device) may uniformly supply an AC voltage for alignment of the light emitting elements LD to the entirety of the display panel PNL through the first oscillator CONV1.

FIG. 10 is a cross-sectional view schematically illustrating another example of the sub-pixel, taken along line I-I' of FIG. 7 and line II-II' of FIG. 8. FIG. 10 schematically illustrates a cross-section of the sub-pixel SPX corresponding to that of FIG. 9A.

Referring to FIGS. 9A and 10, the sub-pixel SPX of FIG. 10, other than a position and connection relationship of the connection pattern R_ELT, may be substantially identical to those of the sub-pixel SPX of FIG. 9A. Therefore, repetitive descriptions thereof will be omitted.

The connection pattern R_ELT may be disposed on a layer identical to that of the first and second transistor electrodes ET1 and ET2 of the first transistor T, may extend from one of the first and second transistor electrodes ET1 and ET2 of the first transistor T1 to the non-display area NDA, and may be electrically connected with an electrode of the third capacitor C3 of the first oscillator CONV1. The connection pattern R_ELT may be integral with one of the first and second transistor electrodes ET1 and ET2 of the first transistor T1 and the electrode of the third capacitor C3. In other words, the first oscillator CONV1 may be electrically connected to the first electrode ELT1 through the first transistor T1 (or the pixel circuit layer PCL) rather than being directly and electrically connected to the first electrode ELT1.

Figure 11:
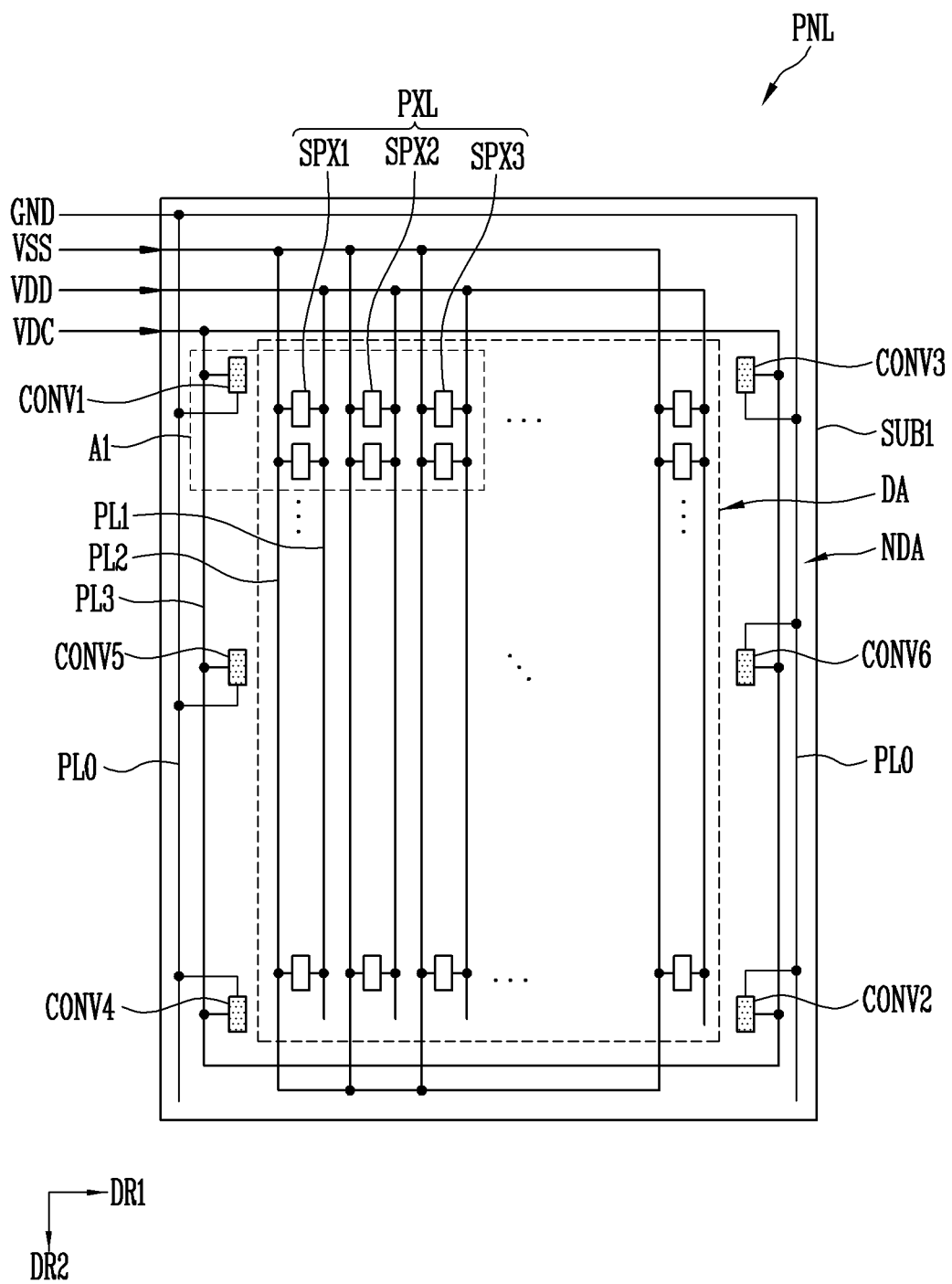
FIG. 11 is a plan view schematically illustrating a display device in accordance with an embodiment of the disclosure.
Figure 12:
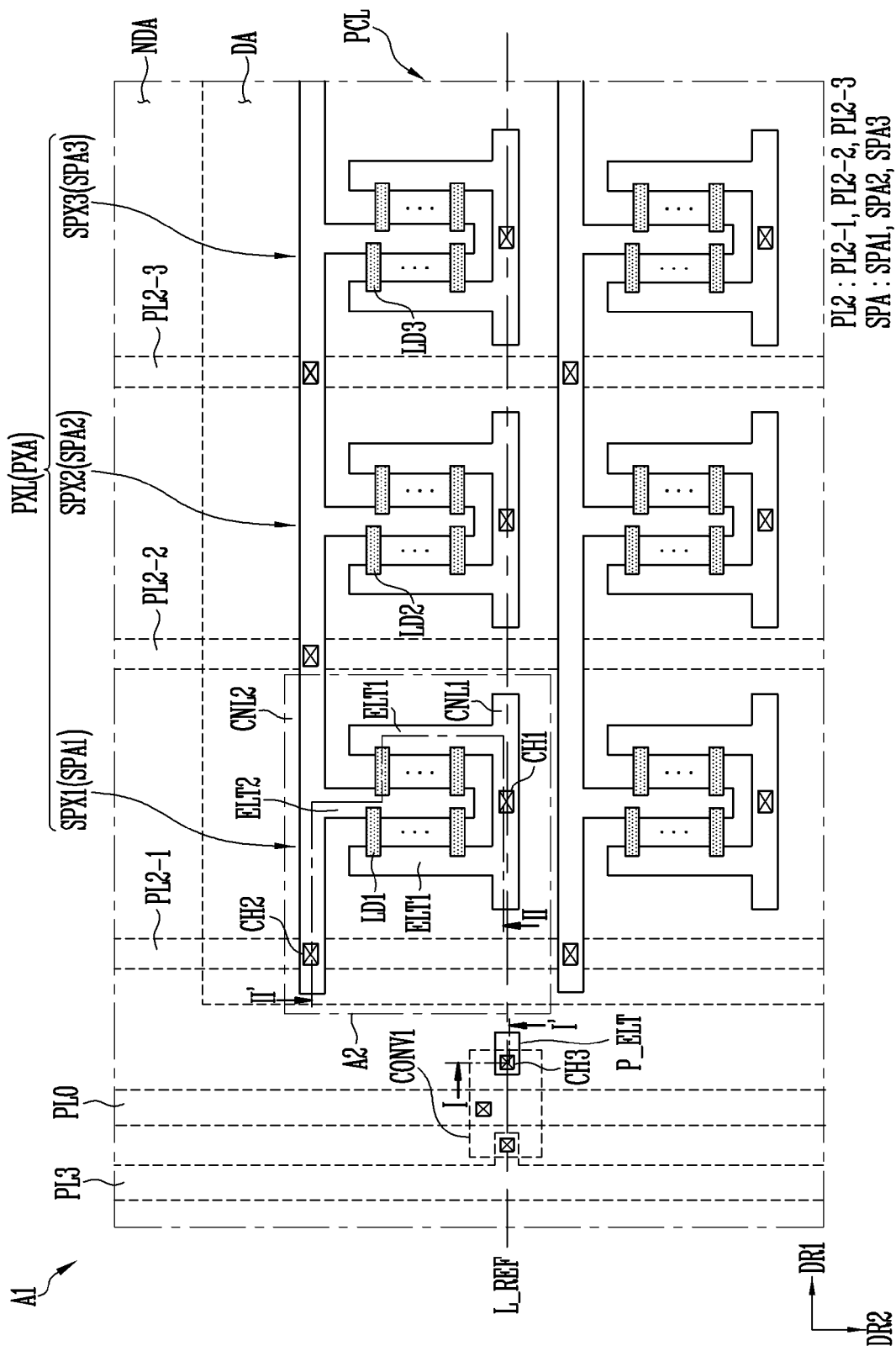
FIG. 12 is a plan view schematically illustrating an example of the display device, showing an enlargement of a first area of FIG. 11.
Figure 13:
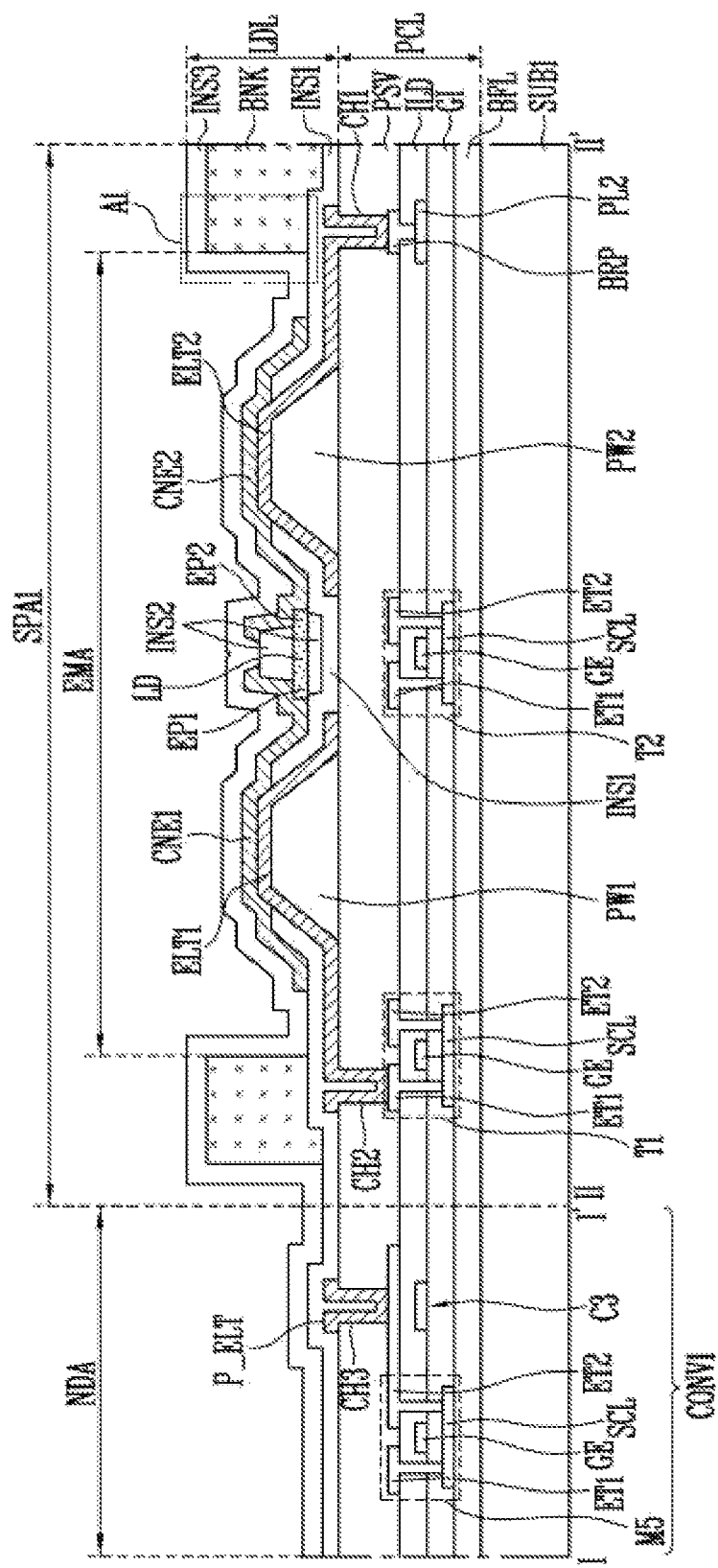
FIG. 13 is a cross-sectional view schematically illustrating an example of the sub-pixel, taken along line I-I' and line II-IF of FIG. 12.

FIG. 11 is a plan view schematically illustrating a display device in accordance with an embodiment. FIG. 11 illustrates a schematic plan view of a display panel PNL corresponding to that of FIG. 4. FIG. 12 is a plan view schematically illustrating an example of the display device, showing an enlargement of a first area A1 of FIG. 11. FIG. 12 illustrates a schematic plan view of a pixel corresponding to that of FIG. 7. FIG. 13 is cross-sectional view schematically illustrating an example of the sub-pixel, taken along line I-I' and line II-IF of FIG. 12. FIG. 13 illustrates a schematic cross-sectional view of a sub-pixel corresponding to that of FIG. 9A.

Referring to FIGS. 4, 7, 9A, and 11 to 13, the display device of FIG. 4 is different from the display device of FIG. 11 at least in that the first oscillator CONV1 is separated from the first sub-pixel SPX1. The display device of FIG. 4 (and the sub-pixel SPX of FIG. 9A), other than connection relationship (or separation relationship) between the oscillator CONV1 and the first sub-pixel SPX1, is substantially identical to the display device of FIG. 11 (or the sub-pixel of FIG. 13), so that repetitive descriptions thereof will be omitted.

As illustrated in FIGS. 12 and 13, the electrode pattern P_ELT may be disposed on a line identical to that of the first connection electrode CNL1 (or the first electrode ELT1), and may be electrically separated from the first connection electrode CNL1 (or the first electrode ELT1).

For example, the electrode pattern P_ELT and the first connection electrode CNL1 (or the first electrode ELT1) may be integral with each other. Thereafter, during a process of patterning the first electrode ELT1, the connection pattern R_ELT (refer to FIGS. 7 and 9A) between the electrode pattern P_ELT and the first connection electrode CNL1 may be removed, so that the electrode pattern P_ELT may be separated from the second connection electrode CNL2 (or the second electrode ELT2).

In other words, after the first oscillator CONV1 is used to align the light emitting elements LD during the process of manufacturing the display device, the first oscillator CONV1 may be separated from the first connection electrode CNL1 (or the first electrode ELT1).

In an embodiment, the electrode pattern P_ELT may be omitted. For example, the during a process of separating the first oscillator CONV1 from the first connection electrode CNL1 (or the first electrode ELT1), the electrode pattern P_ELT may be removed.

Figure 14:
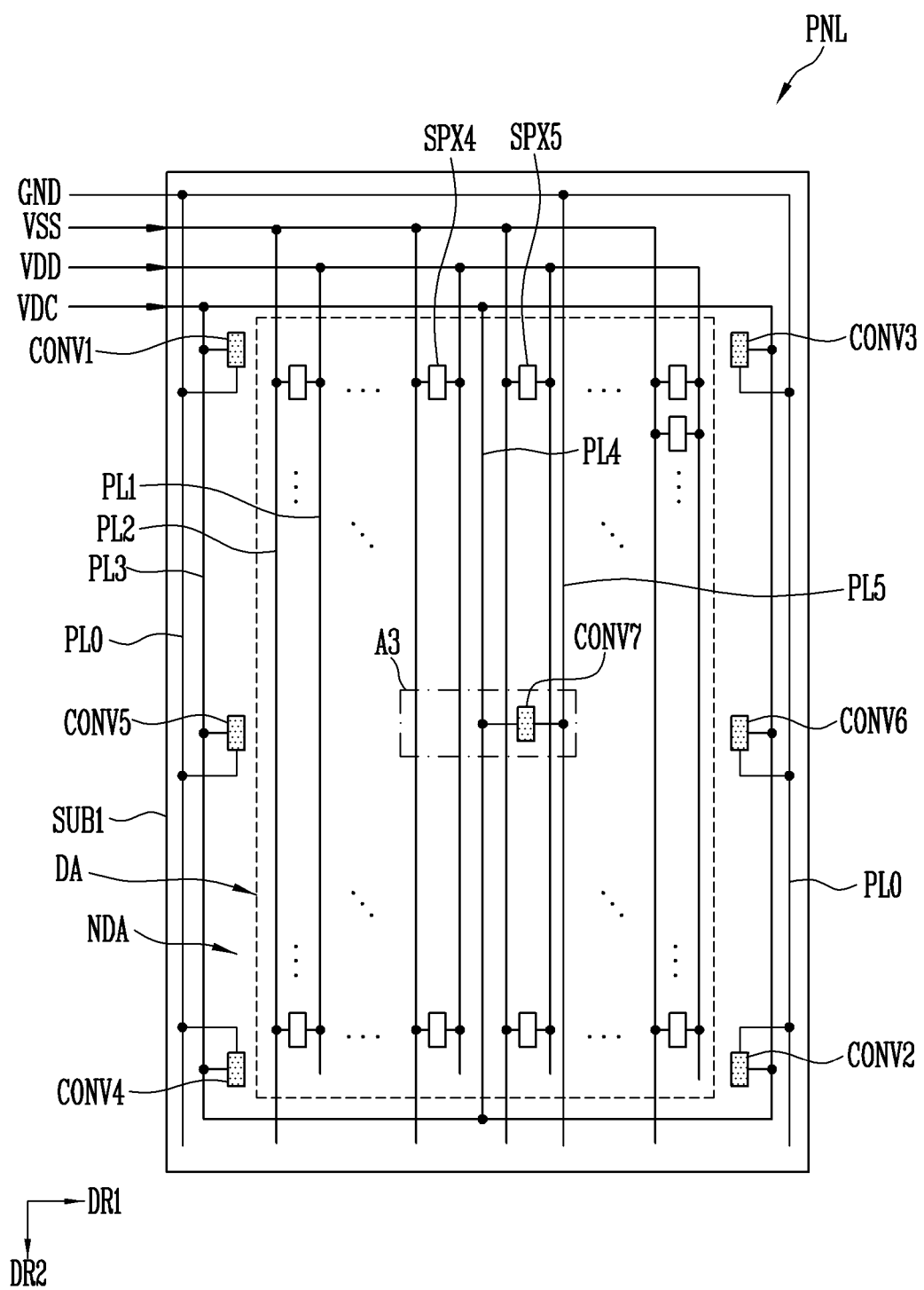
FIG. 14 is a plan view schematically illustrating a display device in accordance with an embodiment of the disclosure.

FIG. 14 is a plan view schematically illustrating a display device in accordance with an embodiment. In an embodiment, FIG. 14 illustrates a display device, particularly, a display panel PNL provided in the display device, as an example of a device which may use, as a light source, the light emitting elements LD described with reference to FIGS. 1A to 3B.

Referring to FIGS. 4 and 14, the display panel PNL illustrated in FIG. 14 is different from the display panel PNL illustrated in FIG. 4 in that the display panel PNL of FIG. 14 further includes a fourth power line PL4, a fifth power line PL5, and a seventh oscillator CONV7. In other words, the display panel PNL illustrated in FIG. 14, other than the fourth power line PL4, the fifth power line PL5, and the seventh oscillator CONV7, is substantially identical or similar to the display panel PNL illustrated in FIG. 4, so that repetitive descriptions thereof will be omitted.

The fourth power line PL4 may be disposed in the display area DA and may extend to the non-display area NDA and be electrically connected with the third power line PL3. For example, the fourth power line PL4 may extend in the second direction DR2 between a fourth sub-pixel SPX4 and a fifth sub-pixel SPX5. The fourth power line PL4 may be integral with the third power line PL3.

Likewise, the fifth power line PL5 may be disposed in the display area DA and may extend to the non-display area NDA and may be electrically connected with the reference power line PL0. For example, the fifth power line PL5 may extend in the second direction DR2 on a side of the fifth sub-pixel SPX5. The fifth power line PL5 may be integral with the reference power line PL0. However, the fifth power line PL5 is not limited thereto. For example, as illustrated in FIG. 14, the fifth power line PL5 may be electrically connected with the second power line PL2 and may be integral with the second power line PL2.

The seventh oscillator CONV7 may be disposed in the display area DA of the display panel PNL. For example, the seventh oscillator CONV7 may be disposed on a center area of the display panel PNL (or center area of the display area DA). As another example, the seventh oscillator CONV7 may be disposed at a position spaced apart from the fifth and sixth oscillators CONV5 and CONV6 by a regular distance.

The seventh oscillator CONV7 may be electrically connected between the fourth power line PL4 and the fifth power line PL5 and convert a DC voltage VDC, provided from the fourth power line PL4 (a DC voltage applied between the fourth power line PL4 and the fifth power line PL5) to an AC voltage. The seventh oscillator CONV7 may be implemented by the oscillator CONV described with reference to FIGS. 6A to 6B. For example, the seventh oscillator CONV7, along with the first to sixth oscillators CONV1 to CONV6, may convert a DC voltage VDC, provided from the third power line PL3 and the fourth power line PL4 to an AC voltage and supply the AC voltage to the pixel PXL during a process of aligning the light emitting element LD during the process of manufacturing the display panel PNL. In case that the display device (or the display panel PNL) is turned to display an image, the fourth power line PL4 may float, or no voltage may be applied to the fourth power line PL4.

FIG. 14 illustrates that the display panel PNL includes the seventh oscillator CONV7 in the display area DA, but this is for illustrative purposes, and the disclosure is not limited thereto. For example, the display panel PNL may include oscillators disposed in the display area DA. The oscillators may be disposed in the display area DA at positions spaced apart from each other at regular intervals. Therefore, a uniform AC voltage may be applied to the entirety of the display panel PNL through the oscillators.

As described with reference to FIG. 14, the display device may include oscillators (e.g., the first to sixth oscillators CONV1 to CONV6) disposed in the non-display area NDA of the display panel PNL, and at least one oscillator (e.g., the seventh oscillator CONV7) disposed in the display area DA. Therefore, a more uniform AC voltage may be provided to the entirety of the display panel PNL through the oscillators, and the light emitting elements may be more uniformly arranged in the entirety of the display panel PNL, so that uniformity of emission characteristics of the pixels PXL may be enhanced.

Figure 15:
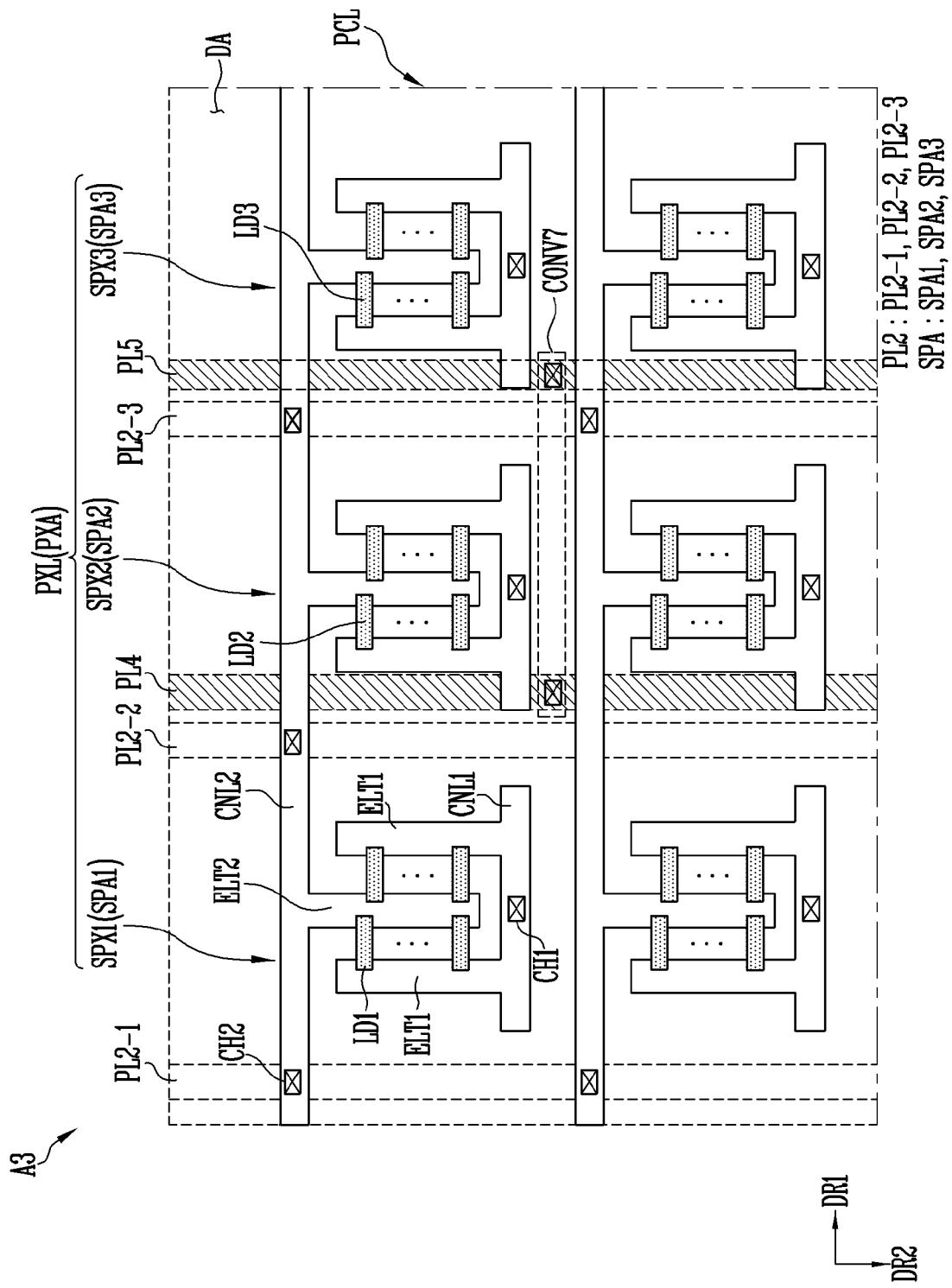
FIG. 15 is a plan view schematically illustrating an example of the display device, showing an enlargement of a third area of FIG. 14.

FIG. 15 is a plan view illustrating an example of the display device, schematically illustrating an enlargement of a third area A3 of FIG. 14. FIG. 15 illustrates the structure of a pixel PXL corresponding to that of FIG. 7.

Referring to FIGS. 7 and 15, the display device of FIG. 15, other than the fourth power line PL4, the fifth power line PL5, and the seventh oscillator CONV7, is substantially identical or similar to the display device of FIG. 7, so that repetitive descriptions thereof will be omitted.

The fourth power line PL4 may be included in the pixel circuit player PCL and extend in the second direction DR2 in the display area DA. The fourth power line PL4 may be disposed between the second sub-power line PL2-2 and the third sub-power line PL2-3, may be disposed between the first sub-pixel SPX1 (or the first sub-pixel area SPA1) and the second sub-pixel SPX2 (or the second sub-pixel area SPA2), or may be disposed across the second sub-pixel SPX2.

The fourth power line PL4 may be disposed on a layer identical to that of the second power line PL2 (e.g., on the layer identical to that of the second power line PL2 described with reference to FIG. 9A) and may be spaced apart from the second power line PL2.

Likewise, the fifth power line PL5 may be included in the pixel circuit player PCL and extend in the second direction DR2 in the display area DA. The fifth power line PL5 may be disposed between the second sub-pixel SPX2 (or the second sub-pixel area SPA2) and the third sub-pixel SPX3 (or the third sub-pixel area SPA3), or may be disposed across the third sub-pixel SPX3.

The fifth power line PL5 may be disposed on the layer identical to that of the second power line PL2 (e.g., on the layer identical to that of the second power line PL2 described with reference to FIG. 9A), and may be spaced apart from the second power line PL2.

In an embodiment, the seventh oscillator CONV7 may be disposed between the second sub-pixel SPX2 (or the second sub-pixel area SPA2) and an adjacent sub-pixel (e.g., a sub-pixel or a sub-pixel area adjacent to the second sub-pixel SPX2 in the second direction DR2). In an embodiment, in case that the sub-pixel area SPA is divided by the second connection electrode CNL2 and the second power line PL2, the seventh oscillator CONV7 may be disposed in the second pixel area SPA2.

Although FIG. 15 illustrates that the seventh oscillator CONV7 is electrically connected between the fourth power line PL4 and the fifth power line PL5, the seventh oscillator CONV7 is not limited thereto. For example, the seventh oscillator CONV7 may be disposed on two or more sub-pixels of the first to third sub-pixels SPX1 to SPX3. Furthermore, the seventh oscillator CONV7 may be disposed to overlap the first connection electrode CNL1 and/or the second connection electrode CNL2. In other words, in some embodiments, the disposition of the seventh oscillator CONV7 may be changed.

Figure 16:
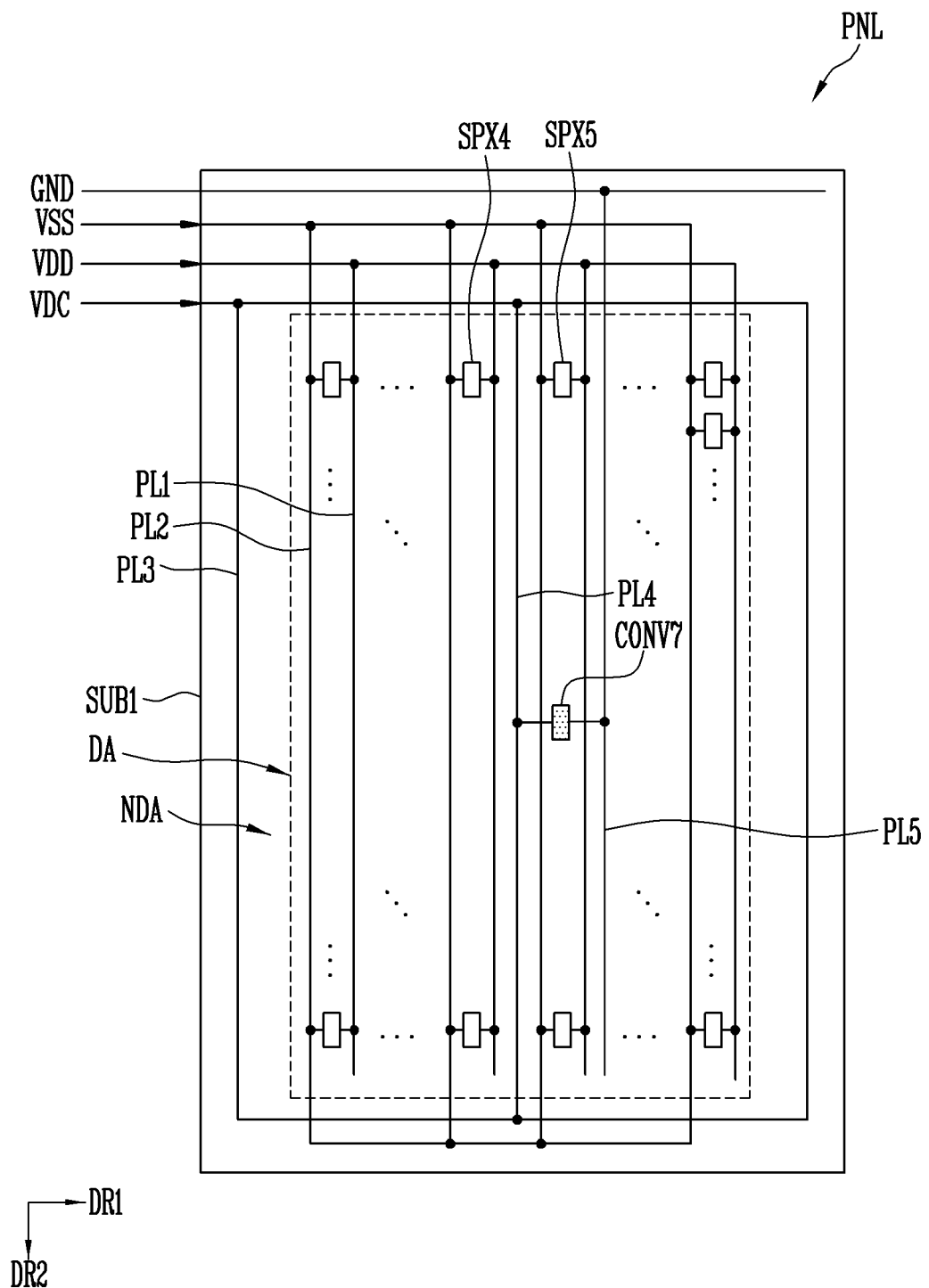
FIG. 16 is a plan view schematically illustrating a display device in accordance with an embodiment of the disclosure.

FIG. 16 is a plan view schematically illustrating a display device in accordance with an embodiment. FIG. 16 illustrates a display device, particularly, a display panel PNL provided in the display device, as an example of a device which may use, as a light source, the light emitting elements LD described with reference to FIGS. 1A to 3B.

Referring to FIGS. 14 to 16, the display panel PNL shown in FIG. 16 is different from the display panel PNL shown in FIG. 14 in that the display panel PNL of FIG. 16 does not include the first to sixth oscillators CONV1 and CONV6.

In other words, the display panel PNL shown in FIG. 16 may include at least one oscillator disposed in the display area DA of the base layer SUB1, e.g., only the seventh oscillator CONV7 as shown in FIG. 16.

Figure 17A:
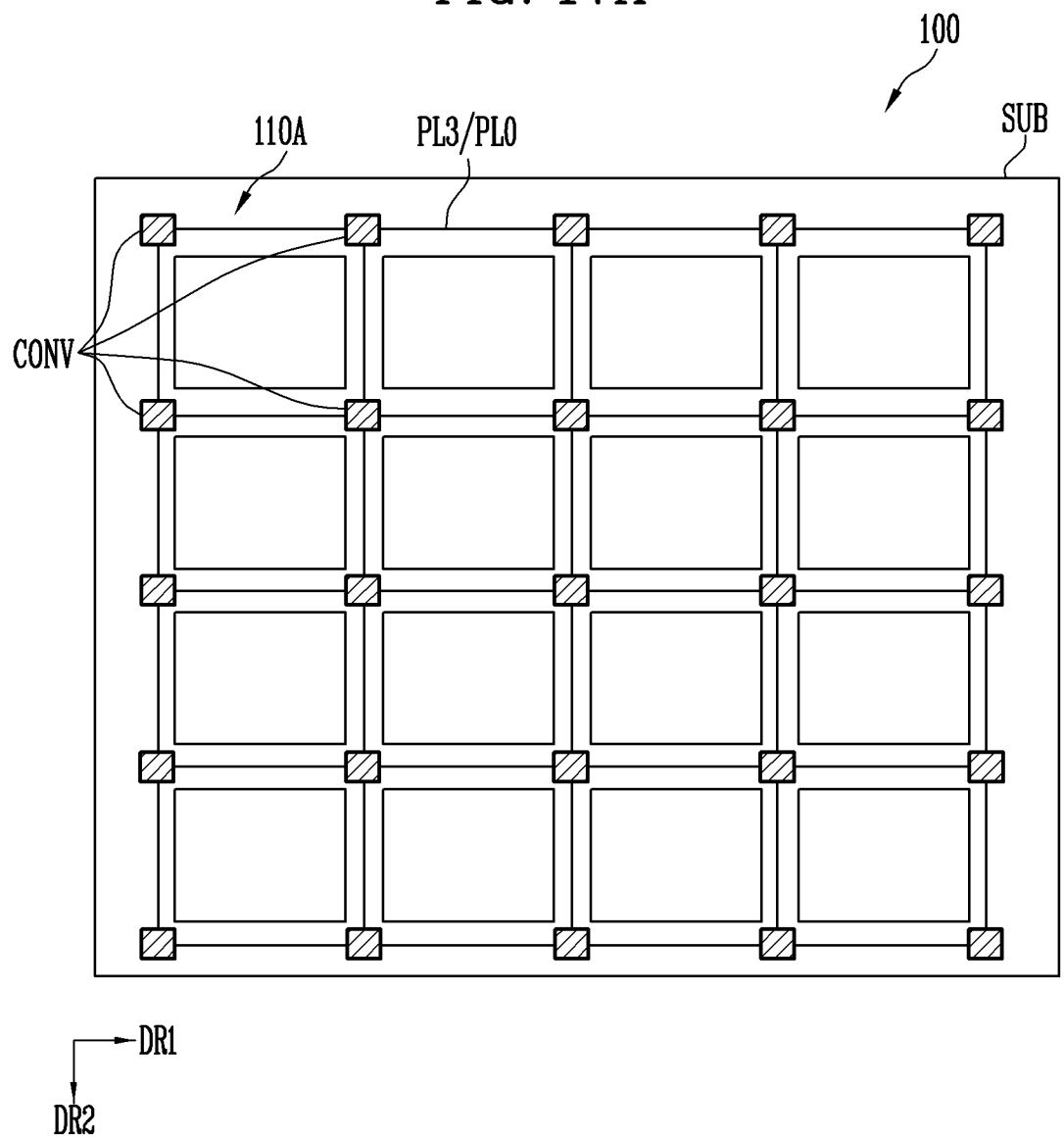
FIGS. 17A to 17C are plan views schematically illustrating an example of a mother substrate in accordance with an embodiment of the disclosure.
Figure 17B:
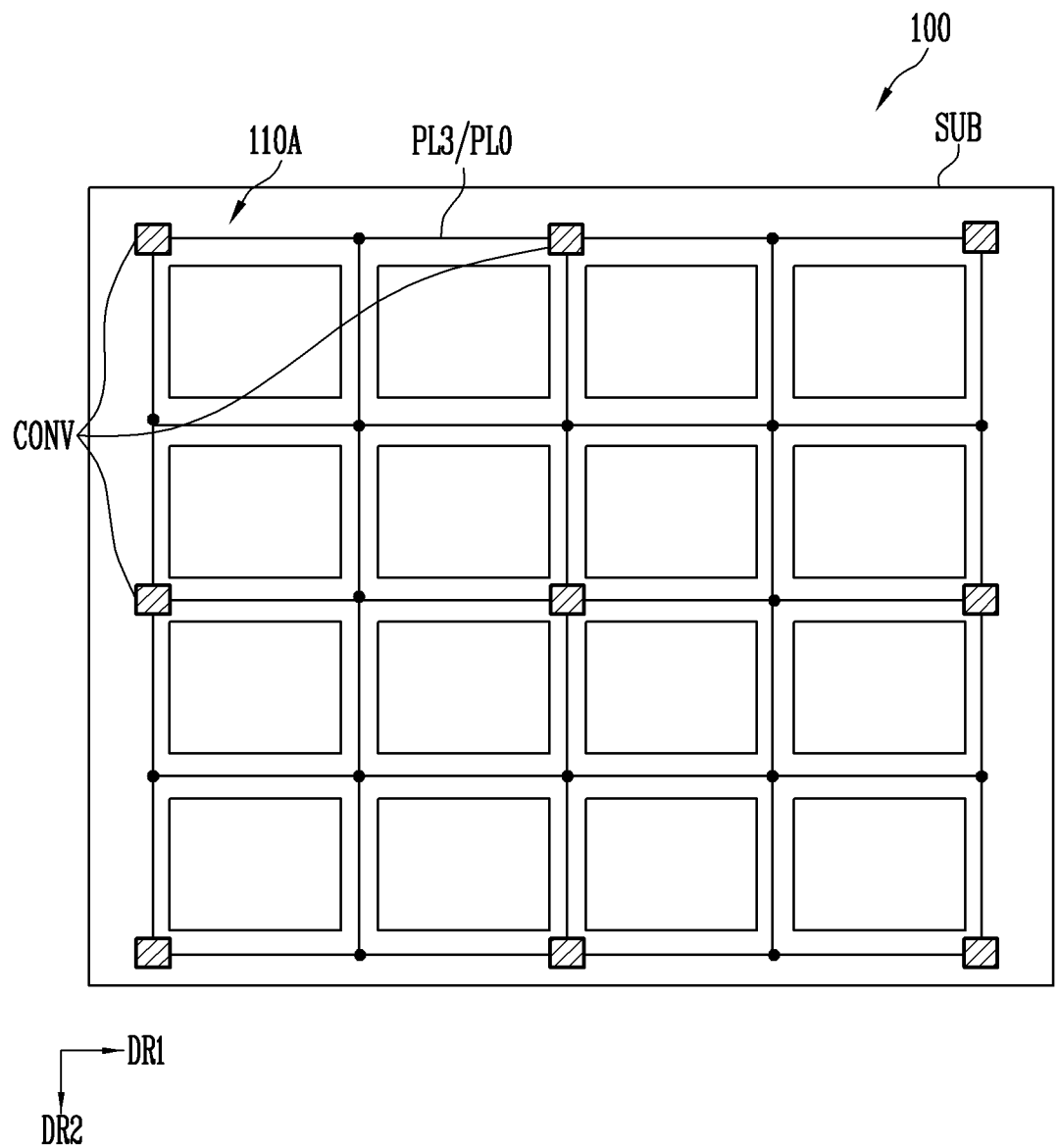
Figure 17C:
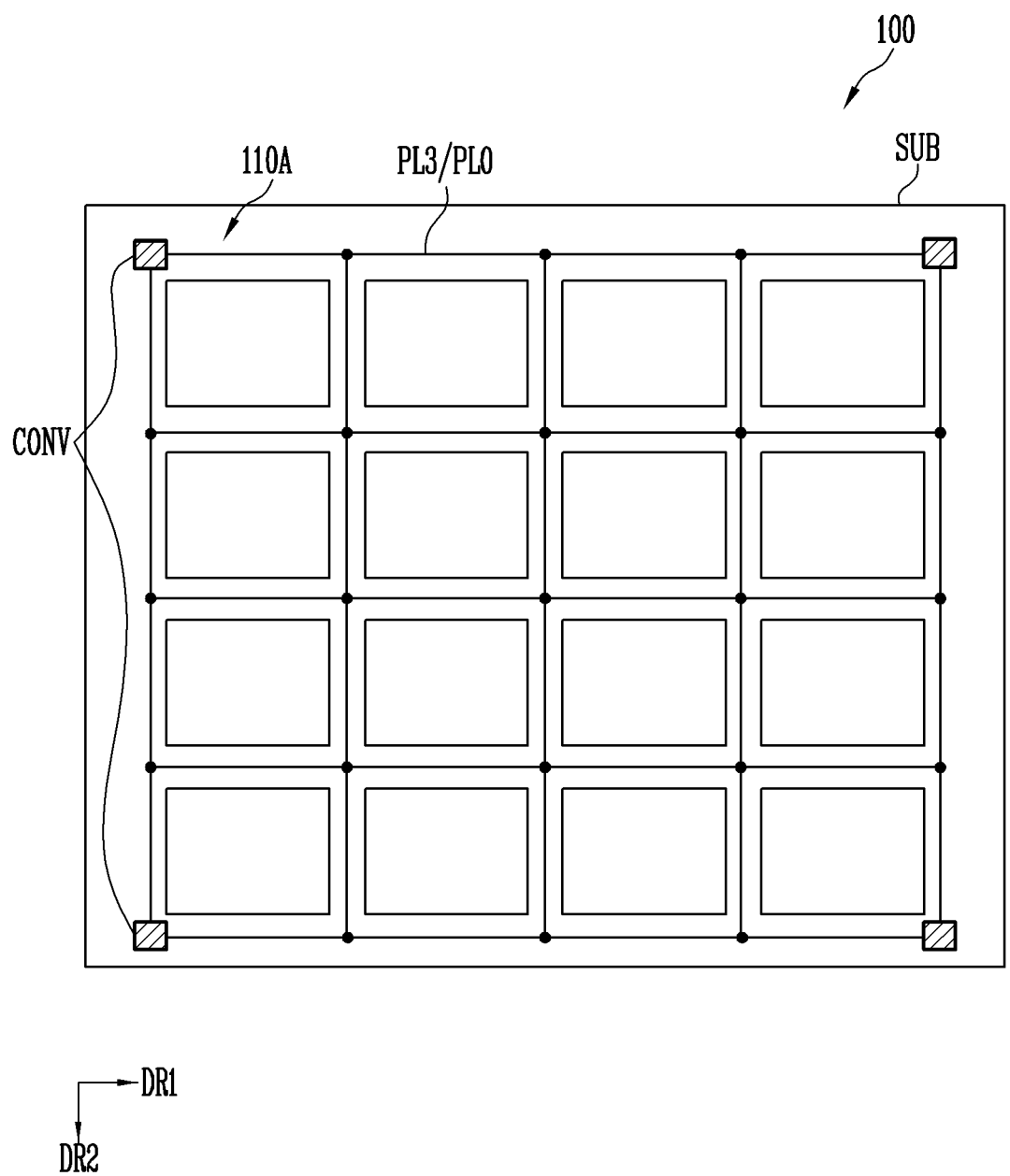

FIGS. 17A to 17C are schematic plan views illustrating an example of a mother substrate in accordance with an embodiment.

Referring to FIG. 17A, a mother substrate 100 may include cell areas 110A provided to form display panels. The mother substrate 100 may be provided to simultaneously manufacture display panels on a single large substrate SUB and include the substrate SUB that is a base, and electrodes, lines, and/or circuit elements formed on the substrate SUB.

The mother substrate 100 may include, outside the cell areas 110A, a third power line PL3, a reference power line PL0, and oscillators CONV which are arranged along the perimeter of the cell areas 110A. The third power line PL3 and the reference power line PL0 may extend in the first direction DR1 and the second direction DR2 and have a mesh structure.

The oscillators CONV may be disposed between the cell areas 110A and be electrically connected with the third power line PL3 and the reference power line PL0. The oscillators CONV may be disposed in the form of a matrix at regular intervals based on each of the cell areas 110A.

Thanks to the oscillators CONV that are evenly distributed or disposed, the mother substrate 100 may provide an AC voltage having a uniform voltage level to the entirety of the mother substrate 100 without voltage drop.

Although FIG. 17A illustrates that the oscillators CONV are disposed corresponding to the respective cell areas 110A, the disclosure is not limited thereto. For example, as illustrated in FIG. 17B, the oscillators CONV may be disposed at intervals corresponding two cell areas 110A (or two or more cell areas 110A). As another example, as illustrated in FIG. 17C, the oscillators CONV may be disposed at regular intervals along the perimeter of the mother substrate 100, or be disposed at four corners of the mother substrate 100.

If the oscillators CONV are disposed in the mother substrate 100 at specific intervals taking into account voltage drop characteristics of the AC voltage, the locations and arrangements of the oscillators CONV are not particularly limited.

Figure 18:
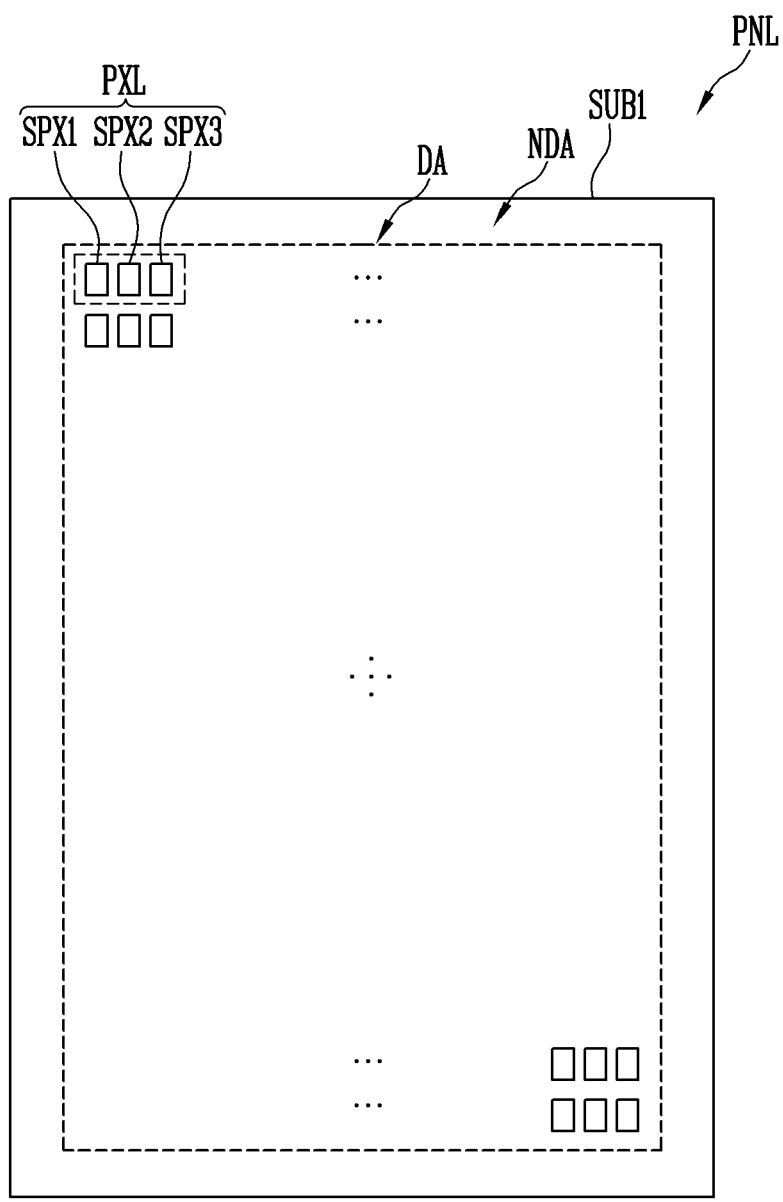
FIG. 18 is a plan view schematically illustrating an example of a display panel included in the mother substrates of FIGS. 17A to 17C.

FIG. 18 is a plan view schematically illustrating an example of a display panel included in the mother substrates of FIGS. 17A to 17C.

Referring to FIGS. 4 and 18, the display panel PNL of FIG. 18 is different from the display panel PNL shown in FIG. 4 in that the display panel PNL of FIG. 18 does not include the oscillators CONV1 to CONV6, the reference power line PL0, and the third power line PL3.

As described with reference to FIGS. 17A to 17C, the oscillators CONV may be disposed outside the respective cell areas 110A in the mother substrate 100, and the cell areas 110A are separated from the mother substrate 100 by a cutting process or the like, so that the display panel PNL may not include the oscillators CONV, the reference power line PL0, and the third power line PL3. As described with reference to FIG. 7, in case that the oscillators CONV are directly and electrically connected to the first electrode ELT1 in the mother substrate 100 of FIGS. 17A to 17C (and the first electrode ELT1 is thereafter separated from the oscillators CONV), the display panel PNL may not include a connection configuration (e.g., the electrode pattern P_ELT, refer to FIG. 7) between the oscillators CONV and the first electrode ELT1.

FIG. 19 is a flowchart schematically illustrating a method of manufacturing the display device in accordance with an embodiment. FIGS. 20A to 20D are schematic diagrams for describing the method of manufacturing the display device of FIG. 19.

Figure 20A:
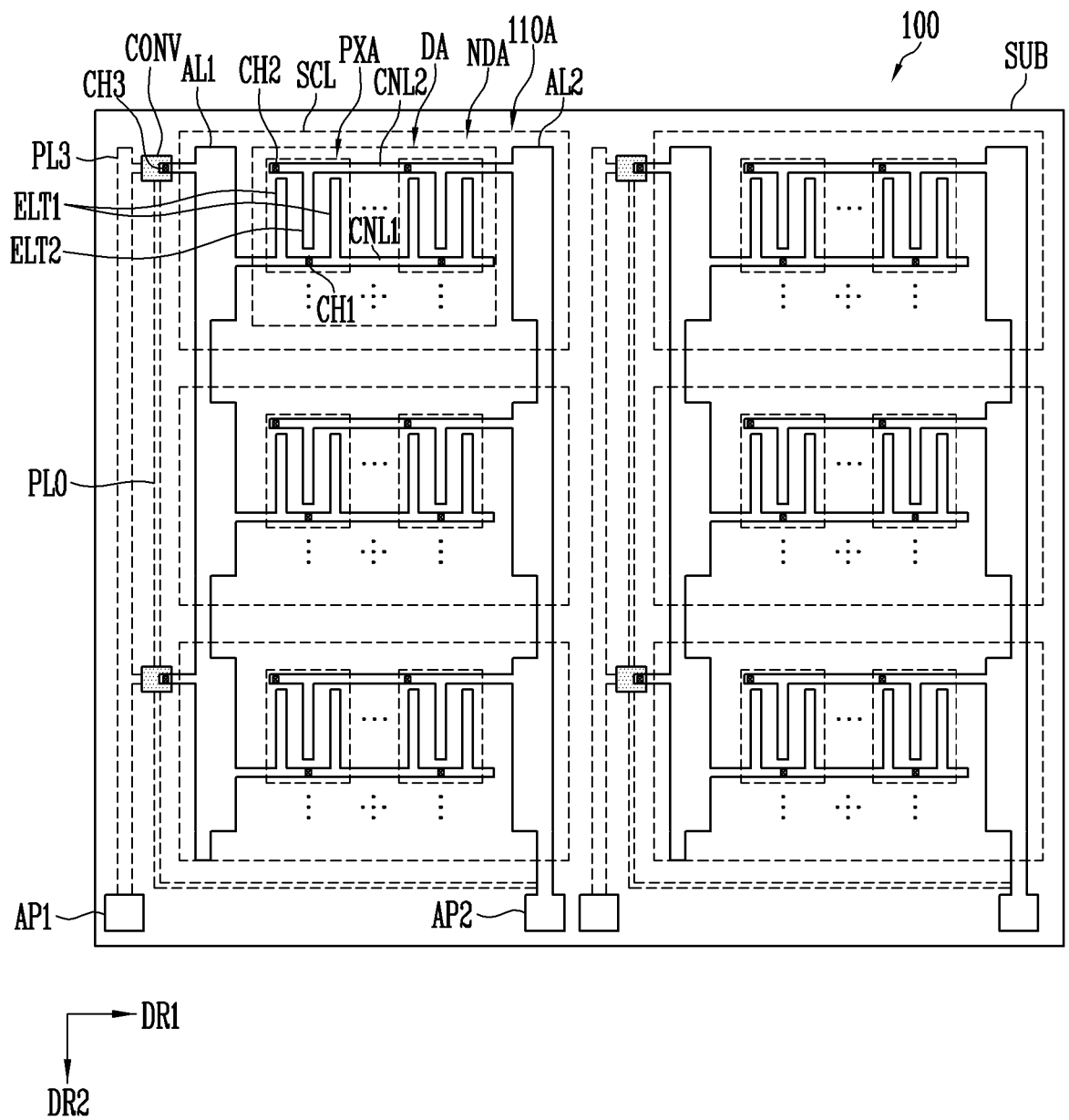
Figure 20C:
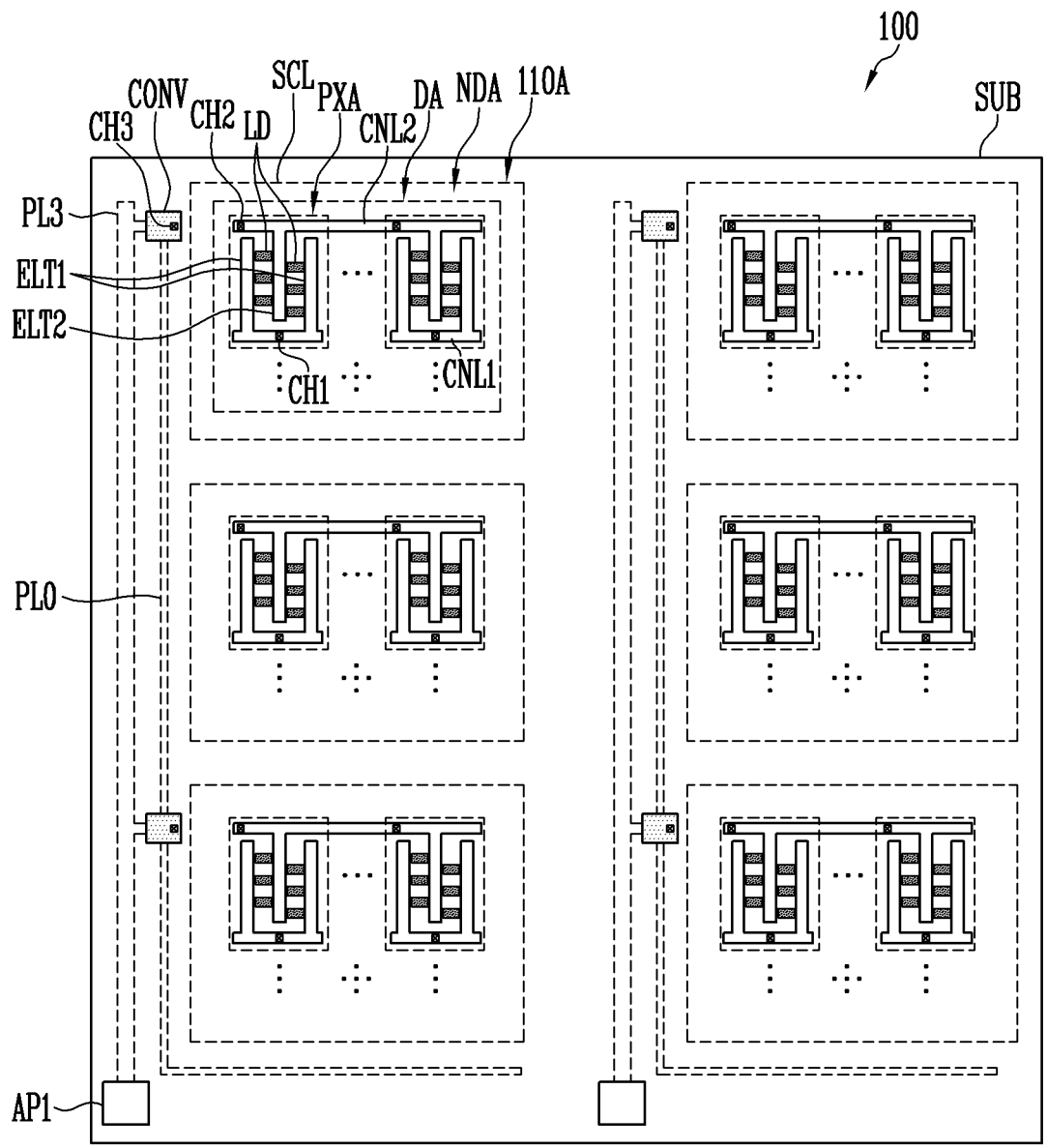
Figure 20D:
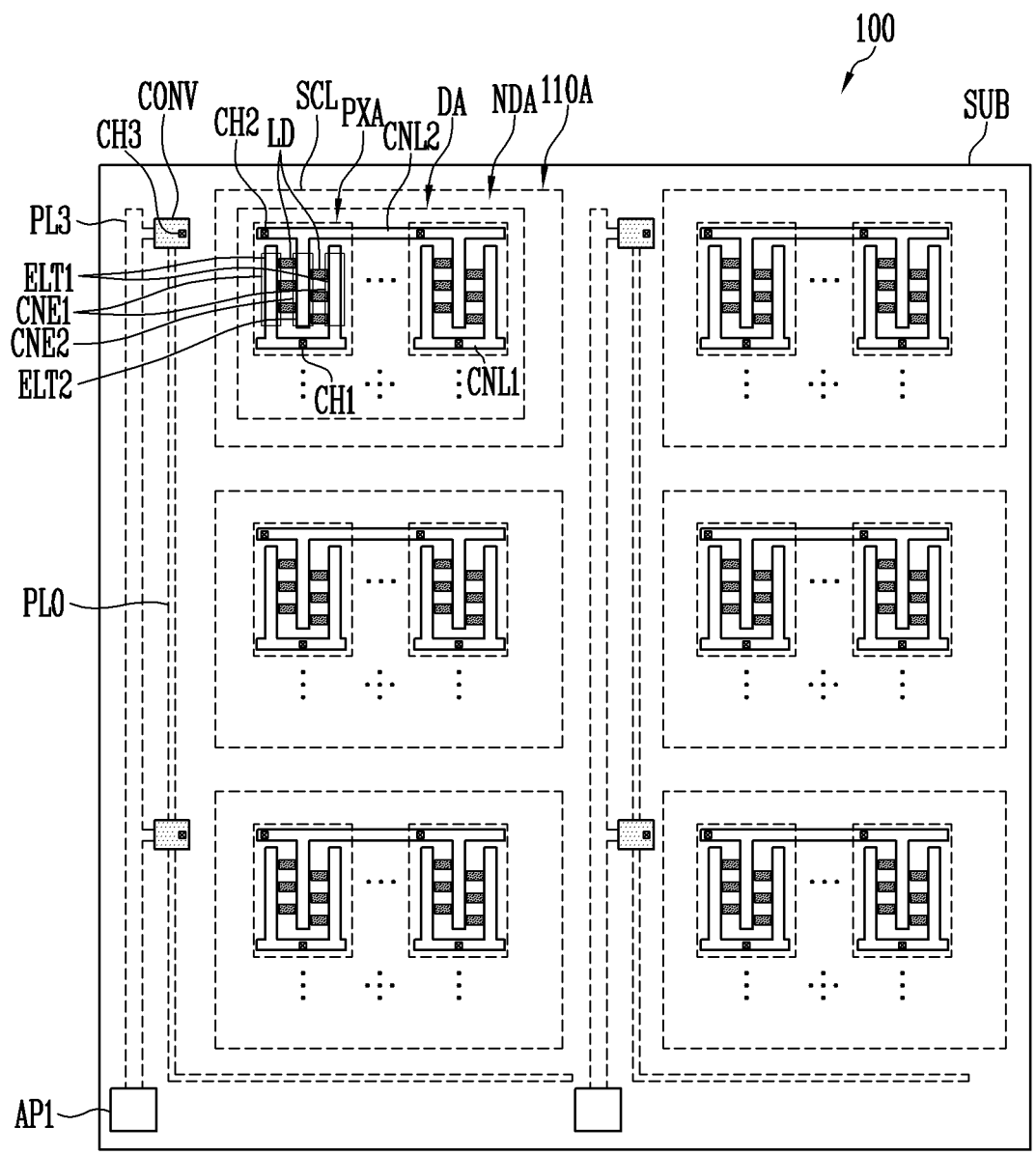

Referring to FIGS. 19 to 20D, the method of manufacturing the display device may include preparing the substrate 100 (or the substrate SUB) (S1910).

In an embodiment, FIGS. 20A to 20D illustrate an embodiment where display panels are simultaneously formed on a single mother substrate 100 and then the display panels are individually separated by a cutting process. Here, the display panels each may be one of the display panels described with reference to FIGS. 4, 14, and 18.

Referring to FIG. 20A, the mother substrate 100 may be a cell area 110A for forming emission display panels, as described with reference to FIGS. 17A to 17C. The mother substrate 100 may include a substrate SUB and first and second electrodes ELT1 and ELT2 formed on the substrate SUB. Furthermore, the mother substrate 100 may include first and second connection electrodes CNL1 and CNL2 and first and second alignment lines AL1 and AL2 formed on the substrate SUB.

The cell area 110A of the substrate SUB may include a display area DA including pixel areas PXA, and a non-display area NDA disposed around the perimeter of the display area DA. The cell area 110A may be defined by a scribing line SCL.

The substrate SUB may include a pixel circuit layer including circuit elements. The pixel circuit layer may include a reference power line PL0, a third power line PL3, and oscillators CONV.

The third power line PL3 may be disposed outside the cell area 110A, and extend, e.g., in the second direction DR2, but the disclosure is not limited thereto. The third power line PL3 may be electrically connected to a first alignment pad AP1 disposed in a predetermined area (e.g., a peripheral area) of the mother substrate 100.

Likewise, the reference power line PL0 may be disposed outside the cell area 110A and electrically connected to a second alignment pad AP2 disposed in a predetermined area (e.g., a peripheral area) of the mother substrate 100.

The oscillators CONV may be disposed between the third power line PL3 (or the reference power line PL0) and the first alignment line AL1 and be electrically connected with the reference power line PL0, the third power line PL3, and the first alignment line AL1. As illustrated in FIG. 20A, the oscillators CONV may be disposed outside the cell area 110A, but the disclosure is not limited thereto. For example, the oscillators CONV may be disposed in the non-display area NDA and/or the display area DA in the cell area 110A. In this case, the display panel PNL described with reference to FIGS. 4, 14, and 16 may be manufactured.

The first and second electrodes ELT1 and ELT2 may be disposed in the display area DA of the cell area 110A.

In an embodiment, the first electrode ELT1 may be electrically connected to the first alignment line AL1 through the first connection electrode CNL1. The second electrode ELT2 may be electrically connected to the second alignment line AL2 through the second connection electrode CNL2. In an embodiment, at the step before the alignment process of the light emitting elements LD is completed, the first electrodes ELT1 formed in the cell area 110A may be electrically connected in common to the first alignment line AL1, and the second electrodes ELT2 may be electrically connected in common to the second alignment line AL2.

The first and second alignment lines AL1 and AL2 may be disposed in the non-display area NDA of the cell area 110A. For example, in the cell area 110A, the first and second alignment lines AL1 and AL2 may be disposed facing each other on respective ends of the substrate SUB with the display area DA interposed therebetween. For example, in the cell area 110A, the first alignment line AL1 may be disposed in the non-display area NDA on a left side of the display area DA, and the second alignment line AL2 may be disposed in the non-display area NDA on a right side of the display area DA.

The first alignment line AL1 may be electrically connected to a first alignment pad AP1 disposed in the predetermined area (e.g., the peripheral area) of the mother substrate 100.

In an embodiment, each of the first and second alignment lines AL1 and AL2 may have a multi-layer structure. For example, each of the first and second alignment lines AL1 and AL2 may have a multi-layer structure including a main line (not illustrated) disposed on a layer identical to that of at least one of the first and second electrodes ELT1 and ELT2, and a sub-line (not illustrated) disposed on the pixel circuit layer.

Thereafter, the method of FIG. 19 may include supplying the light emitting elements LD between the first and second electrodes (S1920) and aligning the light emitting elements LD by applying a DC voltage VDC to the oscillator CONV (S1930).

Referring to FIG. 20B, the method of FIG. 19 may include supplying the light emitting elements LD to the pixel area PXA of the mother substrate 100. The method of FIG. 19 may include applying predetermined voltages to the first and second alignment pads AP1 and AP2. The method of FIG. 19 may also include applying the predetermined voltages to the first and second alignment pads AP1 and AP2 by an external signal application device.

In an embodiment, the method of FIG. 19 may include applying a DC voltage VDC to the first alignment pad AP1 and applying a ground voltage GND to the second alignment pad AP2. In this case, the oscillator CONV may convert the DC voltage VDC provided from the third power line PL3 to an AC voltage and provide the AC voltage to the first alignment line AL1 and the first electrode ELT1. An electric field may be formed in the pixel area PXA by the AC voltage applied between the first electrode ELT1 and the second electrode ELT2. Therefore, the light emitting elements LD may be self-aligned between the first and second electrodes ELT1 and ELT2 of the pixel area PXA.

In an embodiment, the method of FIG. 19 may include the supply and alignment of the light emitting elements LD. For example, the method of FIG. 19 may include aligning the light emitting elements LD by supplying the predetermined voltages to the first and second electrodes ELT1 and ELT2 of the pixel area PXA while supplying the light emitting elements LD to the pixel area PXA. As another example, the method of FIG. 19 may include aligning the light emitting elements LD by supplying the predetermined voltages to the first and second electrodes ELT1 and ELT2 of the pixel area PXA after supplying the light emitting elements LD to the pixel area PXA. In other words, a sequence of and/or a method of the steps of supplying and aligning the light emitting elements LD is not particularly limited.

After the supply and alignment of the light emitting elements LD have been completed, the method of FIG. 19 may include separating the first and/or second electrodes ELT1 and ELT2 between the pixel areas PXA (S1940). Therefore, the pixel PXL may be independently driven.

Referring to FIG. 20C, the method of FIG. 19 may include separating the first electrodes ELT1 from each other between the pixels PXL by cutting off the connection between the first electrodes ELT1 that have been electrically connected to each other between the pixel areas PXA. Furthermore, the method of FIG. 19 may include separating or removing the first alignment line AL1 from the pixels PXL of the display area DA.

Since the second electrodes ELT2 are electrically connected in common to an identical power line in each cell area 110A, the second electrodes ELT2 between the pixel areas PXA may remain connected rather than separated, in the method of FIG. 19. Although in the method of FIG. 19 the second alignment line AL2 may be separated or removed from the pixels PXL of the display area DA, the disclosure is not limited thereto. For example, the second alignment line AL2 may remain connected with the pixels PXL of the display area DA.

Subsequently, the method of FIG. 19 may include electrically connecting the light emitting elements LD to the first and second electrodes ELT1 and ELT2 (S1950).

Referring to FIG. 20D, the method of FIG. 19 may include forming the first and second contact electrodes CNE1 and CNE2 on the opposite ends of the light emitting elements LD, so that the opposite ends of the light emitting elements LD may be physically and/or electrically connected to the respective first and second electrodes ELT1 and ELT2.

Although there has been described an example in which, as shown in FIG. 20D, the first and second contact electrodes CNE1 and CNE2 are formed in each pixel area PXA after the first and/or second electrodes ELT1 and ELT2 are separated from each other between the pixel areas PXA, as shown in FIG. 20C, the disclosure is not limited thereto. For example, the separation process of the first and/or second electrodes ELT1 and ELT2 shown in FIG. 20C and the formation process of the first and second contact electrodes CNE1 and CNE2 may be performed in an opposite order. For example, in the method of FIG. 19, as shown in FIG. 20D, after the first and second contact electrodes CNE1 and CNE2 are formed, the first electrodes ELT1 may be separated from each other between the pixel areas PXA, as shown in FIG. 20C.

Thereafter, the method of FIG. 19 may include forming a passivation layer or the like (e.g., the third insulating layer INS3 and the overcoat layer described with reference to FIG. 10) for protecting the light emitting elements LD.

Subsequently, the method of FIG. 19 may include removing the oscillator CONV by cutting the mother substrate 100 (S1960).

For example, the method of FIG. 19 may include performing a cutting process along the scribing line SCL. The method of FIG. 19 may include manufacturing the display panel (and the display device including the display panel) by individually separating the cell areas 110A disposed on the mother substrate 100.

The oscillator CONV and the first and second alignment lines AL1 and AL2 are removed by a preceding process, so that the display panel PNL shown in FIG. 18 may be manufactured.

The disclosure is not limited thereto, and the display panel PNL shown in FIG. 4, 8, or 14 may be manufactured depending on the position of the oscillator CONV.

Figure 21:
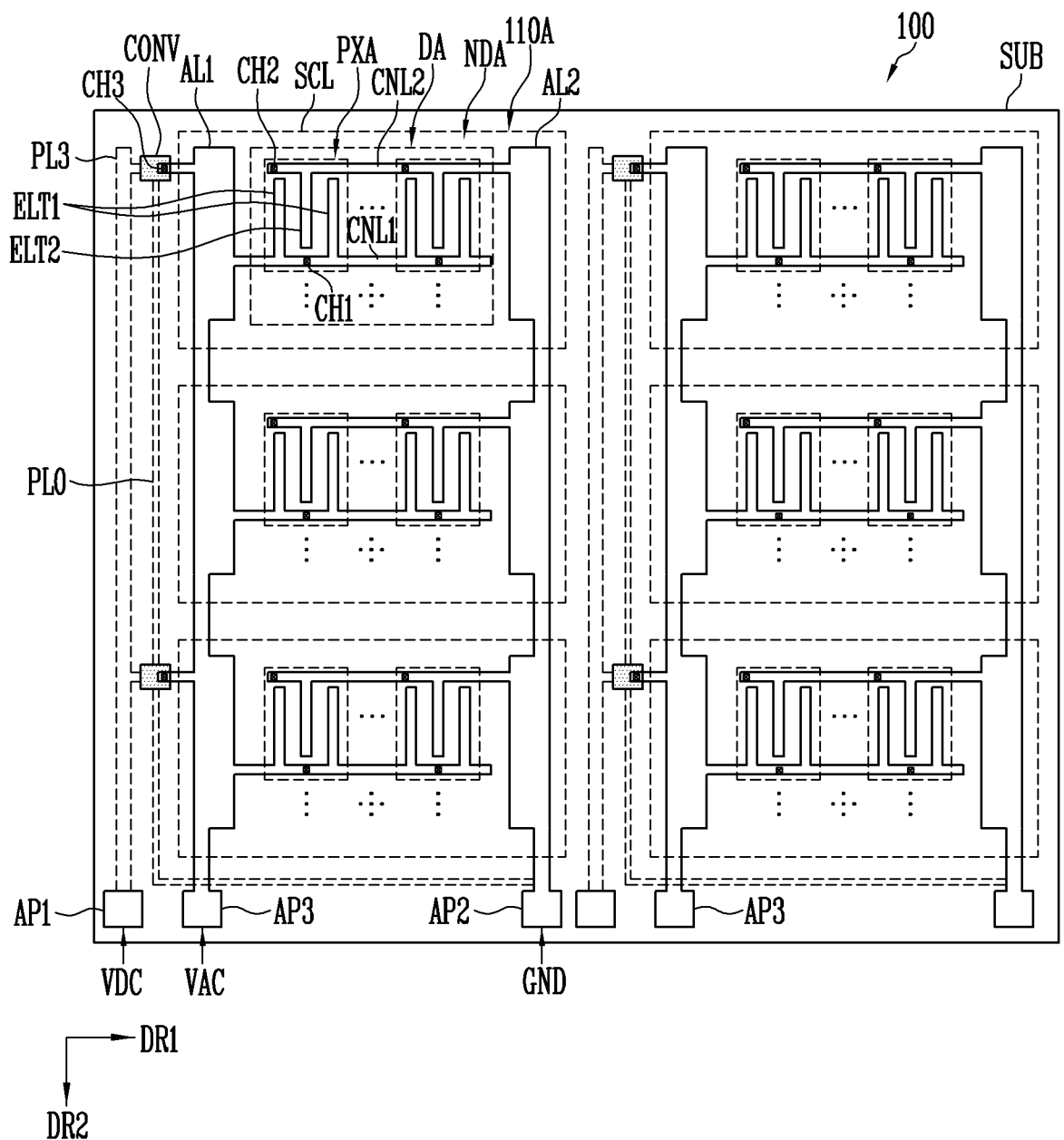
FIG. 21 is a diagram schematically illustrating a method of manufacturing the display device in accordance with an embodiment of the disclosure.

FIG. 21 is a schematic diagram for describing a method of manufacturing the display device in accordance with an embodiment.

Referring to FIGS. 19 to 21, the method of FIG. 19 may include applying an AC voltage VAC to the first alignment line AL1 in the step of aligning the light emitting elements LD. Here, the AC voltage VAC applied from an external device to the first alignment line AL1 may have a substantially identical amplitude and waveform to those of an AC voltage from the oscillator CONV to the first alignment line AL1.

As illustrated in FIG. 21, the mother substrate 100 may further include a third alignment pad AP3 disposed in a predetermined area (e.g., a peripheral area) thereof, and the first alignment line AL1 may be electrically connected to the third alignment pad AP3.

In this case, the method of FIG. 19 may include applying a DC voltage VDC to the first alignment pad AP1, applying a ground voltage GND to the second alignment pad AP2, and applying an AC voltage VAC to the third alignment pad AP3.

The AC voltage VAC applied through the third alignment pad AP3 may cause the AC voltage that is eventually applied to the second electrode ELT2 to be uniform on the entirety of the mother substrate 100.

While the spirit and scope of the disclosure are described by detailed embodiments, it should be noted that the above-described embodiments are merely descriptive and should not be considered limiting. It should be understood by those skilled in the art that various changes, substitutions, and alternations may be made herein without departing from the scope of the disclosure.

The scope of the claimed invention is not limited by detailed descriptions of the specification, and should be defined by the accompanying claims. Furthermore, all changes or modifications of the disclosure derived from the meanings and scope of the claims, and equivalents thereof should be construed as being included in the scope of the disclosure.

What is claimed is:

1. A display device comprising:
   a substrate;
   pixels disposed on the substrate, each of the pixels comprising:
   a first electrode;
   a second electrode; and
   a plurality of light emitting elements electrically connected between the first and the second electrodes; and
   a first oscillator disposed on the substrate and electrically connected to a first electrode of a first pixel of the pixels, the first oscillator converting a direct current (DC) voltage to an alternating current (AC) voltage, supplying the alternating current (AC) voltage to the first electrode of the first pixel of the pixels to align the plurality of light emitting elements between the first and second electrodes, and comprising:
   at least one transistor; and
   at least one capacitor.

2. The display device of claim 1, wherein
the first electrode of the first pixel is separated from a first electrode of a second pixel of the pixels, and
the first oscillator is electrically disconnected from the second pixel.

3. The display device of claim 1, wherein
the substrate includes:
   a display area in which an image is displayed; and
   a non-display area disposed adjacent to the display area,
the pixels are disposed in the display area, and
the first oscillator is disposed in the non-display area.

4. The display device of claim 3, further comprising:
a second oscillator and a third oscillator disposed on the non-display area,
wherein the first oscillator, the second oscillator, and the third oscillator are disposed at regular intervals along a perimeter of the display area.

5. The display device of claim 4, further comprising:
a first power line, a second power line, a third power line, and a fourth power line disposed on the substrate and separated from each other, wherein
each of the pixels is electrically connected between the first power line and the second power line,
the first oscillator is electrically connected to the third power line and the fourth power line, and
each of the third power line and the fourth power line floats when the display device is turned on to display the image.

6. The display device of claim 5, wherein
the first power line, the second power line, the third power line, the fourth power line, and the first oscillator are included in a pixel circuit layer,
the first electrode and the second electrode are disposed on the pixel circuit layer at positions spaced apart from each other, and
the plurality of light emitting elements are disposed between the first electrode and the second electrode.

7. The display device of claim 6, further comprising:
an electrode pattern disposed on the pixel circuit layer, overlapping the at least one capacitor of the first oscillator, and electrically connected to the at least one capacitor,
wherein the electrode pattern is separated from the first electrode of the first pixel.

8. The display device of claim 3, further comprising:
a second oscillator disposed in the display area.

9. The display device according to of claim 1, wherein the first oscillator is disposed between the pixels.

10. The display device of claim 1, wherein each of the plurality of light emitting elements comprises a light emitting diode having a size in a range of a nanometer scale to a micrometer scale.

11. The display device of claim 1, further comprising:
a first power line and a second power line disposed on the substrate, wherein
the first oscillator comprises at least one stage, the at least one stage each comprises:
- a first transistor comprising a first electrode electrically connected to the first power line, a second electrode electrically connected to a first node, and a gate electrode electrically connected to an input terminal;
- a second transistor comprising a first electrode electrically connected to the first node, a second electrode electrically connected to the second power line, and a gate electrode electrically connected to the input terminal; and
- a first resistor and a first capacitor electrically connected in series between the first node and the second power line, and
- a second node to which the first resistor and the first capacitor are electrically connected is electrically connected, as an output terminal, to the input terminal.

12. The display device of claim 11, wherein
the first oscillator comprises first, second, and third stages,
an output terminal of the first stage is electrically connected to an input terminal of the second stage,
an output terminal of the second stage is electrically connected to an input terminal of the third stage, and
an output terminal of the third stage is electrically connected to an input terminal of the first stage.

13. A display device comprising:
a substrate;
pixels disposed on the substrate, each of the pixels comprising:
- a first electrode;
- a second electrode; and
- a plurality of light emitting elements electrically connected between the first and the second electrodes; and an oscillator disposed on the substrate between the pixels and electrically disconnected from the pixels, the oscillator converting a direct current (DC) voltage to an alternating current (AC) voltage and comprising at least one transistor and at least one capacitor.

14. A method of manufacturing a display device, the method comprising:
preparing a substrate comprising:
- a pixel circuit layer including an oscillator converting a direct current (DC) voltage to an alternating current (AC) voltage;
- a first electrode electrically connected to the oscillator and formed on the pixel circuit layer; and
- a second electrode formed on the pixel circuit layer;
supplying light emitting elements between the first electrode and the second electrode; and
aligning the light emitting elements between the first electrode and the second electrode by applying the alternating current (AC) voltage generated by the oscillator to at least one of the first electrode and the second electrode.

15. The method of claim 14, wherein the oscillator supplies the alternating current (AC) voltage to the first electrode.

16. The method of claim 15, wherein the aligning of the light emitting elements comprises applying a ground voltage to the second electrode while applying the direct current (DC) voltage to the oscillator.

17. The method of claim 16, further comprising:
dividing the first electrode by pixel areas; and
separating the first electrode from an output terminal of the oscillator.

18. The method of claim 16, further comprising:
forming a first contact electrode electrically connecting a first end of each of the light emitting elements to the first electrode, and a second contact electrode electrically connecting a second end of each of the light emitting elements to the second electrode.

19. The method of claim 16, further comprising:
removing the oscillator by cutting off the substrate between the first electrode and the oscillator.

20. The method of claim 15, wherein the aligning of the light emitting elements comprises applying an alternating current (AC) voltage from an external alternating current power supply to the first electrode.

* * * * *